United States Patent
Yamazaki et al.

(10) Patent No.: US 9,819,261 B2
(45) Date of Patent: Nov. 14, 2017

(54) CENTRAL CONTROL SYSTEM

(71) Applicant: Semiconductor Energy Laboratory Co., Ltd., Atsugi-shi, Kanagawa-ken (JP)

(72) Inventors: Shunpei Yamazaki, Tokyo (JP); Tatsuji Nishijima, Kanagawa (JP); Hidetomo Kobayashi, Kanagawa (JP); Tomoaki Atsumi, Kanagawa (JP); Kiyoshi Kato, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 415 days.

(21) Appl. No.: 14/062,249

(22) Filed: Oct. 24, 2013

(65) Prior Publication Data

US 2014/0121787 A1    May 1, 2014

(30) Foreign Application Priority Data

Oct. 25, 2012  (JP) .................................. 2012-235352

(51) Int. Cl.
*H02M 3/156* (2006.01)
*G05B 19/048* (2006.01)
(Continued)

(52) U.S. Cl.
CPC ............ *H02M 3/156* (2013.01); *G01R 19/00* (2013.01); *G05B 15/02* (2013.01); *G05B 19/048* (2013.01);
(Continued)

(58) Field of Classification Search
CPC .... G05B 15/02; G05B 19/048; G05B 19/409; G05B 19/4185; G05B 2219/24024;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1 737 044 A1    12/2006
EP    2 226 847 A2    9/2010
(Continued)

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Crystal J Barnes-Bullock
(74) *Attorney, Agent, or Firm* — Fish & Richardson P.C.

(57) ABSTRACT

Provided is a structure which is capable of central control of an electric device and a sensor device and a structure which can reduce power consumption of an electric device and a sensor device. A central control system includes at least a central control device, an output unit, and an electric device or a sensor device. The central control device performs arithmetic processing on information transmitted from the electric device or the sensor device and makes the output unit output information obtained by the arithmetic processing. It is possible to know the state of the electric device or the sensor device even apart from the electric device or the sensor device. The electric device or the sensor device includes a transistor which includes an activation layer using a semiconductor with the band gap wider than that of single crystal silicon.

17 Claims, 25 Drawing Sheets

(51) Int. Cl.
   *G06F 1/32* (2006.01)
   *G01R 19/00* (2006.01)
   *G05B 15/02* (2006.01)
   *G08B 26/00* (2006.01)
   *G08B 29/18* (2006.01)
   *H04W 4/04* (2009.01)
   *H04L 12/28* (2006.01)

(52) U.S. Cl.
   CPC ............ *G06F 1/32* (2013.01); *G08B 26/007* (2013.01); *G08B 29/181* (2013.01); *H04L 12/2825* (2013.01); *H04W 4/043* (2013.01); *G05B 2219/24024* (2013.01); *Y02B 60/50* (2013.01); *Y02B 90/241* (2013.01); *Y04S 20/242* (2013.01); *Y04S 20/32* (2013.01); *Y04S 20/36* (2013.01)

(58) Field of Classification Search
   CPC .. H04L 12/2825; H04W 4/043; G08B 26/007; G08B 29/181; Y02B 60/50; Y02B 70/3266; Y02B 90/242; H02M 3/158; H02M 2001/0009; H02J 1/10; H02J 1/14; H02J 9/062; Y04S 20/242; Y04S 20/322; Y04S 20/36; G01R 19/0092; G01R 22/063; G06F 1/26; G06F 1/32; G01D 4/004; G07C 9/00111; Y02P 90/18
   See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,015,598 B2* | 3/2006 | Oohara ............... B62J 6/001 307/47 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,327,149 B2* | 2/2008 | Chapuis ............ G01R 19/0092 323/282 |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,528,711 B2 | 5/2009 | Kates |
| 7,609,047 B2* | 10/2009 | Ravichandran ........... G06F 1/26 323/277 |
| 7,674,650 B2 | 3/2010 | Akimoto et al. |
| 7,732,819 B2 | 6/2010 | Akimoto et al. |
| 7,994,766 B2* | 8/2011 | De Lima Filho ..... H02M 3/158 323/277 |
| 8,364,324 B2 | 1/2013 | Maeda et al. |
| 8,396,604 B2 | 3/2013 | Imes et al. |
| 8,417,393 B2 | 4/2013 | Drake et al. |
| 8,467,908 B2 | 6/2013 | Broniak et al. |
| 9,040,980 B2 | 5/2015 | Endo |
| 9,244,455 B2* | 1/2016 | Peterson ............ G05B 19/048 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0197202 A1 | 9/2006 | Horng |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0255783 A1* | 11/2006 | Chapuis ............ G01R 19/0092 323/282 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0065578 A1* | 3/2009 | Peterson ............ G05B 19/048 235/382 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0037455 A1* | 2/2011 | Oren ...................... G01D 4/004 324/103 R |
| 2011/0101942 A1* | 5/2011 | Yamazaki ........... H01L 27/1225 323/282 |
| 2011/0127523 A1 | 6/2011 | Yamazaki |
| 2011/0233555 A1* | 9/2011 | Endo ............... H01L 29/41733 257/60 |

(56) References Cited

U.S. PATENT DOCUMENTS

| | | |
|---|---|---|
| 2013/0082256 A1 | 4/2013 | Yamazaki |
| 2013/0261835 A1 | 10/2013 | Takahashi et al. |
| 2013/0326244 A1 | 12/2013 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-076348 A | 3/1992 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-300668 A | 10/2002 |
| JP | 2003-086000 A | 3/2003 |
| JP | 2003-086808 A | 3/2003 |
| JP | 2003-259468 A | 9/2003 |
| JP | 2004-103957 A | 4/2004 |
| JP | 2004-140606 A | 5/2004 |
| JP | 2004-273614 A | 9/2004 |
| JP | 2004-273732 A | 9/2004 |
| JP | 2005-258713 A | 9/2005 |
| JP | 2006-107362 A | 4/2006 |
| JP | 2008-134717 A | 6/2008 |
| JP | 2009-520262 | 5/2009 |
| JP | 2011-108197 A | 6/2011 |
| JP | 2011-135063 A | 7/2011 |
| JP | 2011-222990 A | 11/2011 |
| JP | 2012-248868 A | 12/2012 |
| KR | 2012-0103616 A | 9/2012 |
| KR | 2012-0103754 A | 9/2012 |
| KR | 2013-051020 A | 5/2013 |
| TW | 200620687 | 6/2006 |
| TW | 201019218 | 5/2010 |
| TW | 201138111 A1 | 11/2011 |
| TW | 201306265 A1 | 2/2013 |
| WO | 2004/114391 A1 | 12/2004 |
| WO | WO-2007/073417 | 6/2007 |
| WO | 2011/065243 A1 | 6/2011 |
| WO | WO-2011/118364 | 9/2011 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage. Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (Application No. PCT/JP2013/078890) dated Dec. 3, 2013, 3 pages.

Written Opinion (Application No. PCT/JP2013/078890) dated Dec. 3, 2013, 6 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2:Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

(56) References Cited

OTHER PUBLICATIONS

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, e et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.," Journal of Solid State Chemistry, 1985, vol. 60, pp. 382-384.

Kimizuka N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics) , Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo. Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

(56) References Cited

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3:4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Taiwanese Office Action (Application No. 102138091) dated Jun. 6, 2017.

\* cited by examiner

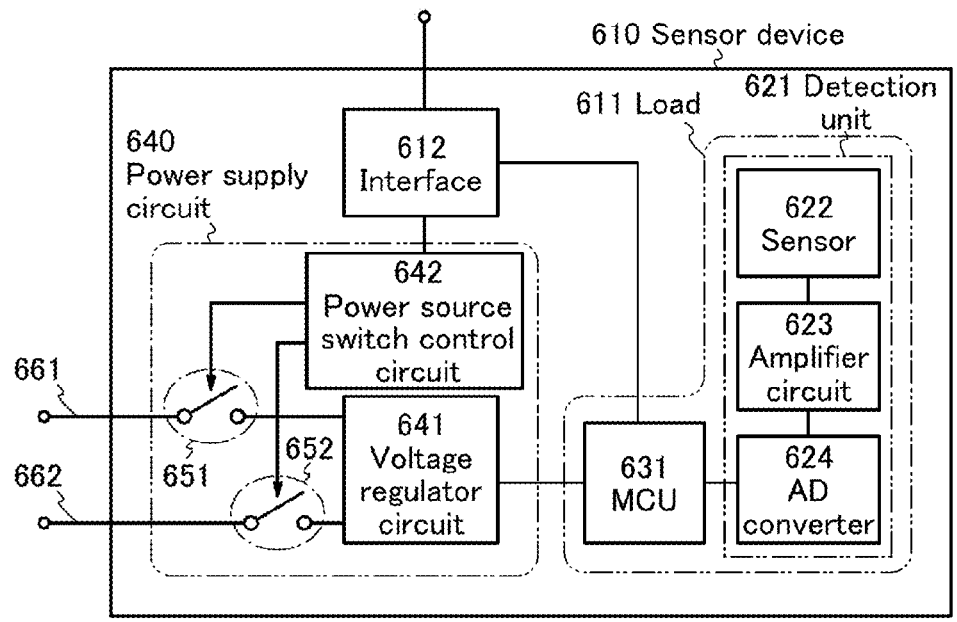
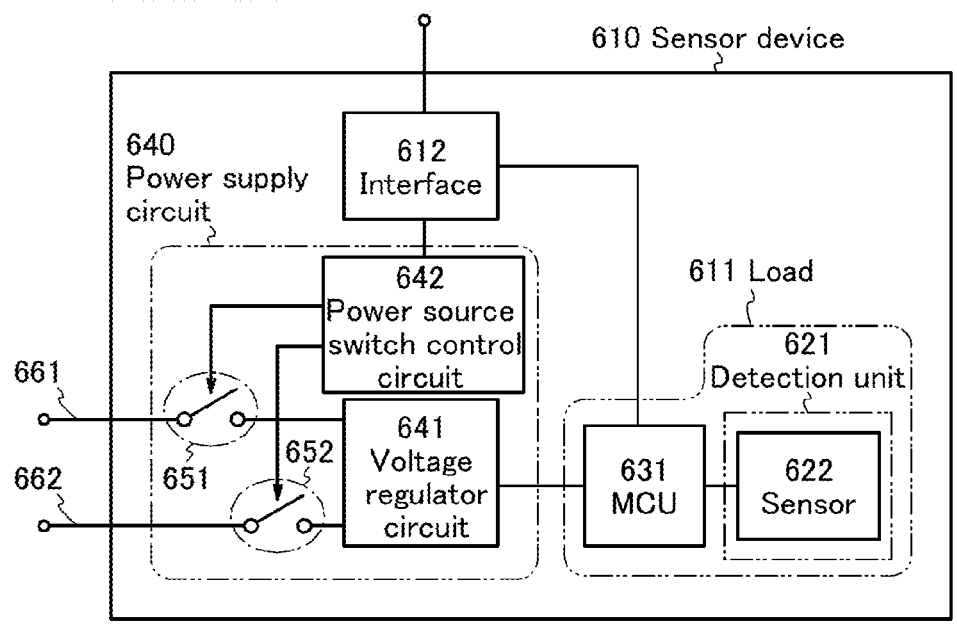

790

1196

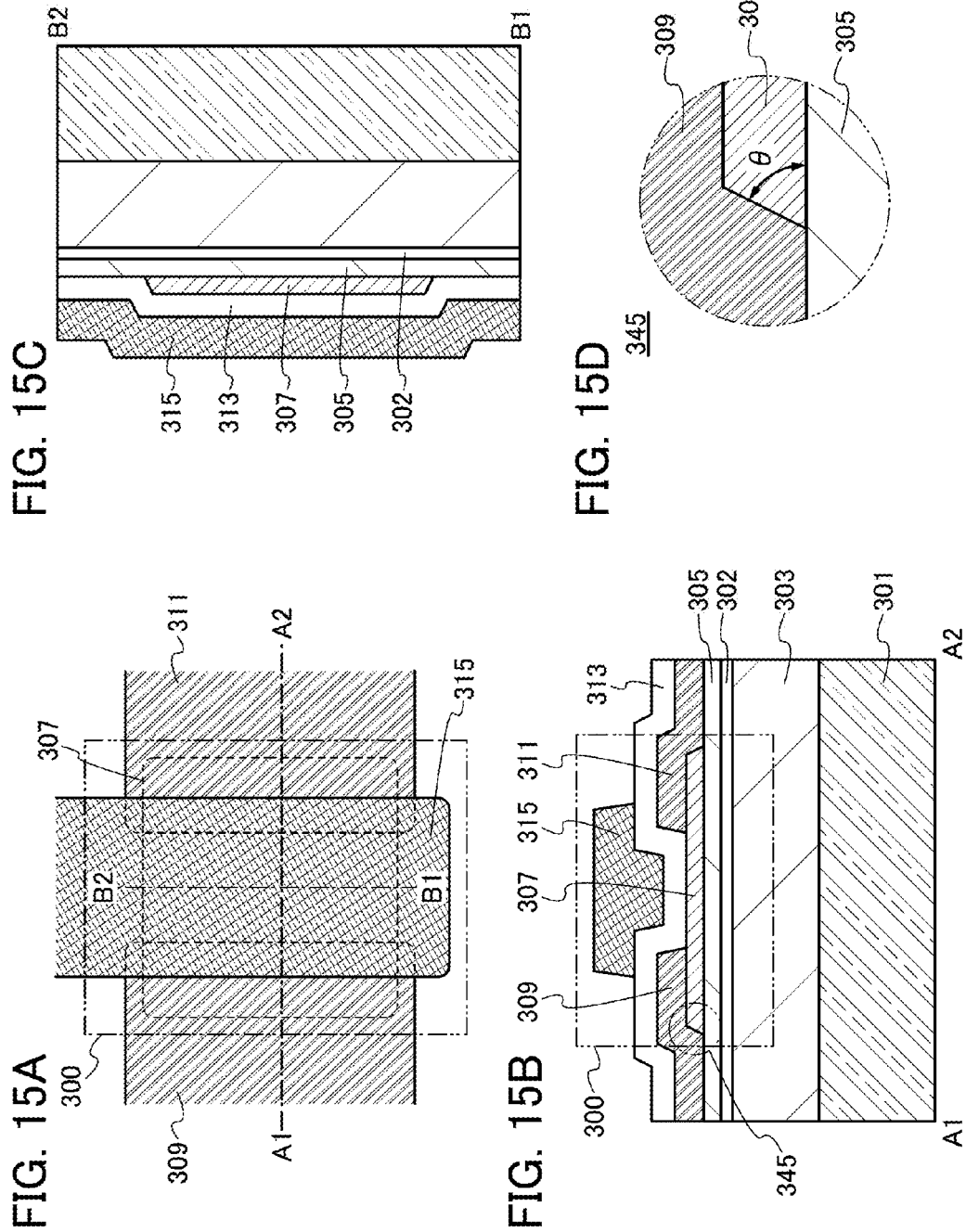

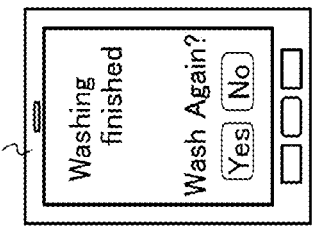
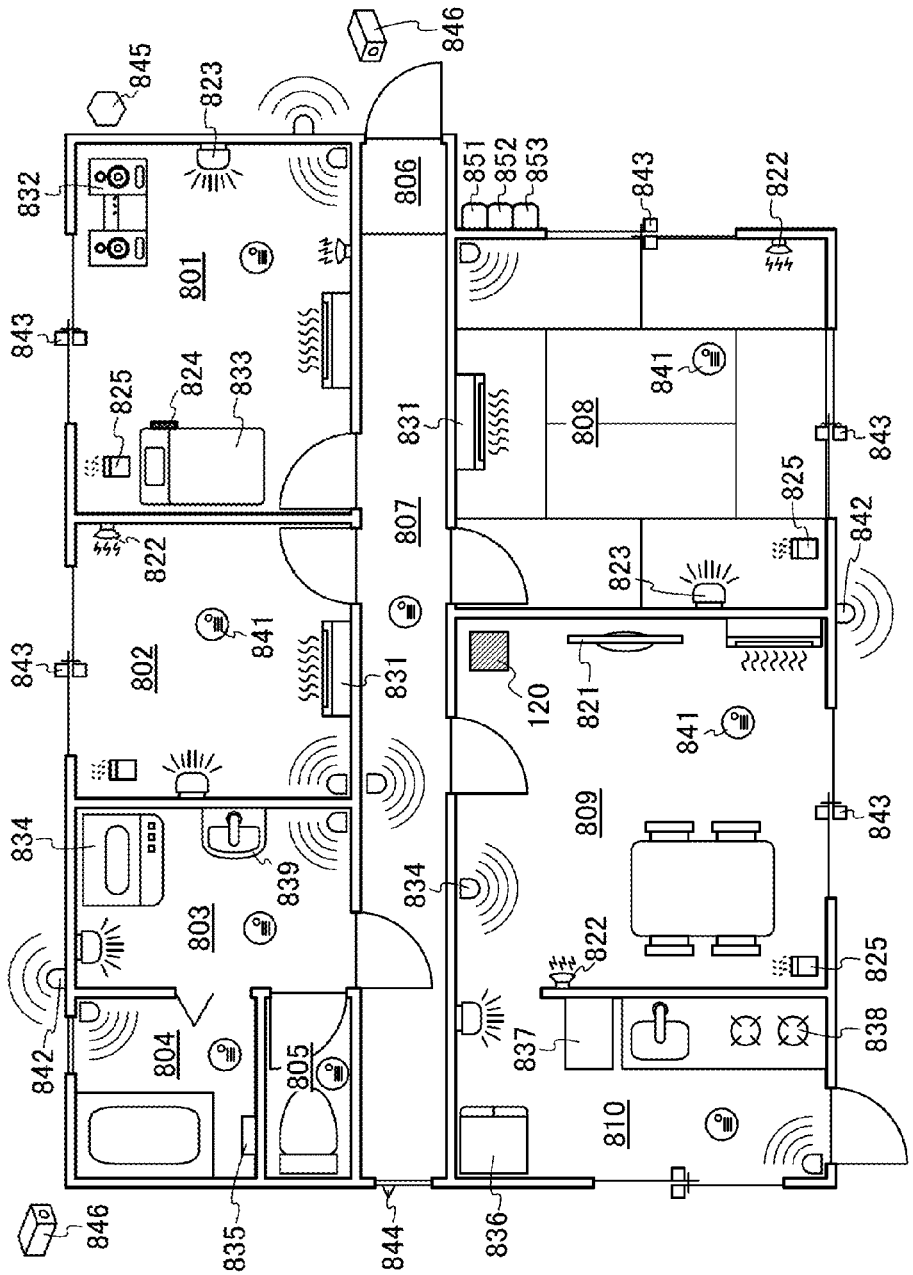

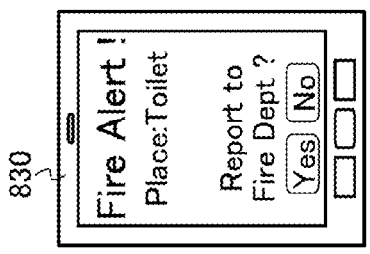
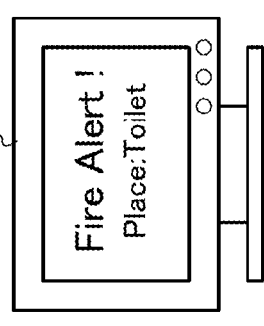
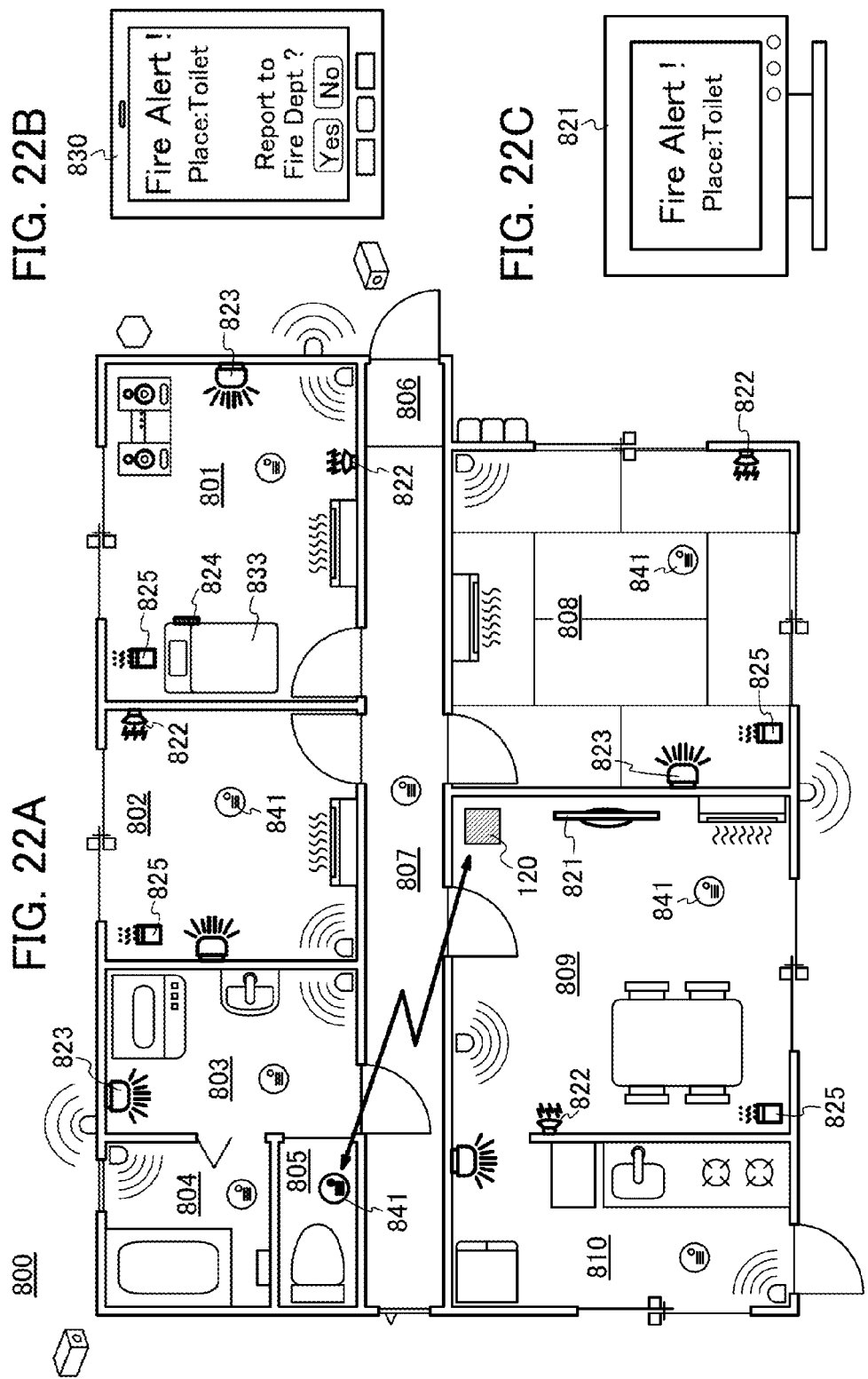

CENTRAL CONTROL SYSTEM

TECHNICAL FIELD

The present invention relates to central control of electric devices and sensor devices. The present invention relates to reduction in power consumption in of electric devices and sensor devices.

BACKGROUND ART

Recent increase in energy cost increases needs for saving energy of electric devices and sensor devices. Recent increase in attention to disaster prevention and crime prevention causes increase in demand for disaster prevention and quick response in the occurrence of disaster by central control using electric devices and sensor devices.

In particular, when a disaster occurs, a resident needs to quickly recognize the location of an electric device or a sensor device generating a warning of a disaster.

The demand for an electric device to be operated by remote control with the use of a portable information terminal typified by a mobile phone, a smartphone, or the like is increased. For example, Patent Document 1 discloses a method for acquiring operation information of equipment such as a lamp or a shutter by a control device.

REFERENCE

[Patent Document 1] Japanese Patent Laid-Open No. 2002-300668

DISCLOSURE OF INVENTION

Patent Document 1 discloses a method for acquiring operation information of equipment such as a lamp or a shutter by a control device, but does not disclose a specific method for reducing power consumption.

One embodiment of the present invention proposes a structure capable of performing central control of an electric device and a sensor device and reducing power consumption.

One embodiment of the present invention proposes a structure capable of quickly determining a place where disaster occurs when disaster occurs, which enables damage to be minimized.

One embodiment of the present invention includes a central control device, a sensor device, and an output unit. The sensor device and the output unit are connected to the central control device. The central control device includes a memory unit storing device information for identifying the location of the sensor device and determining whether or not the operation of the sensor device is normal. The central control device performs arithmetic processing in which information transmitted from the sensor device and the device information are compared, and then makes the output unit output information obtained by the arithmetic processing.

According to one embodiment of the present invention, a central control device, an electric device, and an output unit are included. The electric device and the output unit are connected to the central control device. The central control device includes a memory unit which stores device information for identifying a location of the electric device and determining whether or not operation of the electric device is normal. The central control device performs arithmetic processing in which information transmitted from the sensor device and the device information are compared. The central control device makes the output unit output the information obtained by the arithmetic processing.

According to one embodiment of the present invention, a central control device, a plurality of sensor devices, and an output unit are included. The plurality of sensor devices and the output unit are connected to the central control device. The plurality of sensor devices each include an identifier. The central control device includes a memory unit which stores device information for identifying locations of the plurality of sensor devices and determining whether or not operation of the plurality of sensor devices is normal. The central control device performs arithmetic processing in which information transmitted from the plurality of sensor devices with the identifier and the device information are compared. The central control device makes the output unit output the information obtained by the arithmetic processing.

According to one embodiment of the present invention, a central control device, a plurality of electric devices, and an output unit are included. The plurality of electric devices and the output unit are connected to the central control device. The plurality of electric devices each include an identifier. The central control device includes a memory unit which stores device information for identifying locations of the plurality of electric devices and determining whether or not operation of the plurality of electric devices is normal. The central control device performs arithmetic processing in which information transmitted from the plurality of electric devices with the identifier and the device information are compared. The central control device makes the output unit output the information obtained by the arithmetic processing.

The central control device can identify kinds and locations of the electric device and the sensor device by the identifier.

The central control device and the electric device, the central control device and the sensor device, or the central control device and the output unit are connected by wired communication or wireless communication.

Examples of the electric device are devices capable of performing electronic control, such as an air conditioning device, an audio device, a washing machine, a bathroom control device, a refrigerator, a dish washer, a microwave oven, an intercom, a rice cooker, and an electric pot.

Examples of the sensor device are a fire alarm, a human detection sensor, a proximity switch, a vibration sensor, a radiation sensor, a surveillance camera, an electricity meter, a water meter, and a gas meter.

For example, fire alarms which are used as the sensor devices are provided for rooms of a house. Each fire alarm includes a unique identifier. In the case of detecting fire, the fire alarm transmits the identifier and information of fire detection to the central control device. The central control device performs arithmetic processing in which the identifier is compared to device information stored in the memory unit, so as to identify which fire alarm of a room detects fire. Then, the central control device makes the output unit output a warning and information on a place where fire occurs.

The output unit can be a display device that outputs information by video, a sound device that outputs information by a sound such as voice or an audible alert, a light-emitting device that outputs information by lighting or flashing of light, a vibration device that outputs information by vibration, a perfuming device that outputs information by perfume, or the like. Further, the output unit can be, without being limited to one kind of output device, a combination of a plurality of kinds of output device, for example, a combination of a sound device and a light-emitting device can be used.

Since a variety of output units output information, a resident easily recognizes the occurrence of fire and a place where fire occurs, which enables quick start of initial firefighting and makes selection of the evacuation route easy. Therefore, one embodiment of the present invention can minimize damage due to disaster.

As the sensor device, a proximity switch may be installed on a window of a house. For example, when the proximity switch detects opening of the window while a resident sleeps, the proximity switch transmits a unique identifier and information on the opening of the window to the central control device. When the central control device receives the information, the central control device performs arithmetic processing in which the identifier device is compared to information stored in the memory unit, so that the place where the window is opened is identified by the received identifier, and then, makes the output unit output a warning and information on the place where the window is opened. Further, providing a human detection sensor enables determination whether or not a trespasser presents. One embodiment of the present invention can quickly determine opening of a window and a place where a trespasser is present.

Note that an output unit can be directly added to the electric device or the sensor device to output a warning without going through the central control device. However, in this case, it is difficult to downsizing the electric device and the sensor device, and further, power consumption is large. Further, when a resident is apart from the electric device or the sensor device, the resident often misses a warning generated from the electric device or the sensor device. Therefore, the output unit and the electric device or the sensor device are preferably provided not to be directly connected to each other.

With the central control device, the start and the stop of supply of power to the electric device or the sensor device can be controlled. The central control device stops supply of power to the electric device or the sensor device which does not need to operate, so that the total power consumption of a house can be reduced.

Without a commercial power supply used as a power supply source of the central control device, the sensor device, or the output unit, for example, power is supplied by an optical power generation device using a solar cell; accordingly, energy cost can be reduced. Alternatively, power obtained by an optical power generation device may be stored in a storage device to supply power from the storage device. Alternatively, part of power supplied from an optical power generation device to the central control device, the sensor device, or the output unit may be stored in a storage device.

In a transistor included in the central control device, the electric device, the sensor device, or the like, a semiconductor layer (active layer) where a channel is formed preferably uses a semiconductor the band gap of which is wider than that of single crystal silicon. In particular, a transistor having a semiconductor layer where a channel is formed which contains an oxide semiconductor can have smaller power loss due to the on-resistance of the transistor. A transistor using an oxide semiconductor in an active layer has an extremely off-state current. For these reasons, power consumption of the electric device or the sensor device can be reduced.

One embodiment of the present invention can be applied not only to ordinary households but also to stores, factories, and the like.

One embodiment of the present invention can perform central control of an electric device or a sensor device to reduce power consumption.

One embodiment of the present invention can quickly determine a place where disaster occurs when disaster occurs, which enables damage to be minimized.

BRIEF DESCRIPTION OF DRAWINGS

FIGS. 5A and 5B each illustrate an example of a structure of a sensor device.

FIGS. 15A to 15D illustrate an example of a structure of a semiconductor device.

FIGS. 20A to 20C illustrates an example of an application of a central control system.

FIGS. 22A to 22C illustrate an example of an application of a central control system.

BEST MODE FOR CARRYING OUT THE INVENTION

Figure 1:
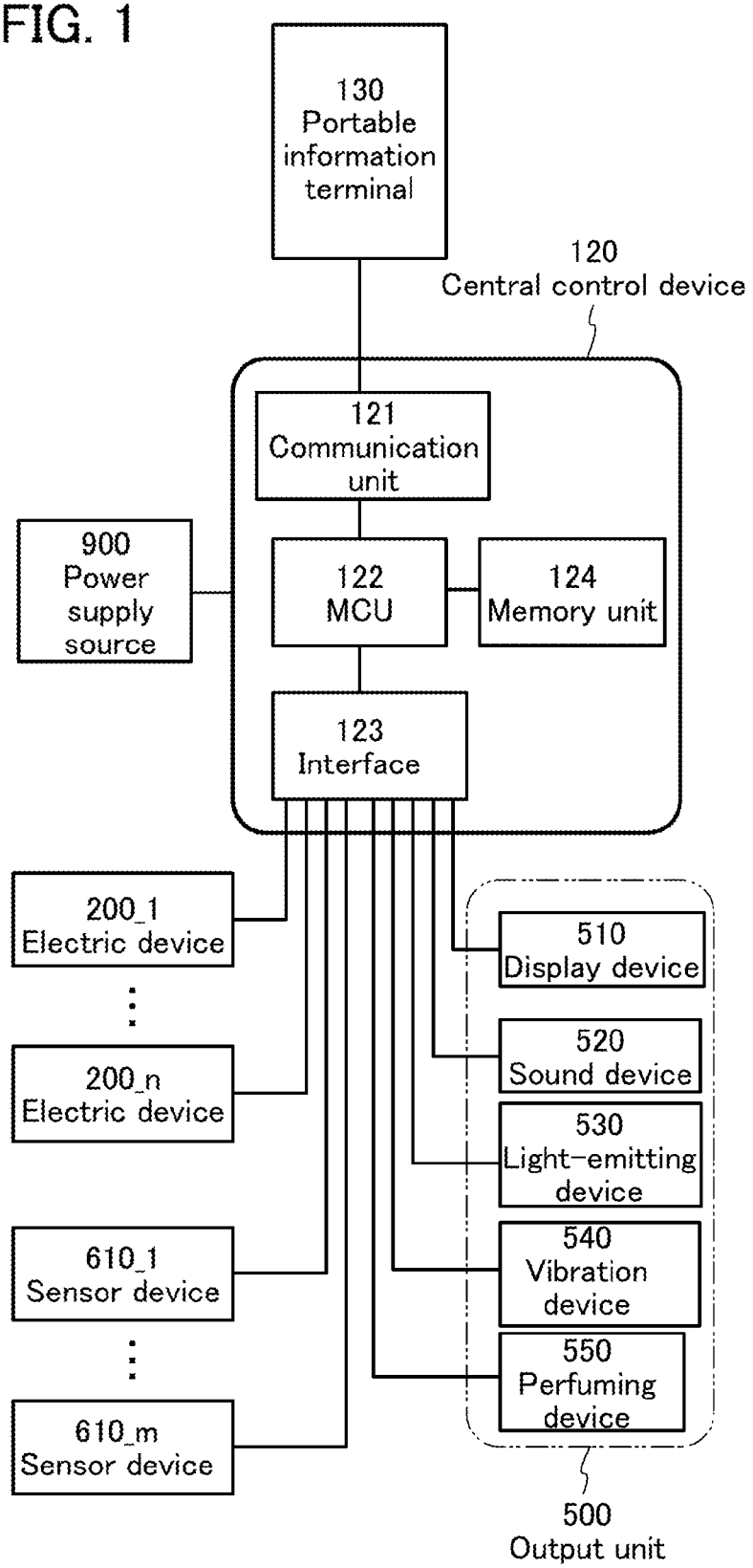
FIG. 1 illustrates an example of a structure of a central control system.

Embodiments will be described with reference to the drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. Note that in the structures of the invention described below, the same portions or portions having similar functions are denoted by the same reference numerals in different drawings, and description of such portions is not repeated.

In addition, in this specification and the like, ordinal numbers such as "first", "second", and "third" are used in order to avoid confusion among components, and the terms do not limit the components numerically.

Note that the position, size, range, or the like of each structure illustrated in the drawings and the like is not accurately represented in some cases for easy understanding. Therefore, the disclosed invention is not necessarily limited to the position, size, range, or the like as disclosed in the drawings and the like.

Functions of a "source" and a "drain" of a transistor are sometimes replaced with each other when a transistor of opposite polarity is used or when the direction of current flowing is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Note that an explicit description "X and Y are connected" indicates the case where X and Y are electrically connected, the case where X and Y are connected in terms of the function, the case where X and Y are directly connected, or the like. Here, each of X and Y denotes an object (e.g., a device, an element, a circuit, a wiring, an electrode, a terminal, a conductive layer, or an insulating layer). Accordingly, another connection relation shown in drawings and texts is included without being limited to a predetermined connection relation, for example, the connection relation shown in the drawings and the texts.

In the circuit symbols in this specification, a transistor including an oxide semiconductor in a semiconductor layer where a channel is formed is denoted by a circuit symbol "OS" so that it can be clearly identified as a transistor including an oxide semiconductor in a semiconductor layer where a channel is formed.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" or "vertical" indicates that the angle formed between two straight lines is greater than or equal to 80° and less than or equal to 100°, and accordingly includes the case where the angle is greater than or equal to 85° and less than or equal to 95°.

Embodiment 1

One embodiment of the present invention will be described with reference to FIGS. 1 to 14. FIG. 1 shows an example of a structure of a central control system of an electric device and a sensor device. A central control device 120 includes a communication unit 121, a micro control unit (MCU) 122, an interface 123, and a memory unit 124. The central control device 120 is connected to a portable information terminal 130 through the communication unit 121. In addition, the central control device 120 is connected to an output unit 500, n (n is a natural number) electric devices 200, and m (m is a natural number) sensor devices 610 through the interface 123 in the central control device 120. Note that the structure where only one of the electric device 200 and the sensor device 610 is connected to the central control device 120 may be used. FIG. 1 shows the structure where the plurality of electric devices 200 and the plurality of sensor devices 610 are connected to the central control device 120.

The portable information terminal 130, the electric device 200, the sensor device 610, and the output unit 500 may be connected to the central control device 120 by wired communication using a communication standard such as 100BASE-TX, 1000BASE-TX, or power line communication (PLC) or by wireless communication using a communication standard such as IEEE802.11a, IEEE802.11b, IEEE802.11g, IEEE802.11n, or IEEE802.15.1. Alternatively, the portable information terminal 130, the electric device 200, the sensor device 610, and the output unit 500 may be connected to the central control device 120 by optical communication using visible light, infrared light, or the like.

To prevent unauthorized access during communication or malfunction due to interference, communicated information is preferably encrypted. As a standard for encrypting communications, an advanced encryption standard (AES), a temporal key integrity protocol (TKIP), a wired equivalent privacy (WEP) protocol, or the like can be used.

The electric device 200, the sensor device 610, and the output unit 500 can transmit and receive information to and from the central control device 120 through the interface 123 in the central control device 120. That is, the central control device 120 can obtain operation information of the electric device 200, the sensor device 610, and the output unit 500, such as an operation state or presence of an abnormal operation, through the interface 123.

The memory unit 124 can be obtained by using a magnetic memory device such as a hard disk drive (HDD), an optical memory device such as an optical disc, or a semiconductor memory device such as a solid state drive (SSD).

The memory unit 124 has functions of storing device information for identifying the locations or kinds of the electric device 200, the sensor device 610, and the output unit 500 and determining whether or not the operations of the electric device 200, the sensor device 610, and the output unit 500 are normal. In addition, the memory unit 124 has a function of storing a program which is executed by the central control device 120, and an instruction which is transmitted from the portable information terminal 130.

The MCU 122 supplies information such as an operation instruction to the electric device 200, the sensor device 610, and the output unit 500, in accordance with a program stored in the memory unit 124.

Further, the portable information terminal 130 can transmit and receive the information to and from the central control device 120 through the communication unit 121 in the central control device 120. The central control device 120 transmits the operation information of the electric device 200 to the portable information terminal 130 and receives the operation instruction from the portable information terminal 130. The portable information terminal 130 and the central control device 120 may be connected to each other by telephone line and the Internet connection. Alternatively, the portable information terminal 130 and the central control device 120 can be connected to each other by wired communication, wireless communication, and optical communication.

FIG. 1 shows a power supply source 900 for supplying power to the central control device 120.

As the output unit 500, FIG. 1 shows a display device 510, a sound device 520, a light-emitting device 530, a vibration device 540, and a perfuming device 550.

The display device 510 can convert input information into video to output the information. The sound device 520 can convert input information into sound such as voice or an audible alert to output the information. The light-emitting device 530 can convert input information into lighting or flashing of light to output the information. The vibration device 540 can convert input information into vibration to output the information. The perfuming device 550 can convert input information into perfume to output the information.

The central control device 120 can perform arithmetic processing to compare operation information which is obtained from the electric device 200 and the sensor device 610 with device information stored in the memory unit 124 and can output information in accordance with the result of the arithmetic processing from the output unit 500.

Further, the central control device 120 can output the information from at least one of the output unit 500 such as the display device 510, the sound device 520, the light-emitting device 530, the vibration device 540, and the perfuming device 550.

The electric device 200, the sensor device 610, and the output unit 500 may be connected to the central control device 120 through the communication unit 121. Alternatively, each of the electric device 200, the sensor device 610, and the output unit 500 may directly transmit and receive the information without going through the central control device 120.

Figure 2:
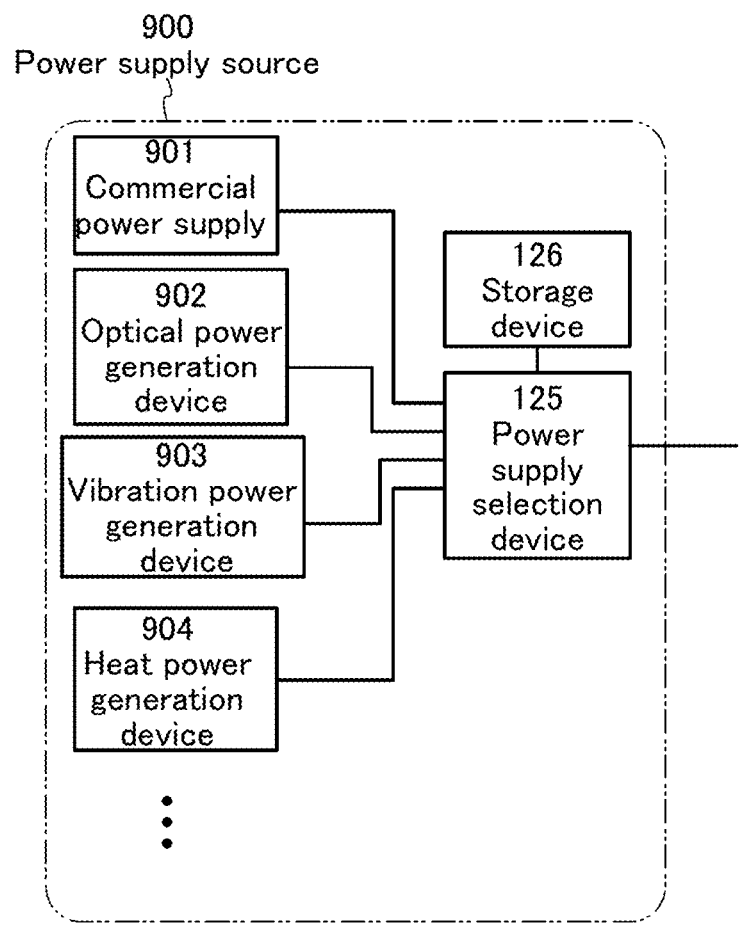
FIG. 2 illustrates an example of a structure of a power supply source.

Next, an example of a structure of the power supply source 900 will be described with reference to FIG. 2. The power supply source 900 illustrated in FIG. 2 includes a power supply selection device 125 and a plurality of power sources, that is, a commercial power supply 901, an optical power generation device 902, a vibration power generation device 903, a heat power generation device 904, and a storage device 126.

The commercial power supply 901 is a power source which outputs pay power supplied from an electric power company or the like. The optical power generation device 902 is a device which converts light into power by using solar cells, for example. The vibration power generation device 903 is a device which converts vibration into power by utilizing electrostatic induction, for example. The heat power generation device 904 is a device which converts heat into power by utilizing Seebeck effect, for example.

Note that as a power source in addition to the above, a wind power generation device which converts wind energy into power or a wave power generation device which converts wave energy into power can be also used.

The power supply selection device 125 has functions of selecting one or more of a plurality of power sources connected to the power supply selection device 125 and supplying power from a selected power source to the central control device 120. When the power supply selection device 125 cannot being supplied with power from the commercial power supply 901, the optical power generation device 902, the vibration power generation device 903, and the heat power generation device 904, the power supply selection device 125 can switch a power source to the storage device 126. For example, when one power source supplies an insufficient amount of power, the power supply selection device 125 can supply the total power of a plurality of power sources to the central control device 120.

The power supply selection device 125 can charge part of power to the storage device 126. The storage device 126 includes a secondary battery, a capacitor (e.g., an electric double-layer capacitor), or the like. Note that the storage device 126 can be provided in the central control device 120.

In this embodiment, the commercial power supply 901, the optical power generation device 902, the vibration power generation device 903, the heat power generation device 904, and the storage device 126 are illustrated as power sources, for example. Another power source functioning as a supply source of power can be used.

Next, an example of a structure of the power supply selection device 125 will be described with reference to FIGS. 3A and 3B. A power supply selection device illustrated in FIG. 3A includes at least a voltage regulator circuit 141, a power source switch control circuit 142, a power monitor 143, power switches 151 to 158, and power switches 161 to 164.

Power supplied from the commercial power supply 901 is supplied to the voltage regulator circuit 141 through the power switches 151 and 152. Power supplied from the optical power generation device 902 is supplied to the voltage regulator circuit 141 through the power switches 153 and 154. Power supplied from the vibration power generation device 903 is supplied to the voltage regulator circuit 141 through the power switches 155 and 156. Power supplied from the heat power generation device 904 is supplied to the voltage regulator circuit 141 through the power switches 157 and 158. Power supplied from the storage device 126 is supplied to the voltage regulator circuit 141 through the power switches 161 and 162.

The power source switch control circuit 142 has a function of controlling switching of the power switches 151 to 158 and the power switches 161 to 164. The power monitor 143 has a function of measuring the amount of power input to the voltage regulator circuit 141.

The power source switch control circuit 142 is connected to the power monitor 143 and can determine from which power supply source supply power, on the basis of the amount of power which is measured by the power monitor 143. For example, when power is supplied from only the commercial power supply 901, the power switches 151 and 152 are turned on and the power switches 153 to 158 and 161 to 164 are turned off.

The voltage regulator circuit 141 has a function of regulating input voltage. Voltage regulation in the voltage regulator circuit 141 means any one or more of a conversion of alternating-current voltage into direct-current voltage, a conversion of direct-current voltage into alternating-current voltage, a change of a voltage level, and smoothing of a voltage level to obtain a constant voltage level.

In the case where the voltage regulator circuit 141 converts alternating-current voltage into direct-current voltage, for example, a rectifier circuit is provided in the voltage regulator circuit 141. In the case where the voltage regulator circuit 141 converts direct-current voltage into alternating-current voltage, a DC-AC inverter circuit is provided in the voltage regulator circuit 141. In the case where the voltage regulator circuit 141 changes a voltage level, a step up converter or a step down converter is provided in the voltage regulator circuit 141. In the case where the voltage regulator circuit 141 is used to obtain a smooth voltage level, a smoothing circuit is provided in the voltage regulator circuit 141.

In the case where alternating-current voltage is supplied from a commercial power supply 901 to the voltage regulator circuit 141, for example, alternating-current voltage is converted into direct-current voltage by the rectifier circuit, a smooth and constant level of the direct-current voltage is obtained by the smoothing circuit, and the voltage is decreased to a required voltage by the step down converter, in the voltage regulator circuit 141.

Note that, in addition to a function of regulating voltage, the voltage regulator circuit 141 may have a function of isolating an input of the voltage regulator circuit 141 from an output of the voltage regulator circuit 141. For example, the use of a transformer achieves the function of isolating the input of the voltage regulator circuit 141 from the output of the voltage regulator circuit 141.

Further, the power switches 161 and 162 are turned off and the power switches 163 and 164 are turned on, whereby power obtained from power sources except the storage device 126 can be charged to the storage device 126.

In this embodiment, transistors which withstand a high voltage are used as the power switches 151 to 158 and 161 to 164. Specifically, the transistor preferably includes a semiconductor whose band gap is wider than that of single crystal silicon for an active layer. For example, a semiconductor whose band gap is more than 1.1 eV, preferably 2.5 eV or more and 4 eV or less, further preferably 3 eV or more and 3.8 eV or less may be used for the active layer. Examples of the semiconductor whose band gap is wider than that of single crystal silicon include an oxide semiconductor, gallium nitride, and silicon carbide. A transistor including such a material for an active layer can withstand high voltage so that dielectric breakdown does not occur even when voltage between a source and a drain is higher than or equal to 100 V, preferably higher than or equal to 200 V, further preferably higher than or equal to 500 V.

In particular, a field-effect transistor including an oxide semiconductor for an active layer withstands high voltage, and moreover, the resistance (on-resistance) between a source and a drain when the transistor is turned on (in a conducting state) is small. Thus, power loss due to the on-resistance of the transistor can be small.

In the case where silicon carbide, gallium nitride, or the like is used, it is difficult to form a field-effect transistor that withstands high voltage and has low on-resistance. Thus, for example, in the case where a switch that withstands a voltage of 4 kV or higher is formed using silicon carbide, a bipolar transistor is used. However, the bipolar transistor has a lower speed of switching an on state and an off state than the field-effect transistor; thus, the period of transition from an on state to an off state or the period of transition from an off state to an on state is long. Accordingly, it is difficult to reduce power loss due to the switching. On the other hand, in the case where an oxide semiconductor is used, it is comparatively easy to form a field-effect transistor that withstands high voltage and has low on-resistance. Accordingly, the use of the field-effect transistor including an oxide semiconductor for an active layer as the power switches 151 and 152 can achieve high-speed switching of the power switches 151 and 152. Consequently, power loss due to the switching can be small.

Figure 3A:
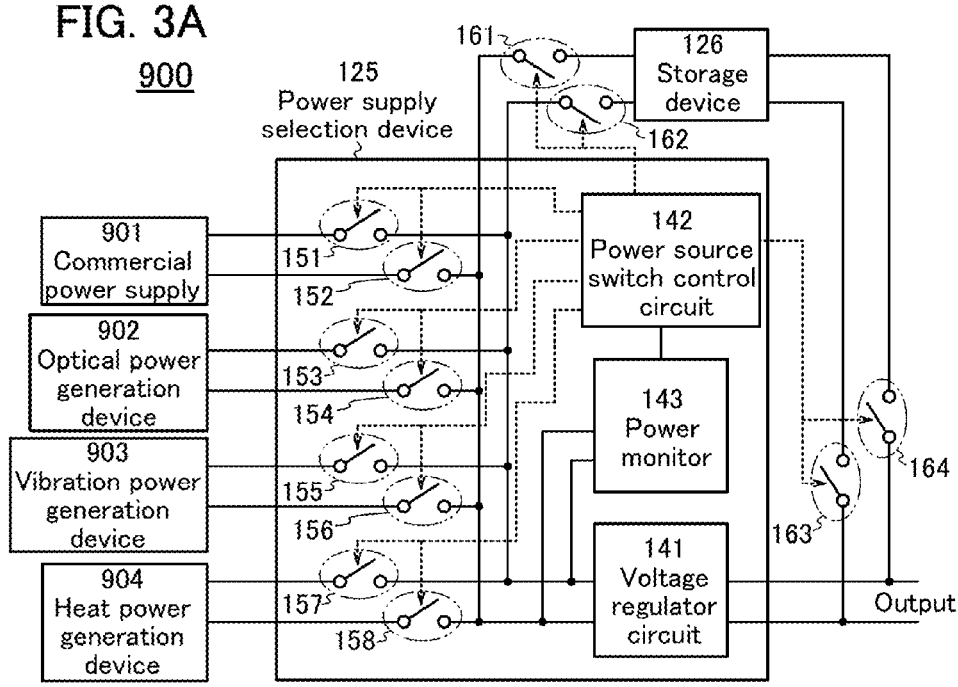
FIGS. 3A and 3B each illustrate an example of a structure of a power supply selection device.
Figure 3B:
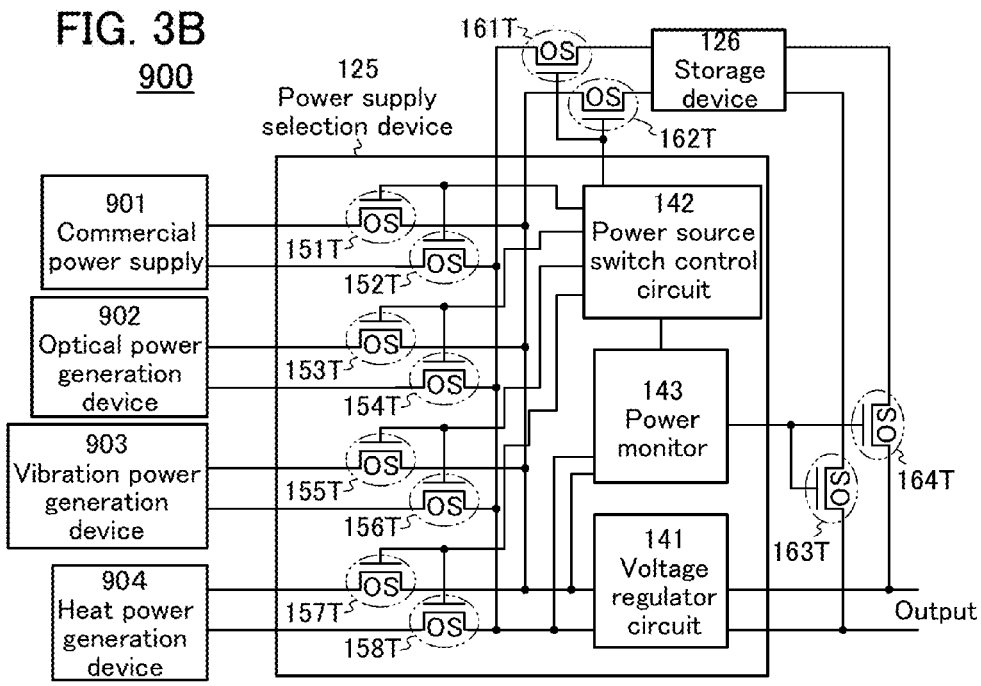

FIG. 3B is an example of a structure which includes the power switches 151 to 158 and the power switches 161 to 164 which are illustrated in FIG. 3A, and a transistor 151T, a transistor 152T, a transistor 153T, a transistor 154T, a transistor 155T, a transistor 156T, a transistor 157T, a transistor 158T, a transistor 161T, a transistor 162T, a transistor 163T, and a transistor 164T. The transistors 151T to 158T and 161T to 164T use an oxide semiconductor for active layers and can withstand high voltage. Gates of the transistors 151T to 158T and 161T to 164T are connected to the power source switch control circuit 142.

Note that the band gap of single crystal silicon is approximately 1.1 eV, and even in a state where there is no carrier caused by a donor or an acceptor (i.e., even in the case of an intrinsic semiconductor), the concentration of thermally excited carriers is approximately $1 \times 10^{11}$ cm$^{-3}$. In contrast, the band gap of the In—Ga—Zn-based oxide semiconductor, for example, is approximately 3.2 eV and the density of thermally excited carriers is approximately $1 \times 10^{-7}$ cm$^{-3}$. The off resistance (resistance between a source and a drain of a transistor in an off state) of a transistor is inversely proportional to the concentration of thermally excited carriers in the channel formation region. Accordingly, the resistivity of the In—Ga—Zn-based oxide semiconductor at the time when the transistor is off is 18 orders of magnitude higher than that of single crystal silicon.

By using such a semiconductor having a wide band gap for the transistor, for example, off-state current (per unit channel width (1 μm), here) at room temperature (25° C.) is 100 zA (zeptoampere) or lower, preferably 10 zA or lower, and further can be reduced to several yA (yoctoampere).

Thus, the transistors 151T to 158T and the transistors 161T to 164T each using an oxide semiconductor for the active layer can prevent supply of power due to off-state current.

Note that in this embodiment, each of the power switches 151 to 158 and 161 to 164 is one transistor, for example; however the present invention is not limited to this structure. One or more of the power switches 151 to 158 and 161 to 164 may be formed of a plurality of transistors.

Figure 4A:
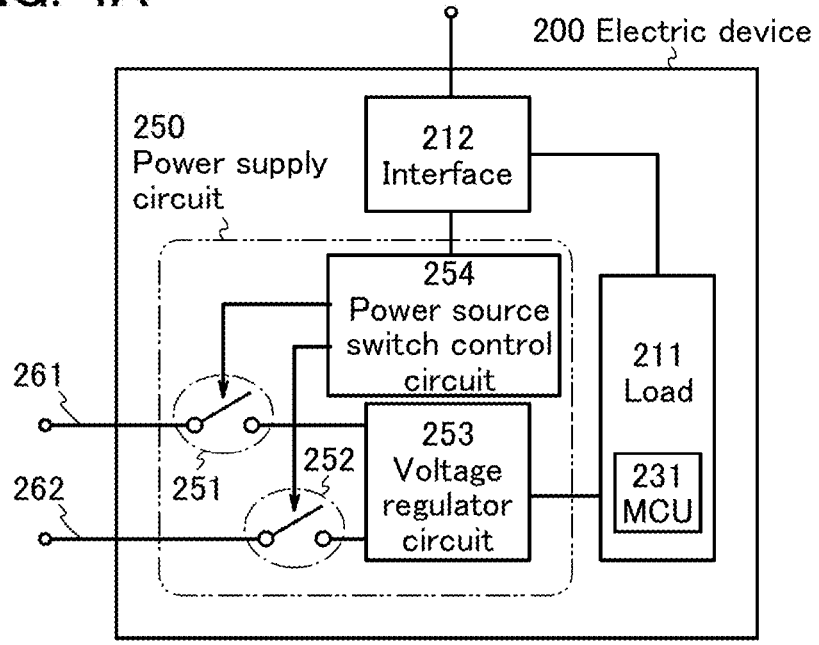
FIGS. 4A and 4B each illustrate an example of a structure of an electric device.
Figure 4B:
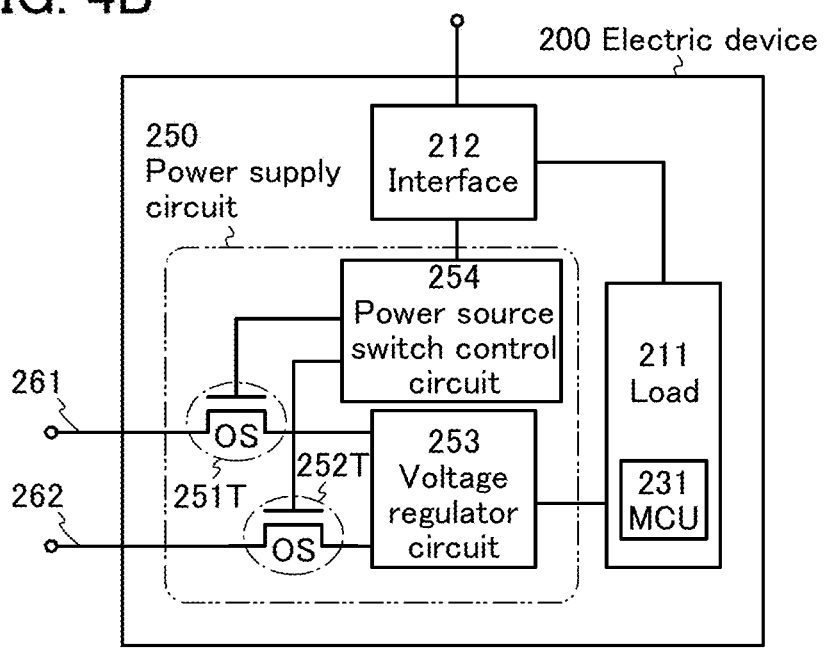

Next, an example of a structure of the electric device 200 will be described with reference to FIGS. 4A and 4B. The electric device 200 includes at least an interface 212 and a power supply circuit 250. Another circuit included in the electric device 200 is shown as a load 211. In FIGS. 4A and 4B, an MCU 231 is illustrated as an example of the load 211. The power supply circuit 250 includes a power switch 251, a power switch 252, a voltage regulator circuit 253, and a power source switch control circuit 254.

In FIG. 4A, a wiring 261 and a wiring 262 are connected to the power supply selection device 125 (not illustrated in FIGS. 4A and 4B) and power is supplied through the power supply selection device 125. For example, a first potential is supplied to the wiring 261, and a second potential is supplied to the wiring 262. Note that the wirings 261 and 262 may be directly connected to the power source such as the commercial power supply 901, the optical power generation device 902, the vibration power generation device 903, the heat power generation device 904, or the storage device 126, not through the power supply selection device 125.

The use of a power source which is not a commercial power supply enables reduction in energy cost.

Then, the first potential supplied to the wiring 261 is supplied to the voltage regulator circuit 253 through the power switch 251. The second potential supplied to the wiring 262 is supplied to the voltage regulator circuit 253 through the power switch 252. The power switch 251 has a function of controlling an input of the first potential to the voltage regulator circuit 253. The power switch 252 has a function of controlling an input of the second potential to the voltage regulator circuit 253. The switching of the power switches 251 and 252 is controlled by the power source switch control circuit 254.

The power switch 251 can be provided either or both of between the wiring 261 and the voltage regulator circuit 253 and between the voltage regulator circuit 253 and the load 211. The power switch 252 can be provided either or both of between the wiring 262 and the voltage regulator circuit 253 and between the voltage regulator circuit 253 and the load 211.

One of the power switches 251 and 252 may be omitted. Further, one of the first potential and the second potential may be a ground potential.

The voltage regulator circuit 253 has a similar function as the voltage regulator circuit 141. The voltage regulated in the voltage regulator circuit 253 is supplied to the load 211.

The power source switch control circuit 254 and the load 211 are connected to the interface 212. The interface 212 is connected to the interface 123 included in the central control device 120 (not illustrated in FIGS. 4A and 4B). That is, the electric device 200 and the central control device 120 are connected to each other through the interfaces 212 and 123.

The electric device 200 can transmit operation information of the electric device 200 to the central control device 120. The central control device 120 can remortly control the electric device 200 by transmitting a control signal to the electric device 200. For example, the switching of the power switches 251 and 252 can be controlled in accordance with the control signal of the central control device 120.

In one embodiment of the present invention, a transistor that can withstand high voltage is used as each of the power switches 251 and 252. Specifically, like the power switches 151 to 158 and 161 to 164, a semiconductor the band gap of which is wider than that of single crystal silicon is preferably used for an active layer. A transistor including such a material for an active layer can withstand high voltage so that dielectric breakdown does not occur even when voltage between a source and a drain is higher than or equal to 100 V, preferably higher than or equal to 200 V, further preferably higher than or equal to 500 V.

In particular, a field-effect transistor including an oxide semiconductor for an active layer withstands high voltage, and moreover, the resistance (on-resistance) when the transistor is turned on (in a conducting state) is small. Thus, power loss due to the on-resistance of the transistor can be small. The off-state current of a transistor using an oxide semiconductor for an active layer is very low. For these reasons, power consumption of the electric device in a non-operation state can be reduced.

A transistor using an oxide semiconductor for an active layer can be used not only as the switch used for supplying power but also as a different switch. For these reasons, power consumption of the electric device in an operation state can be reduced.

FIG. 4B shows an example of a structure formed using a transistor 251T and a transistor 252T that use an oxide semiconductor for an active layer and that can withstand high voltage as the power switches 251 and 252 illustrated in FIG. 4A. Gates of the transistors 251T and 252T are connected to the power source switch control circuit 254.

Next, an example of a structure of the sensor device 610 will be described with reference to FIGS. 5A and 5B and FIG. 6. The sensor device 610 includes at least an interface 612, a power supply circuit 640, an MCU 631, and a detection unit 621. The power supply circuit 640 includes a power switch 651, a power switch 652, a voltage regulator circuit 641, and a power source switch control circuit 642.

The detection unit 621 includes a sensor 622, an amplifier circuit 623, and an AD converter 624.

The interface 612, the power supply circuit 640, a wiring 661, and a wiring 662 function similarly to the interface 212, the power supply circuit 250, the wiring 261, and the wiring 262, respectively, which are included in the electric device 200 illustrated in FIGS. 4A and 4B.

Each of the power switches 651 and 652 is a transistor that can withstand high voltage. Specifically, the transistor preferably includes a semiconductor the band gap of which is wider than that of single crystal silicon for an active layer.

A load 611 included in the sensor device 610 includes the detection unit 621 and the MCU 631. The detection unit 621 includes the sensor 622, the amplifier circuit 623, and the AD converter 624. The sensor 622 outputs a voltage in accordance with the strength of a detected signal. The voltage output from the sensor 622 is input to the amplifier circuit 623; then, the amplifier circuit 623 amplifies the input voltage and outputs the amplified voltage. The voltage output from the amplifier circuit 623 is input to the AD converter 624. The AD converter 624 converts the input voltage to a digital signal to transmit the digital signal to the MCU 631.

For the sensor 622, a variety of sensors can be used. For example, the sensor 622 can be a temperature sensor, an optical sensor, a gas sensor, a flame sensor, a smoke sensor, a humidity sensor, a pressure sensor, a flow sensor, a vibration sensor, a voice sensor, a magnetic sensor, a radiation sensor, a smell sensor, a pollen sensor, an acceleration sensor, an inclination sensor, a gyro sensor, a direction sensor, or a power sensor.

For example, when a temperature sensor is used as the sensor 622, a thermistor (resistive element of which resistance varies depending on temperature) or an IC temperature sensor (which uses a temperature characteristics of a base-emitter voltage of an NPN transistor) can be used. Alternatively, the temperature sensor can be formed using two or more kinds of semiconductor elements with different temperature characteristics.

When an optical sensor is used as the sensor 622, a photodiode or a phototransistor can be used.

When a gas sensor is used as the sensor 622, a semiconductor gas sensor which detects change in resistance due to exposure of a gas to a metal oxide semiconductor such as tin oxide, a catalytic combustion type gas sensor, or a solid electrolyte-type gas sensor can be used.

When a flame sensor is used as the sensor 622, a flame sensor with an infrared ray detection system for detecting infrared ray unique to flame or an ultraviolet ray detection system for detecting ultraviolet ray unique to flame can be used.

Alternatively, a proximity sensor can be also used as the sensor 622. With the use of a proximity sensor, whether or not an object to be detected presents can be detected without touching the object. When a proximity sensor is used as the sensor 622, a high frequency oscillation type proximity sensor, a capacitive proximity sensor, a magnetic proximity sensor, or the like can be used.

The amplifier circuit 623 and the AD converter 624 can be omitted as shown in FIG. 5B, depending on a sensor used for the sensor 622. In particular, in the case of using a proximity sensor as the sensor 622, the amplifier circuit 623 or the AD converter 624 can be easily omitted. Omitting one or both of the amplifier circuit 623 and the AD converter 624 enables downsizing, lower power consumption, and lower cost of the sensor device 610.

Figure 6:
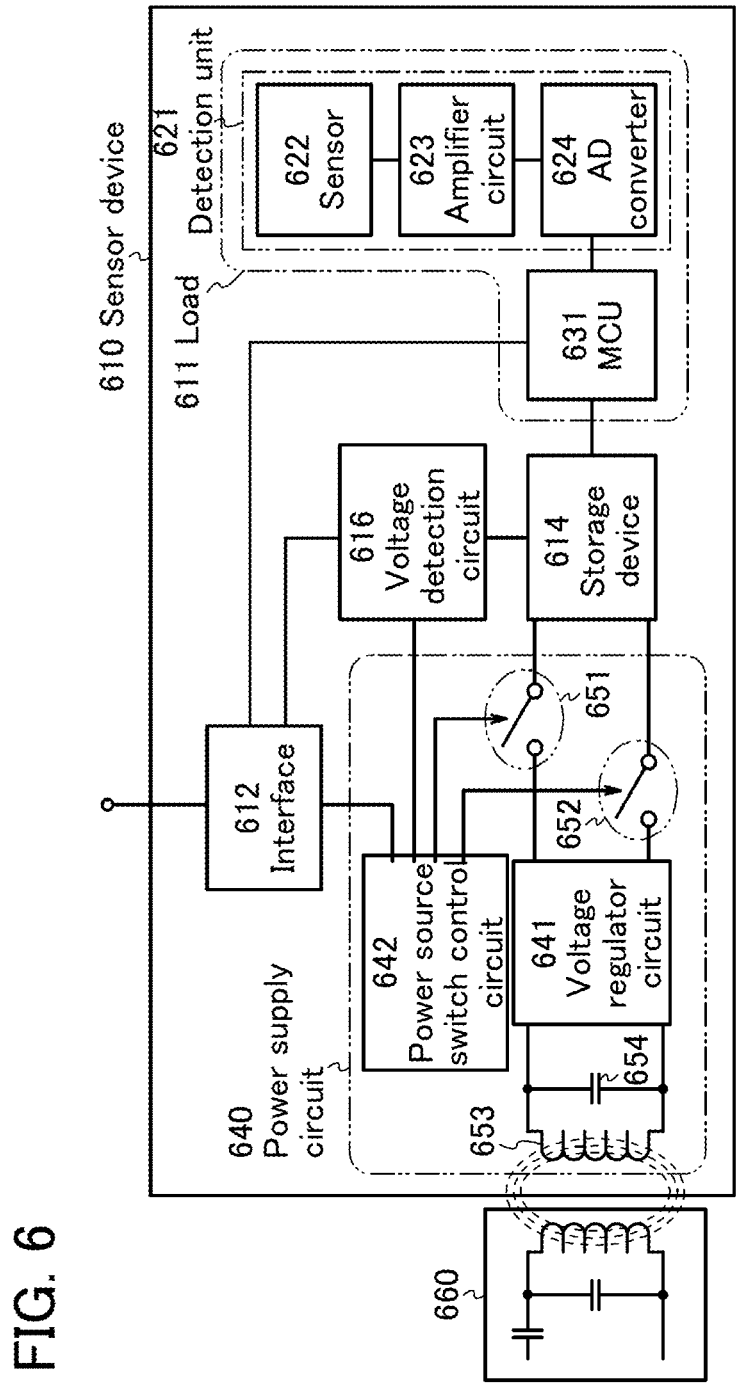
FIG. 6 illustrates an example of a structure of a sensor device.

FIG. 6 illustrates an example of a structure where power is wirelessly supplied to the sensor device 610. The sensor device 610 illustrated in FIG. 6 includes at least the power supply circuit 640, a storage device 614, a voltage detection circuit 616, and the interface 612. Another circuit included in the sensor device 610 is shown as the load 211.

The power supply circuit 640 includes a power receiving antenna 653, a capacitor 654, the voltage regulator circuit 641, the power source switch control circuit 642, the power switch 651, and the power switch 652.

When the frequency of alternating-current power from the a power radiation circuit 660 agrees with the resonance frequency which is determined by the combination of the inductance L of the power receiving antenna 653 and the conductance C of the capacitor 654, the induced electromotive force is produced in the power receiving antenna 653 by Faraday's law of induction; thus, power can be wirelessly supplied from the power radiation circuit 660 to the power supply circuit 640.

The frequency of the alternating-current power from the power radiation circuit 660 is not limited to a specific frequency, and for example, any of the following frequencies can be used: 300 GHz to 3 THz as frequencies of sub-millimeter waves; 30 GHz to 300 GHz as frequencies of millimeter waves; 3 GHz to 30 GHz as frequencies of microwaves; 300 MHz to 3 GHz as frequencies of ultrashort waves; 30 MHz to 300 MHz as frequencies of ultrashort waves; 3 MHz to 30 MHz as frequencies of short waves; 300 kHz to 3 MHz as frequencies of medium waves; 30 kHz to 300 kHz as frequencies of long waves; and 3 kHz to 30 kHz as frequencies of ultra long waves.

Power from the power radiation circuit 660 is supplied to the storage device 614 through the voltage regulator circuit 641, the power switch 651, and the power switch 652. A charging state of the storage device 614 is detected by the voltage detection circuit 616. The voltage detection circuit 616 is connected to the power source switch control circuit 642. The voltage detection circuit 616 controls the switching of the power switches 651 and 652 through the power source switch control circuit 642 so that the storage device 614 is not overcharged. The voltage detection circuit 616 is connected to the interface 612. The storage device 614 supplies power to circuits included in a sensor device such as the load 611, the voltage detection circuit 616, and the interface 612. The sensor device 610 can transmit and receive information to and from the central control device 120 through the interface 612.

The structure described with reference to FIG. 6 can be applied to the electric device 200 and the output unit 500 so that power is wirelessly supplied to the electric device 200 and the output unit 500.

Wireless power supply can be performed not only by an electromagnetic induction method utilizing electromagnetic induction but also by an electric field coupling method or a resonance method. In particular, in power feeding by a resonance method, power can be supplied even when the power radiation circuit 660 is not close to the electric device 200 or the sensor device 610.

Any one of the optical power generation device 902, the vibration power generation device 903, and the heat power generation device 904 may be added to the electric device 200, the sensor device 610, or the output unit 500.

Figure 7:
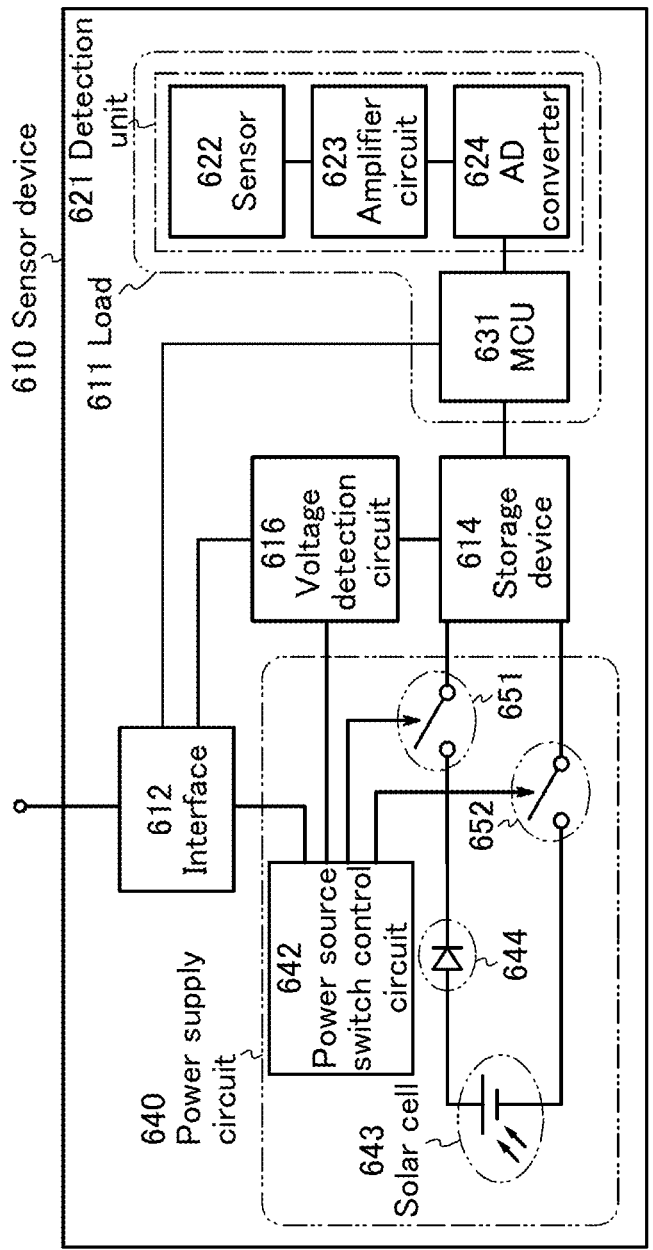
FIG. 7 illustrates an example of a structure of a sensor device.

FIG. 7 illustrates an example of a structure where the sensor device 610 is provided with a solar cell 643 as the optical power generation device 902. Power obtained by the solar cell 643 is charged to the storage device 614 through a backflow prevention diode 644, the power switch 651, and the power switch 652. The backflow prevention diode 644 has a function of preventing power from being supplied from the storage device 614 to the solar cell 643 when the amount of electric power of the solar cell 643 is reduced. Note that when the sensor device 610 is used mainly in a room, the solar cell 643 which has a high photosensitivity enough to generate electric power even with a room light is preferably used.

Figure 8:
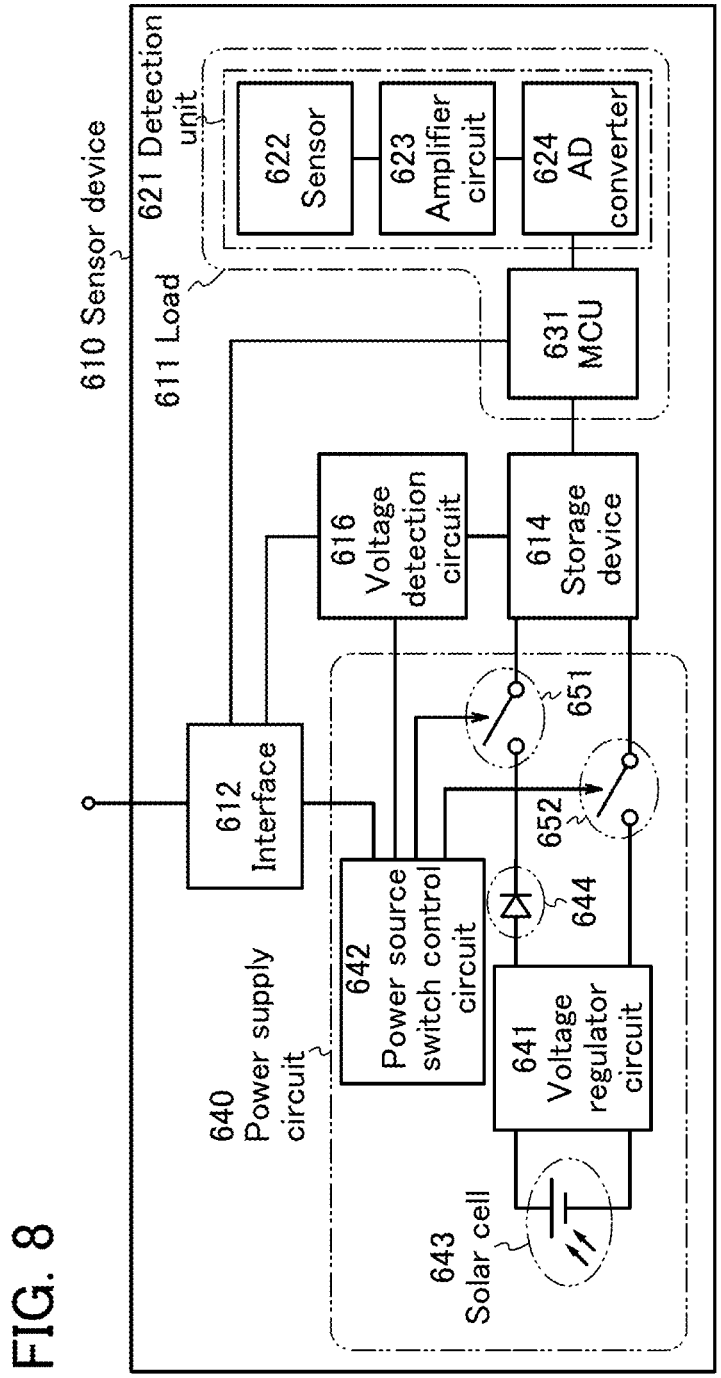
FIG. 8 illustrates an example of a structure of a sensor device.

FIG. 8 illustrates an example of a structure where the voltage regulator circuit 641 is added to the sensor device 610 including the solar cell 643 illustrated in FIG. 7. Specifically, the voltage regulator circuit 641 is provided between the solar cell 643 and the storage device 614. With the voltage regulator circuit 641, the amount of voltage or current supplied to the storage device 614 can be changed.

Adding a power supply source to the electric device 200, the sensor device 610, or the output unit 500 eliminates necessity of electric construction for supplying power and makes change in location easy. When one or more of the electric device 200, the sensor device 610, and the output unit 500 are a device operating with a storage battery, adding a power supply source to the device eliminates the necessity of exchange of a storage battery. Note that in particular, fire alarms are preferably provided with all of the rooms, corridors, and stairs in the house. Cost for installation can be reduced.

Figure 9:
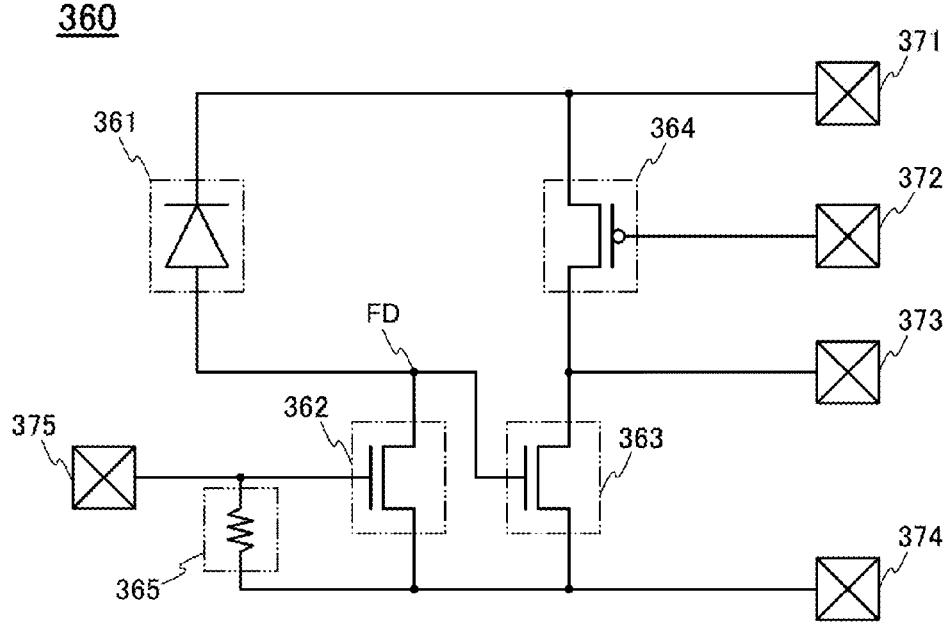
FIG. 9 is a circuit diagram illustrating an example of a structure of an optical sensor.

FIG. 9 illustrates a detection circuit 360 using an optical sensor for the sensor 622, as an example of a circuit structure which can be used for the detection unit 621. The detection circuit 360 illustrated in FIG. 9 includes a photodiode 361, a reset transistor 362, an amplifier transistor 363, a bias transistor 364, and a resistor 365.

A cathode of the photodiode 361 is connected to a $V_{DD}$ terminal 371 to which a high power source potential $V_{DD}$ (also simply referred to as "$V_{DD}$") is supplied. An anode of the photodiode 361 is connected to a node FD. A source of the reset transistor 362 is connected to the node FD. A drain of the reset transistor 362 is connected to a $V_{SS}$ terminal 374 to which a low power source potential $V_{SS}$ (also simply referred to as "$V_{SS}$") is supplied. A gate of the reset transistor 362 is connected to a reset signal terminal 375. A source of the amplifier transistor 363 is connected to an output signal terminal 373. A drain of the amplifier transistor 363 is connected to the $V_{SS}$ terminal 374. A gate of the amplifier transistor 363 is connected to the node FD. A source of the bias transistor 364 is connected to the $V_{DD}$ terminal 371. A drain of the bias transistor 364 is connected to the output signal terminal 373. A gate of the bias transistor 364 is connected to an external bias power source terminal 372. One terminal of the resistor 365 is connected to the reset signal terminal 375 and a gate of the reset transistor 362. The other terminal of the resistor 365 is connected to the $V_{SS}$ terminal 374. The resistor 365 has a function of keeping the potential of the gate of the reset transistor 362 stable when the reset transistor 362 is in an off state (pull-down resistor). A p-channel transistor is used as the reset transistor 362, depending on a circuit structure. In this case, the other terminal of the resistor 365 is connected to the $V_{DD}$ terminal 371 (pull-up resistor).

Note that $V_{DD}$ is a high power source potential and $V_{SS}$ is a low power source potential. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

The photodiode 361 in the detection circuit 360 corresponds to the sensor 622. The amplifier transistor 363 in the detection circuit 360 corresponds to the amplifier circuit 623. In the detection circuit 360, a part corresponding to the AD converter 624 is omitted.

The reset signal terminal 375 and the output signal terminal 373 are connected to the MCU 631. A reset signal is input to the reset signal terminal 375 from the MCU 631. The output signal terminal 373 outputs a detection result of the detection circuit 360 to the MCU 631. A circuit such as an AD converter may be provided between the output signal terminal 373 and the MCU 631.

The connection enables the MCU 631 to control the operation of the detection circuit 360 and receive a detection result of the detection circuit 360.

Figure 10:
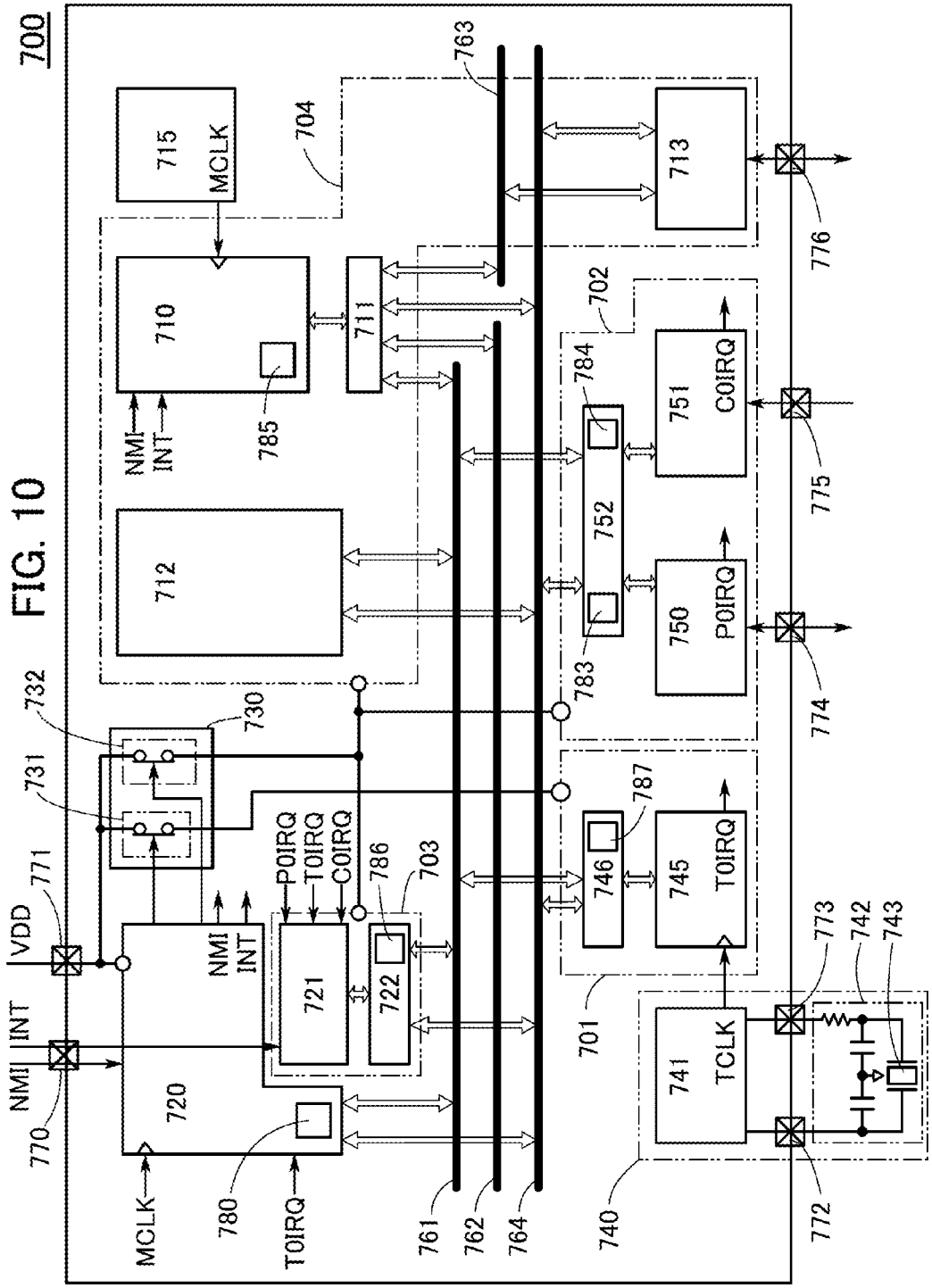
FIG. 10 is a block diagram illustrating an example of a structure of a micro control unit (MCU).

Next, an example of a structure of an MCU 700 which can be applied to the MCU 122, the MCU 231, and the MCU 631 will be described with reference to FIG. 10, FIG. 11, FIG. 12, and FIGS. 13A and 13B. FIG. 10 is a block diagram of the MCU 700.

The MCU 700 includes a CPU 710, a bus bridge 711, a RAM (random access memory) 712, a memory interface 713, a controller 720, an interrupt controller 721, an I/O interface (input-output interface) 722, and a power gate unit 730.

The MCU 700 further includes a crystal oscillation circuit 741, a timer circuit 745, an I/O interface 746, an I/O port 750, a comparator 751, an I/O interface 752, a bus line 761, a bus line 762, a bus line 763, and a data bus line 764. Further, the MCU 700 includes at least connection terminals 770 to 776 as portions for connection to an external device. Note that each of the connection terminals 770 to 776 represents one terminal or a terminal group including plural terminals. An oscillation unit 742 including a quartz crystal oscillator 743 is connected to the MCU 700 through the connection terminal 772 and the connection terminal 773.

The CPU 710 includes a register 785 and is connected to the bus lines 761 to 763 and the data bus line 764 through the bus bridge 711.

The RAM 712 is a memory device functioning as a main memory of the CPU 710 and is a nonvolatile random access memory. The RAM 712 is a device that stores an instruction to be executed by the CPU 710, data necessary for execution of the instruction, and data processed by the CPU 710. Under the instruction by the CPU 710, data is written into and read out from the RAM 712.

In the MCU 700 in a low power consumption mode, supply of power to the RAM 712 is blocked. Thus, the RAM 712 is made up of a nonvolatile memory that can store data when no power is supplied.

The memory interface 713 is an input-output interface with an external memory device. Under the instruction of the CPU 710, data is written into and read out from the external memory connected to the connection terminal 776 via the memory interface 713.

A clock generation circuit 715 is a circuit that generates a clock signal MCLK (hereinafter, also simply referred to as "MCLK") to be used in the CPU 710, and includes an RC oscillator and the like. MCLK is also output to the controller 720 and the interrupt controller 721.

The controller 720 is a circuit that controls the entire MCU 700, and controls, for example, a bus and a memory map; a power source of the MCU 700; the clock generation circuit 715; and the crystal oscillation circuit 741.

The connection terminal 770 is a terminal for inputting an external interrupt signal. A non-maskable interrupt signal NMI is input to the controller 720 through the connection terminal 770. As soon as the non-maskable interrupt signal NMI is input to the controller 720, the controller 720 outputs the non-maskable interrupt signal NMI to the CPU 710, so that the CPU 710 executes interrupt processing.

The interrupt signal INT is input to the interrupt controller 721 through the connection terminal 770. Interrupt signals (T0IRQ, P0IRQ, and C0IRQ) from the peripheral circuits (745, 750, and 751) are input to the interrupt controller 721 without going through the buses (761 to 764).

The interrupt controller 721 has a function of setting priorities to interrupt requests. When the interrupt controller 721 detects the interrupt signal, the interrupt controller 721 determines if the interrupt request is valid or not. If the interrupt request is valid, the interrupt controller 721 outputs an internal interrupt signal NT into the controller 720.

The interrupt controller 721 is connected to the bus line 761 and the data bus line 764 through an I/O interface 722.

When the interrupt signal NT is input, the controller 720 outputs the interrupt signal NT to the CPU 710 and makes the CPU 710 execute interrupt processing.

The interrupt signal T0IRQ is directly input to the controller 720 without going through the interrupt controller 721 in some cases. When the controller 720 receives the interrupt signal T0IRQ, the controller 720 outputs the non-maskable interrupt signal NMI to the CPU 710, so that the CPU 710 executes interrupt processing.

A register 780 of the controller 720 is provided in the controller 720. A register 786 of the interrupt controller 721 is provided in the I/O interface 722.

Then, peripheral circuits included in the MCU 700 will be described. The MCU 700 includes the timer circuit 745, the I/O port 750, and the comparator 751 as peripheral circuits. The circuits are examples of the peripheral circuits, and a circuit needed for an electronic device using the MCU 700 can be provided as appropriate.

The timer circuit 745 has a function of measuring time in response to a clock signal TCLK (hereinafter, also simply referred to as "TCLK") output from a clock generation circuit 740. The clock generation circuit 715 outputs the interrupt signal T0IRQ to the controller 720 and the interrupt controller 721 at predetermined intervals. The timer circuit 745 is connected to the bus line 761 and the data bus line 764 through the I/O interface 746.

TCLK is a clock signal of which frequency is lower than that of MCLK. For example, the frequency of MCLK is about several megahertz (MHz) (e.g., 8 MHz) and the frequency of TCLK is about several tens of kilohertz (kHz) (e.g., 32 kHz). The clock generation circuit 740 includes the crystal oscillation circuit 741 incorporated in the MCU 700 and the oscillation unit 742 which is connected to the connection terminal 772 and the connection terminal 773. The quartz crystal oscillator 743 is used as an oscillator of the oscillation unit 742. In addition, the clock generation circuit 740 is made up of a CR oscillator and the like, and thereby, all modules in the clock generation circuit 740 can be incorporated in the MCU 700.

The I/O port 750 is an interface that inputs and outputs information to and from an external device which is connected to the I/O port 750 through the connection terminal 774 and is an input-output interface of a digital signal. The I/O port 750 outputs the interrupt signal P0IRQ to the interrupt controller 721 in accordance with an input digital signal.

The comparator 751 is a peripheral circuit that processes an analog signal inputted from the connection terminal 775. The comparator 751 compares a potential (or current) of the analog signal inputted from the connection terminal 775 with a potential (or current) of a reference signal and generates a digital signal of which the level is 0 or 1. Further, the comparator 751 generates the interrupt signal C0IRQ when the level of the digital signal is 1. The interrupt signal C0IRQ is output to the interrupt controller 721.

The I/O port 750 and the comparator 751 are connected to the bus line 761 and the data bus line 764 through the I/O interface 752 common to the both. Here, one I/O interface 752 is used because the I/O interfaces of the I/O port 750 and the comparator 751 can share a circuit; however, the I/O port 750 and the comparator 751 can have an I/O interface different from each other.

In addition, a register of each peripheral circuit is placed in the input/output interface corresponding to the peripheral circuit. A register 787 of the timer circuit 745 is placed in the I/O interface 746, and a register 783 of the I/O port 750 and a register 784 of the comparator 751 are placed in the I/O interface 752.

The MCU 700 includes the power gate unit 730 that can stop power supply to the internal circuits. Power is supplied only to a circuit necessary for operation by the power gate unit 730, so that power consumption of the whole MCU 700 can be lowered.

As illustrated in FIG. 10, circuits in a unit 701, a unit 702, a unit 703, and a unit 704 in the MCU 700 which are surrounded by dashed lines are connected to the connection terminal 771 through the power gate unit 730. The connection terminal 771 is a power source terminal for supplying a high power supply potential $V_{DD}$ (hereinafter, also simply referred to as $V_{DD}$).

In this embodiment, the unit 701 includes the timer circuit 745, and the I/O interface 746. The unit 702 includes the I/O port 750, the comparator 751, and the I/O interface 752. The unit 703 includes the interrupt controller 721, and the I/O interface 722. The unit 704 includes the CPU 710, the RAM 712, the bus bridge 711, and the memory interface 713.

The power gate unit 730 is controlled by the controller 720. The power gate unit 730 includes a switch circuit 731 and a switch circuit 732 for blocking supply of $V_{DD}$ to the units 701 to 704.

The switching of the switch circuits 731 and 732 is controlled by the controller 720. Specifically, the controller 720 outputs a signal to turn off one or both of the switch circuits included in the power gate unit 730, depending on the request by the CPU 710 (power supply stop). In addition, the controller 720 outputs a signal to turn on the switch circuit included in the power gate unit 730 with, as a trigger, the non-maskable interrupt signal NMI or the interrupt signal T0IRQ from the timer circuit 745 (start of power supply).

FIG. 10 illustrates a structure where two switch circuits (the switch circuits 731 and 732) are provided in the power gate unit 730; however, the structure is not limited thereto. Switch circuits may be provided as much as needed to block supply of power.

In this embodiment, the switch circuit 731 is provided to individually control supply of power to the unit 701 and the switch circuit 732 is provided to individually control supply of power to the units 702 to 704. However, the embodiment of the present invention is not limited to such a power supply path. For example, another switch circuit which is not the switch circuit 732 may be provided to individually control supply of power to the RAM 712. Further, a plurality of switch circuits may be provided for one circuit.

In addition, $V_{DD}$ is constantly supplied from the connection terminal 771 to the controller 720 without going through the power gate unit 730. In order to reduce noise, a power supply potential from an external power supply circuit, which is different from the power supply circuit for $V_{DD}$, is given to each of the oscillation circuit of the clock generation circuit 715 and the crystal oscillation circuit 741.

Table 1 shows roles of the blocks.

TABLE 1

| Block name | Role |
| --- | --- |
| CPU 710 | Executing instruction |
| Clock generation circuit 715 | Generating clock signal MCLK |
| Crystal oscillation circuit 741 | Generating clock signal TCLK |
| Controller 720 | Performing control processing of the whole MCU 700 |
| Interrupt controller 721 | Setting priorities to interrupt request |
| I/O interface 746 | Inputting or outputting data |
| I/O interface 752 | Inputting or outputting data |
| I/O port 750 | An interface for connecting external device |
| Timer circuit 745 | Generating interrupt signal inaccordance with timer operation |
| Comparator 751 | Comparing input signal and reference signal in potential (or current) |
| RAM 712 | A memory device functioning as main memory of CPU 710 |
| Memory interface 713 | An input-output interface with external memory device |

By provision of the controller 720, the power gate unit 730, and the like, the MCU 700 can operate in three kinds of operation modes. The first operation mode is a normal operation mode where all circuits included in the MCU 700 are active. Here, the first operation mode is referred to as "Active mode".

The second and third operation modes are low power consumption modes where some of the circuits are active. In the second operation mode, the controller 720, the timer circuit 745, and circuits (the crystal oscillation circuit 741 and the I/O interface 746) associated thereto are active. In the other of the third operation mode, the controller 720 alone is active. Here, the second operation mode is referred to as "the Noff1 mode" and the third operation mode is referred to as "the Noff2 mode".

Table 2 below shows a relation between each operation mode and active circuits. In Table 2, ON is given to circuits that are active. As shown in Table 1, the controller 720 and some of the peripheral circuits (circuits necessary for timer operation) alone operate in the Noff1 mode and the controller 720 alone operates in the Noff2 mode.

TABLE 2

| | Active | Noff1 | Noff2 |
| --- | --- | --- | --- |
| CPU 710 | ON | — | — |
| Bus bridge 711 | ON | — | — |
| RAM 712 | ON | — | — |
| Memory interface 713 | ON | — | — |
| Clock generation circuit 715 | ON | — | — |
| Crystal oscillation circuit 741 | ON | ON | — |
| Contoller 720 | ON | ON | ON |
| Interrupt controller 721 | ON | — | — |
| I/O interface 722 | ON | — | — |
| Timer circuit 745 | ON | ON | — |
| I/O interface 746 | ON | ON | — |
| I/O port 750 | ON | — | — |
| Comparator 751 | ON | — | — |
| I/O interface 752 | ON | — | — |

Note that power is constantly supplied to the oscillator of the clock generation circuit 715 and the crystal oscillation circuit 741 regardless of the operation modes. In order to bring the clock generation circuit 715 and the crystal oscillation circuit 741 into non-Active modes, an enable signal is inputted from the controller 720 or an external circuit to stop oscillation of the clock generation circuit 715 and the crystal oscillation circuit 741.

In addition, in Noff1 and Noff2 modes, power supply is stopped by the power gate unit 730, so that the I/O port 750 and the I/O interface 752 are non-active, but power is supplied to parts of the I/O port 750 and the I/O interface 752 in order to allow the external device connected to the connection terminal 774 to operate normally. Specifically, power is supplied to an output buffer of the I/O port 750 and the register 786 of the I/O port 750. In the Noff1 and Noff2 modes, actual functions of the I/O port 750, that is, functions of data transmission between the I/O interface 752 and the external device and generation of an interrupt signal, are stopped. In addition, a communication function of the I/O interface 752 is also stopped similarly.

Note that in this specification, the phrase "a circuit is non-active" includes a state where major functions in Active mode (normal operation mode) are stopped and an operation state with power consumption lower than that of Active mode, as well as a state that a circuit is stopped by blocking supply of power.

Further, in order that the MCU 700 can return from the Noff1 or Noff2 mode to Active mode more rapidly, the registers 784 to 787 each have a backup storage portion for saving data at the time of power supply stop. In other words, the registers 784 to 787 each include a volatile data storage portion (also simply referred to as volatile memory unit) and a nonvolatile data storage portion (also simply referred to as nonvolatile memory unit). In Active mode, by accessing the volatile memory units of the registers 784 to 787, data is written and read out.

Note that since power is always supplied to the controller 720, the register 780 of the controller 720 is not provided with a nonvolatile memory unit. In addition, as described above, even in the Noff1 or Noff2 mode, the register 783 operates so that the output buffer of the I/O port 750 functions. Since power is always supplied to the register 783, the register 783 is not provided with a nonvolatile memory unit.

A volatile memory unit includes one or more of volatile memory elements. A nonvolatile memory unit includes one or more of nonvolatile memory elements. Note that the volatile memory element shows access speed higher than that of the nonvolatile memory element.

A semiconductor material used for a transistor included in the volatile memory element is not particularly limited. However, the semiconductor material preferably has a band gap width different from that of a semiconductor material used for a transistor included in the nonvolatile memory element to be described later. As such a semiconductor material, silicon, germanium, silicon germanium, gallium arsenide, or the like can be used, and a single crystal semiconductor is preferably used. In order to increase the speed of processing data, it is preferable to use, for example, a transistor with high switching speed, such as a transistor formed using single crystal silicon.

The nonvolatile memory element is electrically connected to a node holding electric charge corresponding to data of the volatile memory element and is used for storing data from the volatile memory element in a period during which power is not supplied. Accordingly, the nonvolatile memory element has a longer data retention time than at least the volatile memory element to which power is not supplied.

In the shift from Active mode to Noff1 or Noff2 mode, prior to power supply stop, data stored in the volatile memories of the registers 784 to 787 are written into the nonvolatile memories, so that data in the volatile memories are reset to initial values; as a result, supply of power is blocked.

In the return from Noff1 or Noff2 mode to Active mode, when power is supplied again to the registers 784 to 787, data in the volatile memories are reset to initial values. Then, data in the nonvolatile memories are written into the volatile memories.

Accordingly, even in the low power consumption mode, data needed for processing of the MCU 700 are stored in the registers 784 to 787, and thus, the MCU 700 can return from the low power consumption mode to Active mode immediately.

Figure 11:
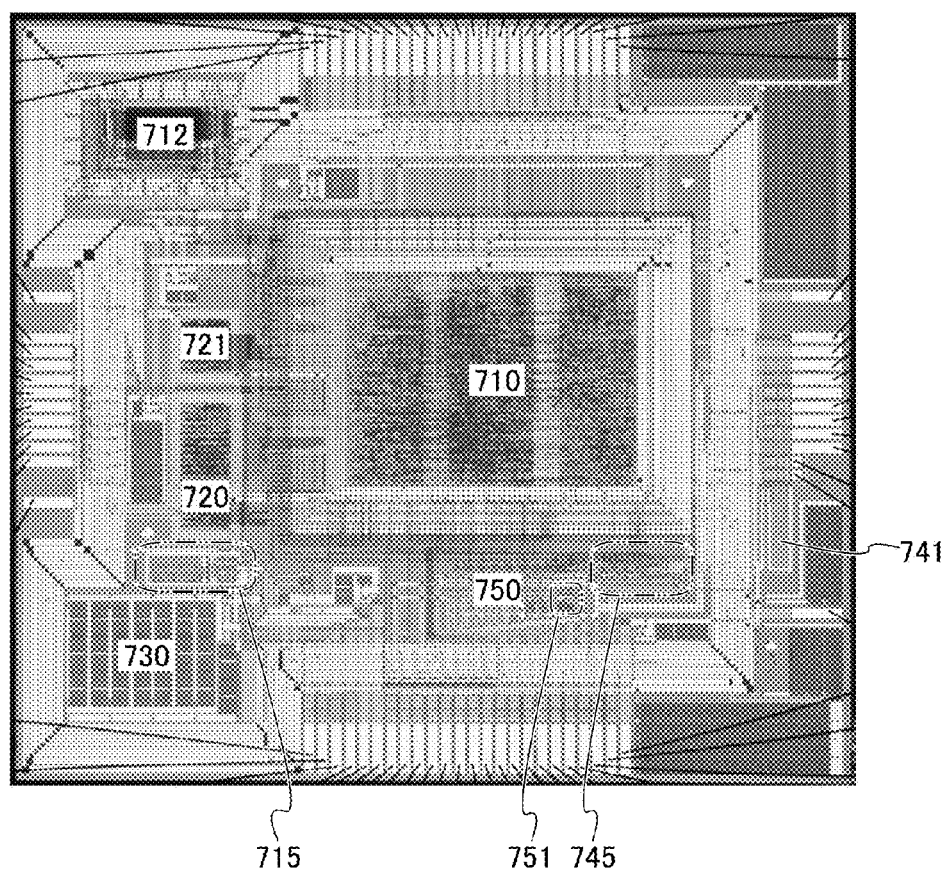
FIG. 11 is an optical micrograph of an MCU manufactured using a silicon substrate.

FIG. 11 is an optical micrograph of an MCU 790 that is fabricated using a silicon substrate. The external dimensions of the MCU 790 are 11.0 mm length and 12.0 mm width. The MCU 790 has the structure and function similar to those of the circuit block of the MCU 700 described with reference to FIG. 10. Note that some of the reference numerals attached to the circuit blocks are used in FIG. 11.

It is confirmed that data is stored in the register 785, when the operation mode of the MCU 790 illustrated in FIG. 11 is shifted from Active mode to the Noff2 mode with no power supply. The result will be described with reference to timing charts in FIG. 12 and FIGS. 13A and 13B.

To confirm if data is stored or not is performed as follows: data is stored in a HL register in the volatile memory of the register 785 in Active mode and the data stored in the HL register is read out after the operation mode returned to Active mode from Noff2 mode with no power supply.

Figure 12:
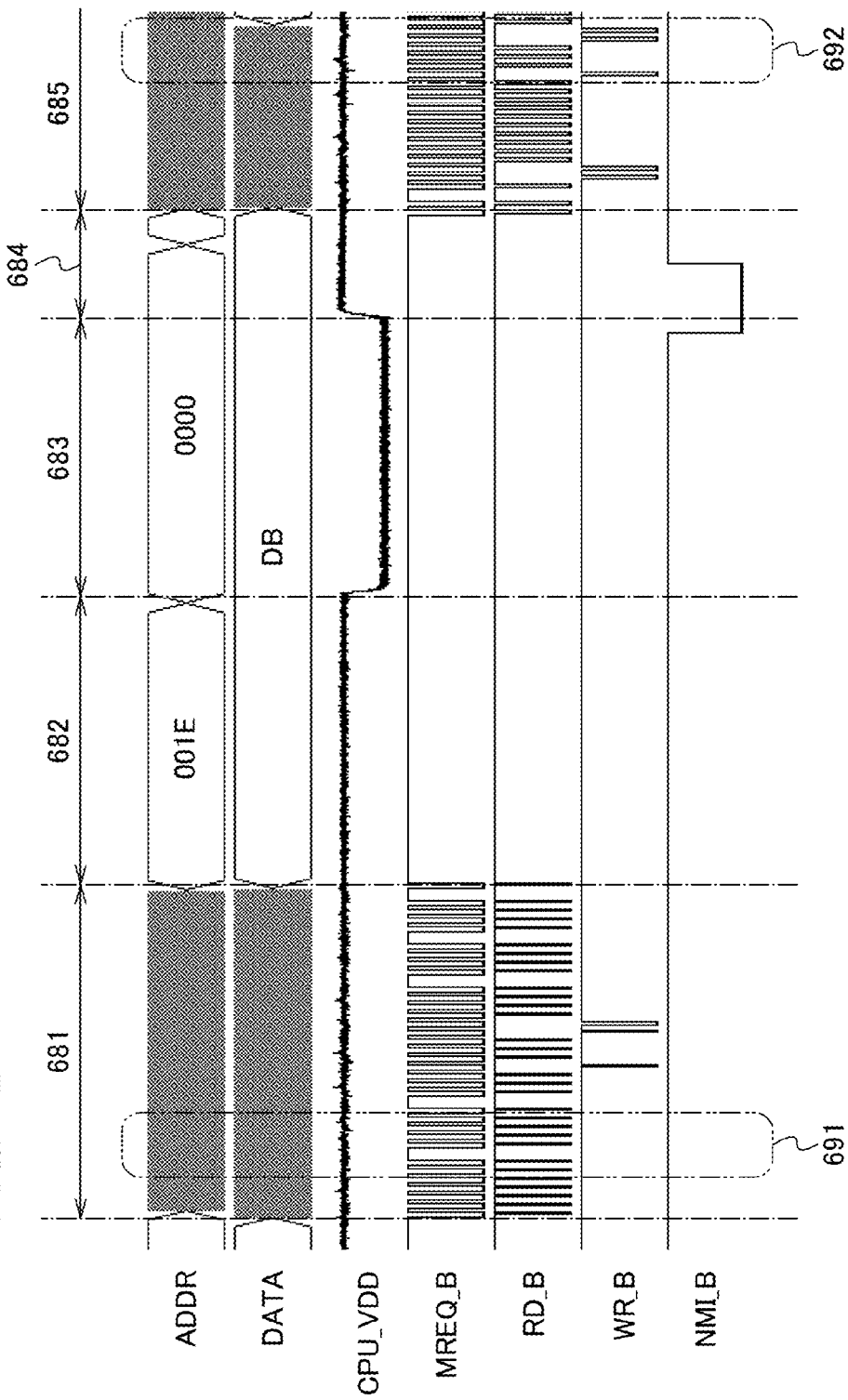
FIG. 12 is a timing chart showing operation of the MCU illustrated in FIG. 11.
Figure 13A:
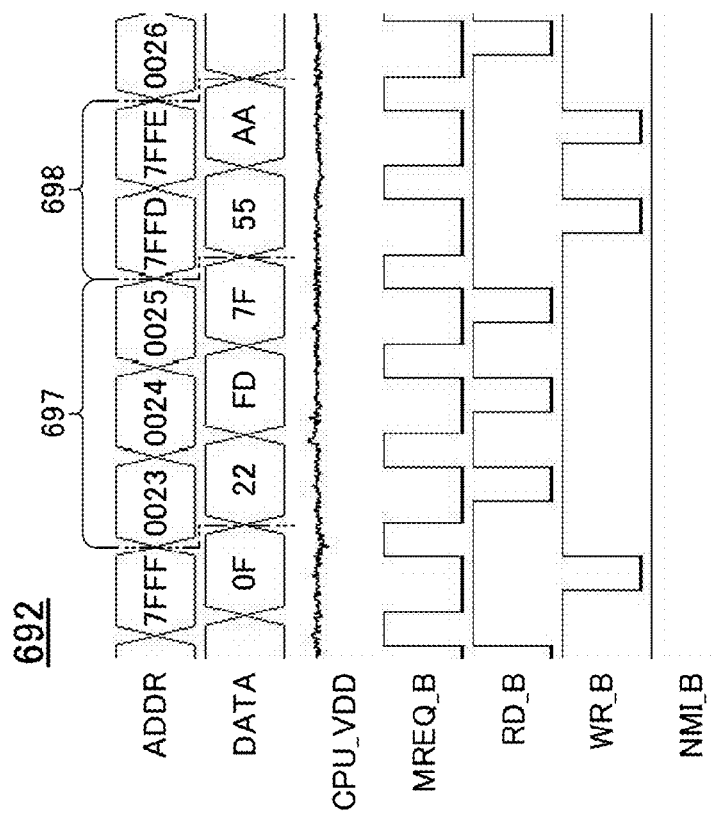
FIGS. 13A and 13B are timing charts showing operation of the MCU illustrated in FIG. 11.
Figure 13B:
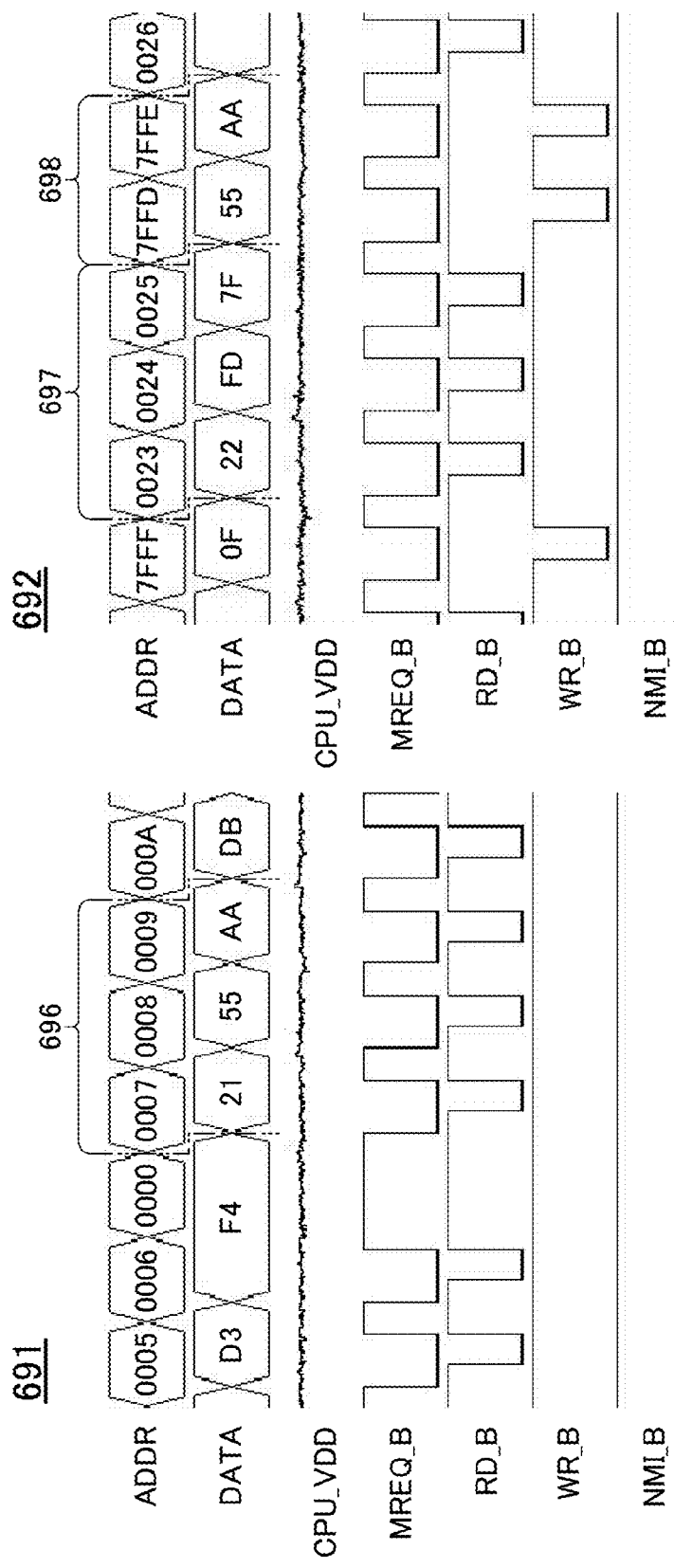

FIG. 12 and FIGS. 13A and 13B show results obtained by the following manner: a signal generated by a pattern generator module TLA7PG2 produced by Tektronix, Inc. is inputted into the MCU 790, and a signal generated at the input-output terminal of the MCU 790 is measured by a logic analyzer TLA7AA2 produced by Tektronix, Inc.

"ADDR", "DATA", "CPU_VDD", "MREQ_B", "RD_B", "WR_B", and "NMI_B" shown in FIG. 12 and FIGS. 13A and 13B are names of the input-output terminals measured by the logic analyzer.

From the ADDR terminal, the number of steps calculated by a CPU (the value is changed sequentially depending on the number of processing) or an address accessed by the CPU can be detected. In addition, from the DATA terminal, an instruction code executed by the CPU 710 in the MCU 790 or data inputted or outputted by the MCU 790 can be detected. In addition, from the CPU_VDD terminal, a potential of VDD supplied to the CPU can be detected. Further, from the MREQ_B terminal, a signal for determining access to an external memory can be detected. When the MREQ_B terminal has a low potential, access to the external memory is allowed, and when the MREQ_B terminal has a high potential, access to the external memory is denied. In addition, when the MREQ_B terminal has a low potential and the RD_B terminal has a low potential, readout of data from the external memory is allowed, and when the MREQ_B terminal has a low potential and the WR_B terminal has a low potential, writing of data to the external memory is allowed. In addition, from the NMI_B terminal, a non-maskable interrupt signal can be detected. Although a high potential is usually supplied to the NMI_B terminal, when a low potential is supplied to the NMI_B terminal, interrupt processing is executed.

Note that the "high potential" means a potential higher than a reference potential and the "low potential" means a potential lower than the reference potential. In the case where the reference potential is 0 V, the high potential can be called a positive potential and the low potential can be called a negative potential. Alternatively, one of the high potential and the low potential can be equal to the reference potential.

In addition, a period 681 and a period 685 illustrated in FIG. 12 are periods in which the MCU 790 operates in Active mode. A period 682 is a backup process period in which data is transferred from the volatile memory to the nonvolatile memory in each register, before the operation mode of the MCU 790 is shifted from Active mode to Noff2 mode. A period 683 is a period in which the MCU 790 operates in Noff2 mode. A period 684 is a return process period in which data is returned back to the volatile memory from the nonvolatile memory in each register, before the operation mode of the MCU 790 returns from Noff2 mode to Active mode.

FIG. 13A illustrates a period 691 which is the partly-enlarged period 681. FIG. 13B illustrates a period 692 which is the partly-enlarged period 685.

In the period 681 (Active mode period), data "AA55" is stored in the HL register that is a part of the register 785 (processing 696). In the processing 696, "21" detected from the DATA terminal when the ADDR terminal is "0007" is an instruction code for storing data in the HL register. In addition, "55" and "AA" that are subsequently detected from the DATA terminal are data stored in the HL register. Note that the MCU 790 processed data in terms of bytes, and thus "55" is detected as the low byte first and then "AA" is detected as the high byte (see FIG. 12 and FIG. 13A).

Next, a signal for switching the operation mode of the MCU 790 to Noff2 mode is inputted into the MCU 790 (not shown). When the signal for switching the operation mode to Noff2 mode is inputted into the MCU 790, the MCU 790 transfers data that is needed to be stored after power supply stop, of data stored in the volatile memories of the registers, to the nonvolatile memories and the data is stored in the nonvolatile memories (the period 682). At this time, the data "AA55" stored in HL register that is one of the volatile memories is transferred to and stored in the nonvolatile memory.

After the MCU 790 finishes data transfer and data storage to the nonvolatile storage portion, the MCU 790 allows the power gate unit 730 to operate so as to stop power supply to each circuit block, and thereby the operation mode becomed Noff2 mode (the period 683). In the period 683 in FIG. 12, power supply to the CPU_VDD terminal is stopped.

The return from the Noff2 mode to Active mode is started by supply of a low potential to the NMI_B terminal. When the low potential is supplied to the NMI_B terminal, the power gate unit 730 operates to restart power supply to each circuit block. Then, data stored in the nonvolatile memory is transferred to and stored in the volatile memory. At this time, the data "AA55" stored in the nonvolatile memory is transferred to and stored again in the HL register (the period 684).

After return of data from the nonvolatile memory to the volatile memory is finished, the MCU 790 operates again in Active mode in response to the returned data the period 685).

Then, in the period 685, a processing 697 and a processing 698 are conducted so that data returned in the HL register is confirmed. During the processing 697, "22" detected from the "DATA" terminal when "0023" is detected from the "ADDR" terminal is an instruction code for transferring data stored in HL register to the external memory. Further, "FD" and "7F" that are subsequently detected from the "DATA" terminal mean an address "7FFD" of the external memory that is an address to which data is to be transferred (see FIG. 12 and FIG. 13B).

The MCU 790 transfers data in the HL register to the external memory in the processing 698 following the processing 697. As described above, the MCU 790 processes data in terms of bytes. In addition, the external memory stores one byte of data per address. Thus, the MCU 790 that have received an instruction of the processing 697 transfers data as the low byte in HL register to the address "7FFD" in the external memory, and then transfers data as the high byte to an address "7FFE" in the external memory in the processing 698.

As shown in FIG. 13B, in the processing 698, the MCU 790 outputs "7FFD" to the ADDR terminal, and outputs "55" to the DATA terminal as data of the low byte in the HL register. At this time, a low potential is supplied to the MREQ_B terminal and the WR_B terminal, so that "55" is written into the address "7FFD" in the external memory.

Then, the MCU 790 outputs "7FFE" to the ADDR terminal, and outputs "AA" as data of the high byte in the HL register to the DATA terminal. At this time, a low potential is supplied to the MREQ_B terminal and the WR_B terminal, so that "AA" is written into the address "7FFE" in the external memory.

The measurement results of the ADDR terminal and the DATA terminal in the processing 697 and the processing 698 show that data "AA55" is stored in the HL register in the period 685. Thus, it is confirmed that the MCU 790 holds data in the register 785 even when the MCU 790 is switched from Active mode to Noff2 mode with no power supply. In addition, it is also confirmed that the MCU 790 operate normally after the MCU 790 returned from Noff2 mode to Active mode.

Figure 14:
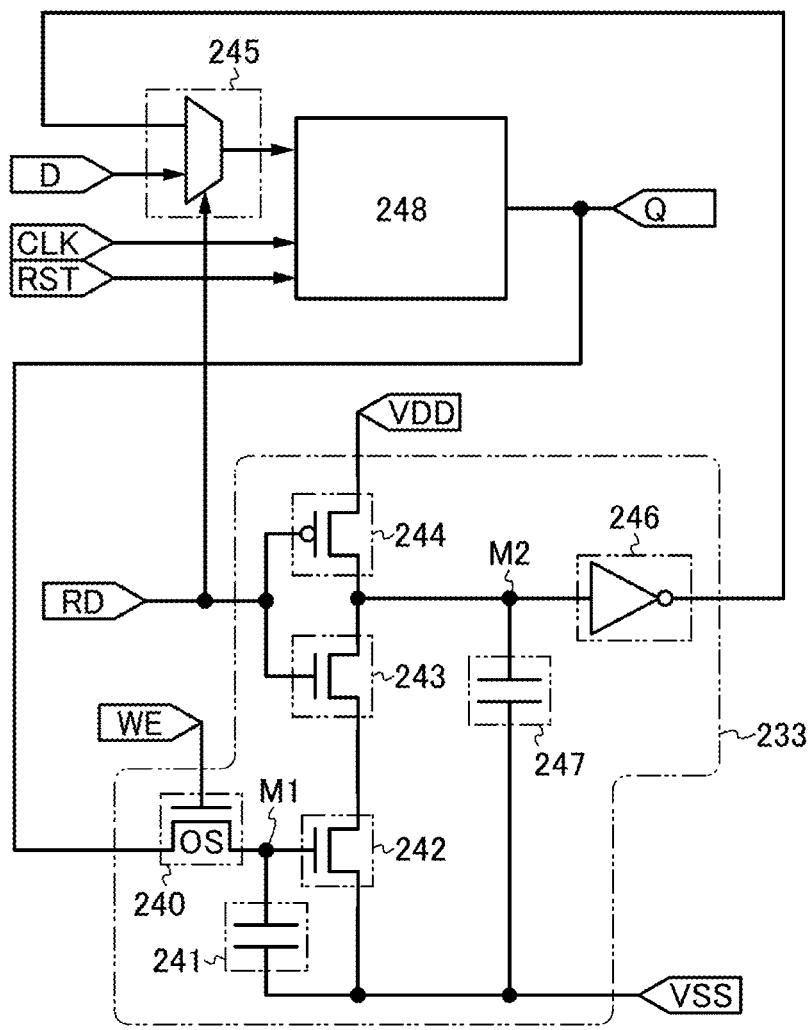
FIG. 14 is a circuit diagram illustrating an example of a register including a nonvolatile memory unit.

FIG. 14 shows a register 1196 as one example of a circuit structure that can be used for the registers 784 to 787. The circuit structure includes a volatile memory unit and a nonvolatile memory unit and can store 1-bit data.

The register 1196 illustrated in FIG. 14 includes a flip-flop 248 which is a volatile memory unit, a nonvolatile memory unit 233, and a selector 245.

The flip-flop 248 is supplied with a reset signal RST, a clock signal CLK, and a data signal D. The flip-flop 248 has a function of holding data of a data signal D that is input in accordance with the clock signal CLK and outputting a high-level potential H or a low-level potential L as a data signal Q in accordance with the data signal D.

The nonvolatile memory unit 233 is supplied with a write control signal WE, a read control signal RD, and a data signal D.

The nonvolatile memory unit 233 has a function of storing data of an input data signal D in accordance with the write control signal WE and outputting the stored data as the data signal D in accordance with the read control signal RD.

The selector 245 selects the data signal D or the data signal output from the nonvolatile memory unit 233 and inputs the selected signal to the flip-flop 248 in accordance with the read control signal RD.

Further, as illustrated in FIG. 14, a transistor 240 and a capacitor 241 are provided in the nonvolatile memory unit 233.

The transistor 240 is an n-channel transistor. One of a source and a drain of the transistor 240 is electrically connected to an output terminal of the flip-flop 248. The transistor 240 has a function of controlling holding a data signal output from the flip-flop 248 in accordance with the write control signal WE.

The transistor 240 preferably has extremely low off-state current. For example, a transistor which includes an oxide semiconductor for a semiconductor layer where a channel is formed is used as the transistor 240.

One of a pair of electrodes of the capacitor 241 and the other of the source and the drain of the transistor 240 are connected to a node M1. A low power source potential $V_{SS}$ is applied to the other of the pair of the electrodes of the capacitor 241. The capacitor 241 has a function of holding electric charge based on data of the stored data signal D in the node M1. Since a transistor having an extremely low off-state current is used for the transistor 240, the electric charge in the node M1 is held and thus the data is held even when supply of the power supply voltage is stopped. By using a transistor having an extremely low off-state current for the transistor 240, the capacitor 241 can be small or omitted.

A transistor 244 is a p-channel transistor. A high power source potential $V_{DD}$ is supplied to one of a source and a drain of the transistor 244. The read control signal RD is input to the gate electrode of the transistor 244.

The transistor 243 is an n-channel transistor. One of a source and a drain of the transistor 243 and the other of the source and the drain of the transistor 244 are connected to a node M2. A gate of the transistor 243 is connected to a gate of the transistor 244 and the read control signal RD is input to the gate of the transistor 243.

A transistor 242 is an n-channel transistor. One of a source and a drain of the transistor 242 is connected to the other of the source and the drain of the transistor 243. A power source potential $V_{SS}$ is supplied to the other of the source and the drain of the transistor 242. Note that a high-level potential H which the flip-flop 248 outputs is a potential at which the transistor 242 is turned on, and a low-level potential L which the flip-flop 248 outputs is a potential at which the transistor 242 is turned off.

An input terminal of an inverter 246 is connected to the node M2. In addition, an output terminal of the inverter 246 is connected to an input terminal of the selector 245.

One of the electrodes of a capacitor 247 is connected to the node M2. A power source potential $V_{SS}$ is supplied to the other of the electrodes of the capacitor 247. The capacitor 247 has a function of holding electric charge based on data of a data signal input to the inverter 246.

In the register 1196 having the above-described structure in FIG. 14, when data is stored from the flip-flop 248 to the nonvolatile memory unit 233, the transistor 240 is turned on by inputting a signal for turning on the transistor 240 as the write control signal WE, so that electric charge corresponding to the data signal Q in the flip-flop 248 is supplied to the node M1. After that, by turning off the transistor 240 by inputting a signal for turning off the transistor 240 as the write control signal WE, electric charge supplied to the node M1 is held. While $V_{SS}$ is supplied as the potential of the read control signal RD, the transistor 243 is turned off and the transistor 244 is turned on, so that the potential of the node M2 becomes $V_{DD}$.

When data is restored from the nonvolatile memory unit 233 to the flip-flop 248, $V_{DD}$ is applied as the read control signal RD. Accordingly, the transistor 244 is turned off and the transistor 243 is turned on, so that a potential based on the electric charge held in the node M1 is supplied to the node M2. In the case where electric charge corresponding to the high potential H of the data signal Q is held in the node M1, the transistor 242 is turned on, $V_{SS}$ is supplied to the node M2, and $V_{DD}$ output from the inverter 246 is input to the flip-flop 248 through the selector 245. Alternatively, in the case where electric charge corresponding to the low potential L of the data signal Q is held in the node M1, the transistor 242 is turned off, the potential ($V_{DD}$) of the node M2 when the low potential L is supplied is held as the potential of the read control signal RD, and $V_{SS}$ output from the inverter 246 is input to the flip-flop 248 through the inverter 246.

By provision of the volatile memory unit 232 and the nonvolatile memory unit 233 in the register 1196 as described above, data can be stored from the volatile memory unit 232 in the nonvolatile memory unit 233 before supply of power to the CPU 230 is stopped and data can be quickly restored from the nonvolatile memory unit 233 to the volatile memory unit 232 when the supply of power to the CPU 230 is resumed.

By storing and restoring data in such a manner, the CPU 230 does not need to be started up from a state where the volatile memory unit 232 is initialized every time the supply of power is stopped; thus, after the supply of power is resumed, the CPU 230 can start arithmetic processing relating to measurement immediately.

Note that in order to increase the speed of reading data, it is preferable to use a transistor that is similar to the transistor used for the volatile memory element as the transistor 242.

Note that in the register 1196, $V_{SS}$ is supplied to the other of the source and the drain of the transistor 242 and the other of the electrodes of the capacitor 241. However, the other of the source and the drain of the transistor 242 and the other of the electrodes of the capacitor 241 may have the same potential or different potentials. Further, the capacitor 241 is not needed to be provided. For example, in the case where the parasitic capacitance of the transistor 242 is high, the parasitic capacitance can be used instead of the capacitor 241.

The node M1 has the same effect as a floating gate of a floating-gate transistor that is used as a nonvolatile memory element. However, since data can be directly rewritten by turning on or off the transistor 240, injection of electric charge into a floating gate and extraction of electric charge from the floating gate with the use of high voltage are not necessary. In other words, in the nonvolatile memory unit 233, high voltage needed for writing or erasing data in a conventional floating gate transistor is not necessary. Thus, by using the nonvolatile memory unit 233 in this embodiment, power consumption needed for storage of data can be reduced.

For similar reasons, a decrease in operation speed due to data writing or data erasing can be reduced; thus, the nonvolatile memory unit 233 can operate at high speed. For the same reason, deterioration of a gate insulating film (tunnel insulating film), which is a problem of a conventional floating gate transistor, does not exist. In other words, unlike in a conventional floating gate transistor, the nonvolatile memory unit 233 described in this embodiment has no limitation on the number of writings in principle. From the above, the nonvolatile memory unit 233 can be adequately used as a memory device that needs many rewritings and high-speed operation, such as a register.

In the above, the structure of the nonvolatile memory unit 233 is not limited to the structures in FIG. 14. For example, a phase change memory (PCM), a resistance random access memory (ReRAM), a magnetoresistive random access memory (MRAM), a ferroelectric random access memory (FeRAM), or a flash memory can be used.

Volatile memory elements can be included in, for example, a register such as a buffer register or a general-purpose register. A cache memory including a static random access memory (SRAM) or the like can also be provided in the volatile memory unit. The register and cache memory can store data in the nonvolatile memory unit 233.

This embodiment can be implemented combining with another embodiment as appropriate.

Embodiment 2

In this embodiment, as one example of a transistor which can be applied to a power switch or an MCU which are disclosed in the above embodiment, an example of the structure and the manufacturing method of a transistor 300 which includes an oxide semiconductor for a semiconductor layer where a channel is formed will be described.

In this embodiment, a structure example preferred in the case where the transistor 300 is used for a power switch (power MOSFET) will be described.

FIG. 15A is a top view of the transistor 300. FIG. 15B is a cross-sectional view of a stacked-layer structure of a part taken along dashed-dotted line A1-A2 in FIG. 15A. FIG. 15C is a cross-sectional view of a stacked-layer structure of a part taken along dashed-dotted line B1-B2 in FIG. 15A. FIG. 15D is an enlarged view of a part 345 in FIG. 15B. Note that in FIG. 15A, some components are omitted for easy understanding.

In the transistor 300 illustrated in FIGS. 15A to 15D, a semiconductor substrate 303 over a heat dissipation plate 301 is used as a back gate electrode, an insulating layer 302 is over the semiconductor substrate 303, a buffer layer 305 is over the insulating layer 302, and an oxide semiconductor layer 307 having a crystal structure is over the buffer layer 305. Note that the back gate electrode is positioned so that a channel formation region of the semiconductor layer is sandwiched between a gate electrode and the back gate electrode and can function like a gate electrode. By changing a potential of the back gate electrode, the threshold voltage of the transistor can be changed.

Further, a first terminal 309 and a second terminal 311 which are formed using a conductive material are provided over the oxide semiconductor layer 307 so as to be in contact with part of the oxide semiconductor layer 307, and an insulating layer 313 is provided so as to cover the oxide semiconductor layer 307, the first terminal 309, and the second terminal 311. Furthermore, a gate electrode 315 formed using a conductive material is provided over the insulating layer 313 so as to overlap with at least part of each of the oxide semiconductor layer 307, the first terminal 309, and the second terminal 311.

It is necessary that the semiconductor substrate 303 have at least heat resistance high enough to withstand heat treatment (e.g., 900° C. or higher) which is performed later. As the semiconductor substrate 303, a single crystal silicon substrate, a SiC substrate, a GaN substrate, a GaAs substrate, or the like can be used. Alternatively, a compound semiconductor substrate of silicon germanium or the like or an SOI substrate may be used as the semiconductor substrate 303. In this embodiment, a single crystal silicon substrate is used as the semiconductor substrate 303.

The insulating layer 302 can be formed as a single layer or a stack of layers using any of the following materials: silicon oxide obtained by thermal oxidation or the like using hydrogen chloride or the like; silicon oxide obtained by a plasma chemical vapor deposition (CVD) method, a sputtering method, or the like; an oxynitride insulator such as silicon oxynitride or aluminum oxynitride; a nitride oxide insulator such as silicon nitride oxide; and the like. In the case where the insulating layer 302 is formed as a stack of layers using any of the above materials, the stack of layers may be formed using the same material or may be formed using different materials. Note that "nitride oxide" means that the nitrogen content is higher than the oxygen content whereas "oxynitride" means that the oxygen content is higher than the nitrogen content.

A silicon nitride film may be formed as the insulating layer 302 by a plasma CVD method or the like. Note that in the case of using a silicon nitride film, it is preferable to use a silicon nitride film from which hydrogen or a hydrogen compound is hardly released by heat treatment after film formation, such as a silicon nitride film formed using a mixed gas of silane ($SiH_4$), nitrogen ($N_2$), and ammonia ($NH_3$) as a supply gas. In this embodiment, silicon oxide which is obtained by thermal oxidation is used for the insulating layer 302.

To prevent silicon and chlorine from entering the oxide semiconductor layer 307, the buffer layer 305 is provided between the semiconductor substrate 303 and the oxide semiconductor layer 307. Further, the buffer layer 305 is provided between the oxide semiconductor layer 307 and the insulating layer 302 on a surface of the semiconductor substrate 303.

The buffer layer 305 can be formed as a single layer or a stack of layers using any of gallium oxide, indium gallium oxide, hafnium oxide, yttrium oxide, aluminum oxide, and the like. The buffer layer 305 preferably formed using a material containing the same kind of component as one contained in the oxide semiconductor layer 307, which is formed over and in contact with the buffer layer 305. This is because such a material is compatible with the oxide semiconductor, and therefore, the use of such a material for a layer in contact with the oxide semiconductor enables a state of the interface between the semiconductor layer and the layer to be kept well. Here, containing "the same kind of component as the oxide semiconductor" means containing one or more of elements selected from constituent elements of the oxide semiconductor. For example, in the case where the oxide semiconductor layer 307 is formed using an In—Ga—Zn-based oxide semiconductor material, gallium oxide, gallium oxide zinc, indium gallium oxide, and the like are given as an insulating material containing the same kind of component as one contained in the oxide semiconductor.

In the case where the buffer layer 305 is formed as a stack of layers, a stacked-layer structure of a layer a and a layer b may be employed. The layer a is formed using an insulating material containing the same kind of component as one contained in the oxide semiconductor layer 307 which is in contact with the buffer layer 305, and the layer b is formed using a material that is different from the material of the layer a. Alternatively, the buffer layer 305 may be formed using an In—Ga—Zn-based oxide film which is formed using a target with an atomic ratio of In:Ga:Zn=1:3:2.

The oxide semiconductor layer 307 can be formed by a sputtering method, a CVD method, a molecular beam epitaxy (MBE) method, an atomic layer deposition (ALD) method, or a pulse laser deposition (PLD) method. The oxide semiconductor layer 307 preferably contains at least indium (In) or zinc (Zn). Alternatively, the oxide semiconductor film 119 preferably contains both In and Zn. For example, an In—Zn-based oxide, an In—Mg-based oxide, an In—Ga-based oxide, an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Sn—Hf—Zn-based oxide, or the like can be used.

The oxide semiconductor layer 307 is not limited to a single layer and may be multilayered; a stack of layers having different compositions may be used. For example, a two-layer structure may be used, in which an In—Ga—Zn-based oxide film formed using a target containing In, Ga, and Zn at an atomic ratio of 1:1:1 is stacked over an In—Ga—Zn-based oxide film formed using a target containing In, Ga, and Zn at an atomic ratio of 3:1:2. When this two-layer structure is subjected to heat treatment, the two layers both become films having high crystallinity to form a stack of films having the same crystal structure, i.e., c-axis aligned crystalline oxide semiconductor (CAAC-OS) films. Alternatively, a three-layer structure may be used, in which an In—Ga—Zn-based oxide film formed using a target containing In, Ga, and Zn at an atomic ratio of 3:1:2 is formed over an In—Ga—Zn-based oxide film formed using a target containing In, Ga, and Zn at an atomic ratio of 1:1:1 and then an In—Ga—Zn-based oxide film formed using a target containing In, Ga, and Zn at an atomic ratio of 1:1:1 is stacked thereover.

A structure of the oxide semiconductor film that can be used in the oxide semiconductor layer 307 will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when f scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in the electrical characteristics of the transistor due to irradiation with visible light or ultraviolet light is small.

Note that a film which forms the oxide semiconductor layer may be a stacked film including two or more films of an amorphous oxide semiconductor film, a microcrystalline oxide semiconductor film, and a CAAC-OS film, for example.

The thickness of the oxide semiconductor layer 307 is set so that a depletion layer spreads in a channel region and the transistor 300 can be turned off when negative voltage is applied between the gate electrode 315 and the semiconductor substrate 303 serving as a back gate electrode.

The first terminal 309 and the second terminal 311 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. In addition, the first terminal 309 and the second terminal 311 may have a single-layer structure or a stacked-layer structure of two or more layers. For example, a single-layer structure of an aluminum layer containing silicon, a two-layer structure where a titanium layer is stacked over an aluminum layer, a two-layer structure where a titanium layer is stacked over a titanium nitride layer, a two-layer structure where a tungsten layer is stacked over a titanium nitride layer, a two-layer structure where a tungsten layer is stacked over a tantalum nitride layer, a three-layer structure where a titanium layer, an aluminum layer, and a titanium layer are stacked in this order, and the like can be given. Alternatively, a layer, an alloy layer, or a nitride layer which contains aluminum and one or more elements selected from titanium, tantalum, tungsten, molybdenum, chromium, neodymium, and scandium may be used.

The first terminal 309 and the second terminal 311 can be formed using a light-transmitting conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added. It is also possible to have a stacked-layer structure formed using the above light-transmitting conductive material and the above metal element.

The insulating layer 313 can be formed as a single layer or a stack of layers using any of the following materials: silicon oxide obtained by a plasma CVD method, a sputtering method, or the like; an oxide insulator such as aluminum oxide, magnesium oxide, gallium oxide, germanium oxide, yttrium oxide, zirconium oxide, lanthanum oxide, neodymium oxide, hafnium oxide, or tantalum oxide; an oxynitride insulator such as silicon oxynitride or aluminum oxynitride; a nitride oxide insulator such as silicon nitride oxide; and the like. In the case where the insulating layer 313 is formed as a stack of layers using any of the above materials, the stack of layers may be formed using the same material or may be formed using different materials. Note that a second buffer layer may be provided between the insulating layer 313 and the oxide semiconductor layer 307. The second buffer layer can be formed using a material which can be used for the buffer layer 305, as appropriate.

The insulating layer 313 may be formed by a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

The inorganic insulating layer which is described in this specification can be formed by a thermal CVD method such as a MOCVD method or an ALD method. For example, in the case where a hafnium oxide film is formed by an ALD method, two kinds of gases, i.e., ozone ($O_3$) as an oxidizer and a source gas which is obtained by vaporizing a solvent and liquid containing a hafnium precursor compound (a hafnium alkoxide solution, typically tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamide)hafnium.

For example, in the case where an aluminum oxide film is formed by an ALD method, two kinds of gases, e.g., H$_2$O as an oxidizer and a source gas which is obtained by vaporizing a solvent and liquid containing an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by an ALD method, hexadichlorosilane is adsorbed on a surface where a film is to be formed, chlorine contained in the adsorbate is removed, and radicals of an oxidizing gas (e.g., $O_2$ or dinitrogen monoxide) are supplied to react with the adsorbate.

The gate electrode 315 can be formed using a metal material selected from aluminum (Al), chromium (Cr), copper (Cu), tantalum (Ta), titanium (Ti), molybdenum (Mo), tungsten (W), neodymium (Nd), and scandium (Sc); an alloy material containing the above metal element; a nitride material of the above metal element; or the like. Further, a material containing one or more metal elements selected from manganese (Mn), magnesium (Mg), zirconium (Zr), and beryllium (Be) may be used. Alternatively, a semiconductor typified by polycrystalline silicon including an impurity element such as phosphorus, or silicide such as nickel silicide may be used.

Further, the gate electrode 315 may have a single-layer structure or a stacked-layer structure of two or more layers. Examples thereof are a single-layer structure using aluminum containing silicon, a two-layer structure where titanium is stacked over aluminum, a two-layer structure where titanium is stacked over a titanium nitride, a two-layer structure where tungsten is stacked over a titanium nitride, a two-layer structure where tungsten is stacked over a tantalum nitride, a two-layer structure where copper is stacked over a Cu—Mg—Al alloy, a three-layer structure where a titanium nitride, copper, and tungsten are stacked in this order, and a three-layer structure where tungsten, copper, and a titanium nitride are stacked in this order. With the gate electrode 315 formed using copper, wiring resistance of the gate electrode 315 and wiring resistance of a wiring formed using the same layer as the gate electrode 315 can be reduced. Alternatively, copper is stacked with a refractory metal such as tungsten, molybdenum, and tantalum, or a nitride of the metal, whereby diffusion of copper to another layer can be prevented.

The gate electrode 315 can be formed using a conductive material containing oxygen such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added.

It is also possible to use a stacked-layer structure formed using the above conductive material containing oxygen and a material containing the above metal element.

Since the transistor 300 illustrated in FIGS. 15A to 15D includes the oxide semiconductor layer 307 having a crystal structure for the channel region, the transistor 300 can withstand high voltage, and on-state resistance can be reduced and a large amount of current can flow.

One example of the manufacturing method of the transistor 300 illustrated in FIGS. 15A to 15D will be described.

The insulating layer 302 is formed over the semiconductor substrate 303 serving as a back gate electrode. In this embodiment, the surface of the semiconductor substrate 303 is oxidized by thermal oxidation using hydrogen chloride and oxygen to form the insulating layer 302. Alternatively, the insulating layer 302 may be formed by high-density plasma CVD using microwaves (e.g., a frequency of 2.45 GHz) so as to be dense and have high withstand voltage and high quality.

Next, the buffer layer 305 is formed by a sputtering method, a CVD method, a coating method, a pulsed laser deposition method, or the like. For the buffer layer 305, a material capable of blocking the diffusion of impurities contained in the semiconductor substrate 303 or the insulating layer 302, typified by a material containing gallium, is used.

In the above structure, the semiconductor substrate 303 is a single crystal silicon substrate and the insulating layer 302 is a silicon oxide film formed by thermal oxidation. The buffer layer 305 is provided between the insulating layer 302 and the oxide semiconductor layer 307 in this embodiment; thus, even when hydrogen chloride is used in thermal oxidation for forming the insulating layer 302, the buffer layer 305 can prevent chlorine contained in the insulating layer 302 from being diffused. When the oxide semiconductor is formed by a sputtering method directly on the insulating layer 302 formed using silicon oxide, silicon contained in the insulating layer 302 might enter the oxide semiconductor at the time of sputtering; however, the buffer layer 305 can prevent silicon from entering the oxide semiconductor. The entry of impurities such as silicon into the oxide semiconductor layer inhibits crystallization; thus, impurities are preferably prevented from entering as much as possible.

Next, the oxide semiconductor layer 307 having a crystal structure is formed over the buffer layer 305.

The oxide semiconductor layer 307 is preferably the one having a crystal structure right after deposition, which is obtained by deposition by a sputtering method while the substrate is heated. Specifically, the substrate temperature during the deposition is higher than or equal to 100° C. and lower than or equal to 740° C., preferably higher than or equal to 200° C. and lower than or equal to 500° C. As a sputtering method, an RF sputtering method, a DC sputtering method, an AC sputtering method, or the like can be used. In particular, a DC sputtering method is preferably used because dust generated in the deposition can be reduced and the film thickness can be uniform.

When the substrate temperature is higher than or equal to 200° C., fine sputtering particles fly from a sputtering target, and a film is formed so that the sputtering particles adhere onto the deposition-target substrate. Further, the sputtering particles are rearranged because the substrate is heated. Thus, a dense oxide semiconductor layer is formed.

Further, heat treatment at a temperature higher than or equal to 200° C. may be performed after the deposition of the oxide semiconductor layer, so that a denser layer is obtained. However, in that case, oxygen vacancies might be generated when impurity elements (e.g., hydrogen and water) in the oxide semiconductor layer are reduced. Thus, before the heat treatment is performed, an insulating layer containing excess oxygen is preferably provided over or below the oxide semiconductor layer, in which case oxygen vacancies in the oxide semiconductor layer can be reduced by the heat treatment.

Even in the case where the substrate temperature is set at 400° C. or higher to make the oxide semiconductor to have high density, later heat treatment at 900° C. or higher does not generate peeling or the like. Note that in the case where the oxide semiconductor layer has an amorphous structure right after the deposition, the oxide semiconductor layer can be changed to have a crystal structure by performing heat treatment thereon in a later step.

For the deposition of the CAAC-OS, the following conditions are preferably used.

By a reduction in impurity concentration in the oxide semiconductor layer which is to be formed, the crystal state can be prevented from being broken by the impurities. For example, the impurities (e.g., hydrogen, water, carbon dioxide, and nitrogen) which exist in the deposition chamber may be reduced. Furthermore, impurities in a sputtering gas may be reduced. Specifically, a sputtering gas whose dew point is −80° C. or lower, preferably −100° C. or lower is used.

Further, it is preferable that the proportion of oxygen in the sputtering gas be increased and the power be optimized in order to reduce plasma damage to a formation surface at the time of sputtering. The proportion of oxygen in the sputtering gas is 30 vol % or higher, preferably 100 vol %.

Here, an In—Ga—Zn-based oxide target is described as an example of the sputtering target. A polycrystalline In—Ga—Zn-based oxide target can be made as the In—Ga—Zn-based oxide target by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that x, y, and z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

After the oxide semiconductor layer 307 having a crystal structure is formed over the buffer layer 305, heat treatment may be performed at a temperature higher than or equal to 900° C. and lower than or equal to 1500° C. in a vacuum atmosphere, a nitrogen atmosphere, an oxygen atmosphere, or a mixed atmosphere of nitrogen and oxygen. With the heat treatment at 900° C. or more and 1500° C. or less, density and crystallinity which are in substantially the same level as those of a single crystal of an oxide semiconductor can be obtained.

In this embodiment, a CAAC-OS film is formed at a substrate temperature of 400° C. using an In—Ga—Zn-based oxide which is formed using a target containing In, Ga, and Zn at an atomic ratio of 1:1:1, and is then subjected to heat treatment at 950° C. Even after the heat treatment, in the oxide semiconductor layer 307, a c-axis is aligned in a direction parallel to a normal vector of a surface where the oxide semiconductor layer is formed or a normal vector of a surface of the oxide semiconductor film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis.

Note that when the buffer layer 305 is exposed to a clean room atmosphere after the formation and then the oxide semiconductor layer is formed, boron contained in the clean room atmosphere might be mixed at the interface between the buffer layer 305 and the oxide semiconductor layer. Thus, it is preferable that the oxide semiconductor layer be formed without exposure of the buffer layer 305 to the atmosphere after the formation. Both of them can be formed by a sputtering method and can be successively formed simply by changing targets.

Next, a resist is formed by a photolithography process over the oxide semiconductor layer, and the oxide semiconductor layer is etched using the resist as a mask. Thus, the island-shaped oxide semiconductor layer 307 is formed. It is preferable that each end portion of the island-shaped oxide semiconductor layer 307 have a tapered cross-sectional shape. Specifically, the end portion has a taper angle θ (see FIG. 15D) of 80° or less, preferably 60° or less, further preferably 45° or less. Note that the taper angle θ refers to an inclination angle formed by the side surface and bottom surface of the layer when the layer is seen from the direction perpendicular to the cross section of the end portion of the layer (i.e., the plane perpendicular to the surface of the substrate). A taper angle smaller than 90° is called forward tapered angle and a taper angle of larger than or equal to 90° is called inverse tapered angle.

Alternatively, the cross-sectional shape of the end portion of the island-shaped oxide semiconductor layer 307 has a plurality of steps, so that the coverage with the layer formed thereon can be improved. The above is not limited to the island-shaped oxide semiconductor layer 307, and by providing a forward taper shape or a step-like shape for a cross section of an end portion of each layer, a phenomenon in that a layer formed over the end portion is separated (disconnection) can be prevented, so that the reliability of the transistor can be improved.

Note that a process in which a resist mask having an appropriate shape is formed over a conductive layer or an insulating layer by a photolithography method is referred to as a photolithography process; in general, after the formation of the resist mask, an etching step and a separation step of the resist mask are performed in many cases. Thus, unless otherwise specified, a photolithography process in this specification includes a step of forming a resist mask, a step of etching a conductive layer or an insulating layer, and a step of removing the resist mask.

Next, a conductive layer is formed over the oxide semiconductor layer 307 by a sputtering method, a CVD method, an evaporation method, or the like, and the first terminal 309 serving as a source electrode, the second terminal 311 serving as a drain electrode, and a wiring or an electrode formed using the same layer as the first terminal 309 and the second terminal 311 are formed by a photolithography process. When the first terminal 309 and the second terminal 311 are formed by a printing method, an inkjet method, or the like, the number of steps can be reduced.

Then, the insulating layer 313 is formed over the oxide semiconductor layer 307, the first terminal 309, and the second terminal 311. In this embodiment, silicon oxide is used for the insulating layer 313.

Next, the gate electrode 315 is formed over the insulating layer 313. After a conductive layer is formed over the insulating layer 313 by a sputtering method, a CVD method, an evaporation method, or the like, the gate electrode 315 and a wiring or an electrode formed using the same layer as the gate electrode 315 are formed by a photolithography process. In this embodiment, a stack of a tantalum nitride film and a tungsten film is used as the conductive layer used for forming the gate electrode 315.

Through the above steps, the transistor 300 including the island-shaped oxide semiconductor layer 307 having a crystal structure for the channel region can be manufactured. Lastly, the transistor 300 is fixed to the heat dissipation plate 301.

Figure 17:
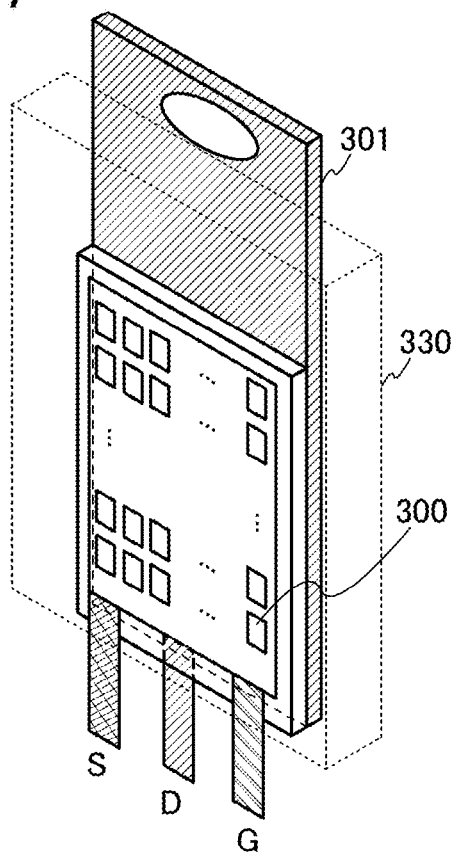
FIG. 17 illustrates an example of a structure of a semiconductor device.

Note that the heat dissipation plate 301 can dissipate more heat when extending to the outside. For example, the heat dissipation plate 301 over which a plurality of transistors 300 are provided is fixed to a housing 330 as illustrated in a perspective view of FIG. 17, and the heat dissipation plate 301 extends to the outside of the housing 330.

The housing 330 can include a terminal S, a terminal D, and a terminal G for connecting the transistor 300 to an external element. The terminal S, the terminal D, and the terminal G are connected to the first terminal 309, the second terminal 311, and the gate electrode 315 of the transistor 300, respectively, for example. Alternatively, the heat dissipation plate 301 can be connected to the terminal S to be used as the terminal S, for example.

Figure 16A:
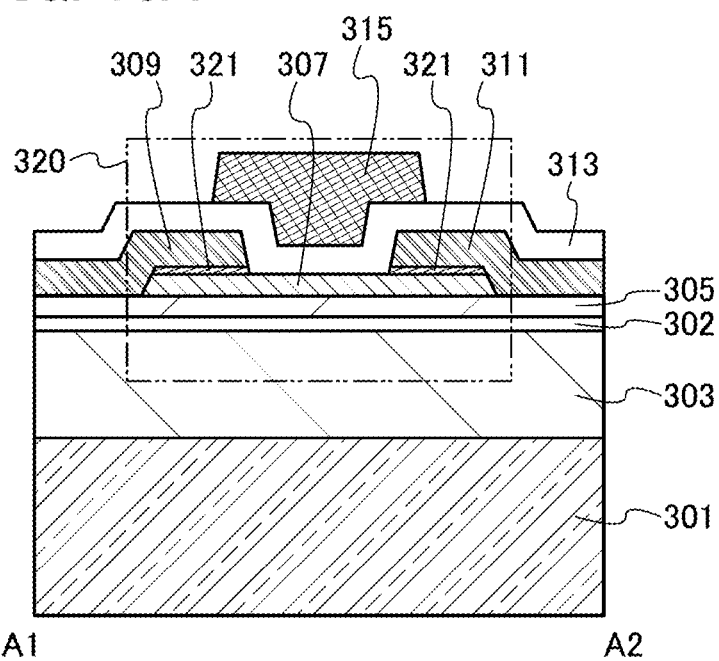
FIGS. 16A and 16B each illustrate an example of a structure of a semiconductor device.

Next, FIG. 16A illustrates an example of a stacked-layer structure of a transistor 320 which includes an n-type region 321 over the oxide semiconductor layer 307.

In the transistor 320 illustrated in FIG. 16A, the n-type regions 321 are oxide semiconductor layers containing phosphorus, boron, or nitrogen and having a crystal structure. Contact resistance is lowered by formation of the n-type regions 321 between the first terminal 309 and the oxide semiconductor layer 307 and between the second terminal 311 and the oxide semiconductor layer 307.

Steps up to the step of forming the buffer layer 305 are the same; thus, steps after the step of forming the buffer layer 305 are described. After the formation of the oxide semiconductor layer having a crystal structure, an impurity element such as phosphorus, boron, or nitrogen is added to a region near a surface of the oxide semiconductor layer by plasma treatment or an ion implantation method. The region to which the impurity element is added tends to be an amorphous region. Note that it is preferable that a crystal part remain under the region to which the impurity element is added. After the impurity element is added, heat treatment is performed at a temperature higher than or equal to 900° C. and lower than or equal to 1500° C. in a vacuum atmosphere, a nitrogen atmosphere, an oxygen atmosphere, or a mixed atmosphere of nitrogen and oxygen. This heat treatment can crystallize the region to which the impurity element is added.

Next, the oxide semiconductor layer to which the impurity element is added is selectively etched by a photolithography process to form the island-shaped oxide semiconductor layer.

After that, a conductive layer which is to be the first terminal 309 and the second terminal 311 is formed and selectively etched by a photolithography process to form the first terminal 309 and the second terminal 311. Then, the region to which the above impurity element is added is selectively removed using the first terminal 309 and the second terminal 311 as masks. Thus, the n-type regions 321 can be formed under the first terminal 309 and the second terminal 311.

Then, the insulating layer 313 is formed over the oxide semiconductor layer 307, the first terminal 309, and the second terminal 311.

Next, the gate electrode 315 is formed over the insulating layer 313. Through the above steps, the transistor 320 including the oxide semiconductor layer 307 having a crystal structure for the channel region can be manufactured.

Figure 16B:
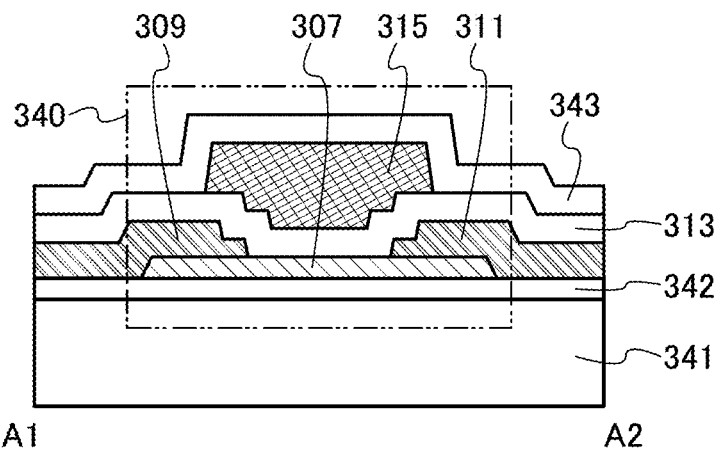

FIG. 16B illustrates an example in which a transistor 340 is formed over a substrate 341. In the transistor 340, the end portions of the first terminal 309 and the second terminal 311 each have a step shape. FIG. 16B is a cross-sectional view illustrating a stacked-layer structure of the transistor 340. Note that description of the part which is the same as that in the transistor 300 or 320 is skipped.

As the substrate 341, a glass substrate; a ceramic substrate; a semiconductor substrate; a plastic substrate which has high heat resistance enough to withstand a process temperature of this manufacturing process; or the like can be used. Typically, in addition to a glass substrate and a ceramic substrate, a plastic substrate or the like with heat resistance which can withstand a process temperature in this manufacturing step can be used. In the case where a substrate does not need a light-transmitting property, a substrate in which an insulating layer is provided over a surface of a substrate of a metal such as a stainless steel alloy may be used. Alternatively, a quartz substrate, a sapphire substrate, or the like can be used. Alternatively, a single crystal semiconductor substrate or a polycrystalline semiconductor substrate made of silicon or silicon carbide, a compound semiconductor substrate made of silicon germanium or the like, an SOI substrate, or the like can be used.

Note that a flexible substrate may also be used as the substrate 341. In the case where a flexible substrate is used, the transistor, the capacitor, or the like may be directly formed over the flexible substrate, or the transistor, the capacitor, or the like may be formed over a manufacturing substrate, and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

An insulating layer 342 is formed over the substrate 341. The island-shaped oxide semiconductor layer 307 is formed over the insulating layer 342. The insulating layer 342 can be formed using a material and a method similar to those of the insulating layer 313.

Next, a conductive layer to be the first terminal 309 and the second terminal 311 is formed, and then, the conductive layer is selectively etched using a resist mask. Next, the resist mask is receded (reduced) by oxygen plasma treatment or the like; after that, dry etching treatment is additionally performed for a short time. As a result, the first terminal 309 and the second terminal 311 the end portions of which have a step shape can be formed.

After the formation of the transistor 340, an insulating layer 343 may be formed to cover the transistor 340. The insulating layer 343 can be formed as a single layer or a stack of layers using any of the following materials: silicon oxide obtained by a plasma CVD method, a sputtering method, or the like; an oxide insulator such as aluminum oxide; a nitride insulator such as silicon nitride or aluminum nitride; an oxynitride insulator such as silicon oxynitride or aluminum oxynitride; a nitride oxide insulator such as silicon nitride oxide; and the like. In the case where an insulating layer 450 is formed as a stack of layers using any of the above materials, the stack of layers may be formed using the same material or may be formed using different materials. For example, an insulating layer in which a silicon nitride film is stacked over a silicon oxynitride film is used as the insulating layer 343.

A nitride insulator is formed to cover the transistor 340, so that entry of an impurity from the outside can be prevented, and release of oxygen from the transistor 340 can be prevented. Accordingly, the reliability of the transistor 340 can be increased.

This embodiment can be implemented combining with another embodiment as appropriate.

Embodiment 3

In this embodiment, as one example of a transistor which can be applied to a power switch or an MCU, an example of a structure of a transistor 350 having a structure different from that of the transistor 300 disclosed in Embodiment 2 will be described with reference to FIGS. 18A to 18C.

In this embodiment, a structure example preferred in the case where the transistor 350 is used for an MCU is described.

Note that the structure and the manufacturing method of a transistor disclosed in Embodiment 2 can be used for a transistor disclosed in this embodiment.

Figure 18A:
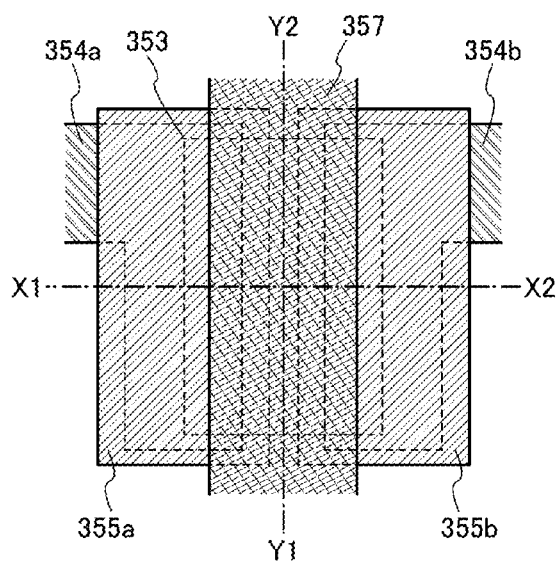
FIGS. 18A to 18C illustrate an example of a structure of a semiconductor device.

FIG. 18A is a top view of the transistor 350. FIG. 18B is a cross-sectional view illustrating a stacked-layer structure of a part taken along dashed-dotted line X1-X2 in FIG. 18A. FIG. 18C is a cross-sectional view illustrating a stacked-layer structure of a part taken along dashed-dotted line Y1-Y2 in FIG. 18A. Note that in FIG. 18A, some components are omitted for easy understanding.

Figure 18C:
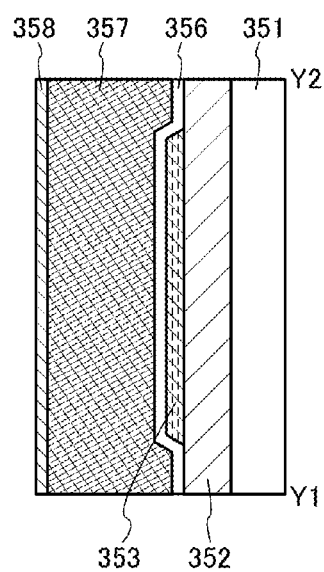
Figure 18B:
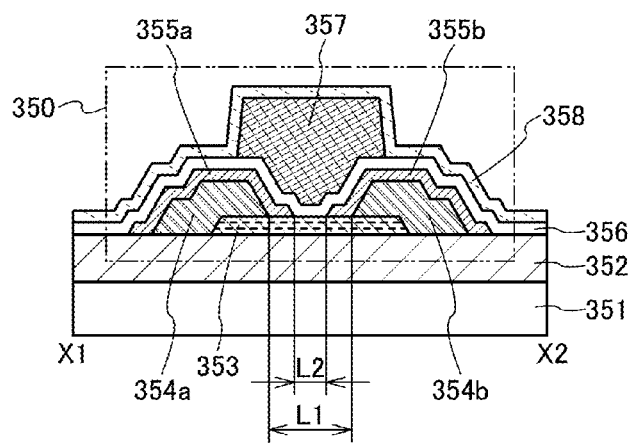

The transistor 350 illustrated in FIGS. 18A to 18C is formed over an insulating layer 352 provided over a substrate 351. The transistor 350 includes an oxide semiconductor layer 353 formed over the insulating layer 352; a first source electrode 354a and a first drain electrode 354b which are in contact with part of the oxide semiconductor layer 353; a second source electrode 355a formed over the first source electrode 354a; a second drain electrode 355b formed over the first drain electrode 354b; a gate insulating layer 356 formed over the oxide semiconductor layer 353, the first source electrode 354a, the first drain electrode 354b, the second source electrode 355a, and the second drain electrode 355b; a gate electrode 357 formed over the gate insulating layer 356; and a protective insulating layer 358 formed over the gate electrode 357 and the gate insulating layer 356. Note that another insulating layer, a wiring, or the like may be formed over the protective insulating layer 358.

The substrate 351 may be a glass substrate, a ceramic substrate, a quartz substrate, a sapphire substrate, or the like. A single crystal semiconductor substrate or a polycrystalline semiconductor substrate made of silicon, silicon carbide, or the like; a compound semiconductor substrate made of silicon germanium or the like; a silicon on insulator (SOI) substrate; a metal substrate such as a stainless steel film; a highly heat-resistance resin substrate such as a polyimide film; or the like can also be used as the substrate 351.

The substrate 351 is not limited to a simple supporting substrate, and may be a substrate where a device such as a transistor is formed. In this case, at least one of a gate electrode 357, the first source electrode 354a, the first drain electrode 354b, the second source electrode 355a, and the second drain electrode 355b in the transistor 350 may be electrically connected to the device.

The insulating layer 352 is preferably formed using an insulating layer containing oxygen. In particular, the insulating layer 352 is preferably formed using an insulating layer containing excess oxygen. The oxide insulating layer having excess oxygen means an oxide insulating layer from which oxygen can be released by heat treatment or the like. The oxide insulating layer is preferably a layer in which the amount of released oxygen is greater than or equal to $1.0 \times 10^{19}$ atoms/cm$^3$ in thermal desorption spectroscopy on an oxygen atom basis. Oxygen released from the insulating layer 352 can be diffused into the channel formation region of the oxide semiconductor layer 353; therefore, oxygen vacancies which are unintentionally formed in the oxide semiconductor layer 353 can be filled with oxygen. Accordingly, stable electrical characteristics of a transistor can be obtained.

The insulating layer 352 can be formed by a plasma CVD (chemical vapor deposition) method, a sputtering method, or the like, using an oxide material such as silicon oxide, aluminum oxide, magnesium oxide, silicon oxynitride, silicon nitride oxide, gallium oxide, germanium oxide, yttrium oxide, zirconium oxide, lanthanum oxide, neodymium oxide, hafnium oxide, or tantalum oxide, or a mixed material thereof.

A layer having a high barrier property against alkali metal, hydrogen, or oxygen may be formed between the substrate 351 and the insulating layer 352. Forming a layer having a high barrier property between the substrate 351 and the insulating layer 352, the substrate 351 can prevent entry of impurities from the substrate 351 and release of oxygen from the oxide semiconductor layer 353. Therefore, reliability of the transistor can be improved.

The insulating layer 352 is in contact with the oxide semiconductor layer 353; therefore, oxygen can be directly supplied to the oxide semiconductor layer 353 from the lower side. In addition, the insulating layer 352 is provided to be in contact with the gate insulating layer 356; therefore, oxygen can be supplied to the oxide semiconductor layer 353 from the upper side through the gate insulating layer 356. Specifically, oxygen released from the insulating layer 352 can be supplied to the channel formation region of the oxide semiconductor layer 353 through the gate insulating layer 356 in regions on the outer side than the second source electrode 355a (the left side in FIG. 18B) and the outer side than the second drain electrode 355b (the right side in FIG. 18B). That is, the transistor 350 has a structure where part of the insulating layer 352 and part of the gate insulating layer 356 are in contact with each other in the regions on the outer sides than the second source electrode 355a and the second drain electrode 355b.

In other words, the gate insulating layer 356 is sandwiched between the second source electrode 355a and the protective insulating layer 358 and between the second drain electrode 355b and the protective insulating layer 358 so that oxygen released from the insulating layer 352 is diffused into the channel of the oxide semiconductor layer 353. A material where oxygen is diffused as little as possible is used for the second source electrode 355a, the second drain electrode 355b, and the protective insulating layer 358. Accordingly, when oxygen is diffused into the oxide semiconductor layer through the gate insulating layer, oxygen can be prevented from being diffused into the source electrode and drain electrode.

Note that in the case where the substrate 351 is a substrate for which another device is provided, the insulating layer 352 also functions as an interlayer insulating layer. In that case, planarization treatment such as chemical mechanical polishing (CMP) treatment is preferably performed so that an oxide insulating layer 104 has a flat surface.

Note that the oxide semiconductor layer 353 can be formed using the same material as the oxide semiconductor layer 307 shown in Embodiment 2.

In order to obtain a transistor having stable electrical characteristics, where a channel is the oxide semiconductor layer, it is effective to make the oxide semiconductor layer intrinsic or substantially intrinsic by reducing the concentration of impurities in the oxide semiconductor layer. Note that a substantially intrinsic oxide semiconductor layer means an oxide semiconductor layer with a carrier density of lower than $1 \times 10^{17}$/cm$^3$, preferably lower than $1 \times 10^{15}$/cm$^3$ or lower, more preferably lower than $1 \times 10^{13}$/cm$^3$.

In the oxide semiconductor layer, a metal element other than hydrogen, nitrogen, carbon, silicon, and a main component becomes an impurity. For example, hydrogen and nitrogen in the oxide semiconductor layer form donor levels, which increase carrier density. Silicon forms an impurity state in the oxide semiconductor layer. In some cases, the impurity state becomes a trap, which degrades electrical characteristics of the transistor.

In order to make the oxide semiconductor layer intrinsic or substantially intrinsic, in analysis by SIMS, the concentration of silicon is set to be lower than or equal to lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen is set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen, can be set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Note that in the case where the oxide semiconductor layer contains crystal, when silicon and carbon are contained at a high concentration, the crystallinity of the oxide semiconductor layer is lowered in some cases. In order not to lower the crystallinity of the oxide semiconductor layer, the concentration of silicon is set to be lower than $1\times10^{19}$ atoms/cm$^3$, preferably lower than $5\times10^{18}$ atoms/cm$^3$, more preferably lower than $1\times10^{18}$ atoms/cm$^3$. Moreover, the concentration of carbon can be set to be lower than $1\times10^{19}$ atoms/cm$^3$, preferably lower than $5\times10^{18}$ atoms/cm$^3$, more preferably lower than $1\times10^{18}$ atoms/cm$^3$.

A transistor where an oxide semiconductor highly purified as described above is used for a channel formation region shows extremely low off-state current. The off-state current per micrometer of channel width can be reduced to several zepto amperes (zA) to several yocto amperes (yA).

Reducing density of localized states of an oxide semiconductor used for the oxide semiconductor layer 353 enables a transistor including the oxide semiconductor layer 353 to show stable electrical characteristics. In order that the transistor shows stable electrical characteristics, the absorption coefficient due to the density of the localized state of the oxide semiconductor layer 353 measured by CPM is preferably lower than $1\times10^{-3}$ cm$^{-1}$, more preferably lower than $3\times10^{-4}$ cm$^{-1}$.

For the first source electrode 354a and the first drain electrode 354b, a conductive material which easily reacts with oxygen can be used. For example, Al, Cr, Cu, Ta, Ti, Mo, and W can be used. It is particularly preferable to use W having a high melting point because the temperature in a later process can be relatively high. Note that a conductive material which easily reacts with oxygen includes a material where oxygen is easily diffused.

When a conductive material which easily reacts with oxygen is in contact with an oxide semiconductor layer, a phenomenon where oxygen in the oxide semiconductor layer is diffused into the conductive material which easily reacts with oxygen occurs. By the phenomenon, oxygen vacancies occur in regions around parts of the oxide semiconductor layer which are in contact with the source electrode and the drain electrode; accordingly, the regions become n-type regions. The n-type regions can function as a source and a drain of the transistor.

However, when a transistor having a very short channel length is formed, the region which becomes n-type by the occurrence of oxygen vacancies might extend in a direction of the channel length of the transistor. In this case, as electrical characteristics of the transistor, shift in threshold voltage or a state where switching cannot be controlled by gate voltage (conductive state) occurs. Therefore, when a transistor having a very short channel length is formed, it is not preferable that a conductive material which easily reacts with oxygen is used for a source electrode and a drain electrode.

For this reason, a gap between the first source electrode 354a and the first drain electrode 354b shown as L1 in FIG. 18B is 0.8 μm or longer, preferably, 1.0 μm or longer. When L1 is shorter than 0.8 μm, it is possible that an adverse effect of oxygen vacancies generated in the channel formation region cannot be prevented and electrical characteristics of the transistor are degraded.

In one embodiment of the present invention, the second source electrode 355a is formed using a conductive material which does not easily react with oxygen to be in contact with the first source electrode 354a and the oxide semiconductor layer 353. In addition, the second drain electrode 355b is formed using a conductive material which does not easily react with oxygen to be in contact with the first drain electrode 354b and the oxide semiconductor layer 353.

The second source electrode 355a extends in a direction of L1 beyond an end portion of the first source electrode 354a in contact with the oxide semiconductor layer 353. The second drain electrode 355b extends in the direction of L1 beyond an end portion of the first drain electrode 354b in contact with the oxide semiconductor layer 353.

The extended portion of the second source electrode 355a and the extended portion of the second drain electrode 355b are in contact with the oxide semiconductor layer 353. In the transistor 350 illustrated in FIGS. 18A to 18C, a distance between an end portion of the extended portion of the second source electrode 355a, the end portion being in contact with the oxide semiconductor layer 353 and an end portion of the extended portion of the second drain electrode 355b, the end portion being in contact with the oxide semiconductor layer 353 corresponds to the channel length. The channel length is shown as L2 in FIG. 18B.

As a conductive material which does not easily react with oxygen and which is used to form the second source electrode 355a and the second drain electrode 355b, for example, a conductive nitride such as tantalum nitride or titanium nitride, or ruthenium is preferably used. Note that a conductive material which does not easily react with oxygen includes a material where oxygen is not diffused easily.

By using the conductive material which does not easily react with oxygen for the second source electrode 355a and the second drain electrode 355b, oxygen vacancies can be prevented from being generated in a channel formation region formed in the oxide semiconductor layer 353; thus, the channel can be prevented from being an n-type channel. Therefore, even when the channel length of a transistor is very short, the transistor can show favorable electrical characteristics. That is, L2 can be smaller than L1; for example, even when L2 is 30 nm or shorter, the transistor can show favorable electrical characteristics.

Note that when the source electrode and the drain electrode are formed by using only the conductive material which does not easily react with oxygen, the contact resistance to the oxide semiconductor layer 353 is excessively high. Therefore, as illustrated in FIGS. 18A to 18C, it is preferable that the first source electrode 354a and the first drain electrode 354b are formed over the oxide semiconductor layer 353 and the second source electrode 355a and the second drain electrode 355b are formed to cover the first source electrode 354a and the first drain electrode 354b.

In this case, it is preferable that contact areas of the first source electrode 354a and the first drain electrode 354b with the oxide semiconductor layer 353 are made to be large and contact resistance is reduced by a region which becomes an n-type region due to generation of oxygen vacancies. It is preferable that contact areas of the second source electrode 355a and the second drain electrode 355b with the oxide semiconductor layer 353 are made to be small. When the contact resistance of the second source electrode 355a and the second drain electrode 355b with the oxide semiconductor layer 353 is large, electrical characteristics of the transistor are degraded in some cases.

By using a conductive material which does not easily react with oxygen for the second source electrode 355a and the second drain electrode 355b, oxygen is hardly diffused into the second source electrode 355a and the second drain electrode 355b when oxygen is supplied to the oxide semiconductor layer 353 from the upper side from the insulating layer 352 through the gate insulating layer 356; thus, oxygen can be favorably supplied to the oxide semiconductor layer 353.

The gate insulating layer 356 can be formed using a material similar to that of the insulating layer 313 described in Embodiment 2.

The gate electrode 357 can be formed using a material similar to that of the gate electrode 315 described in Embodiment 2.

For the protective insulating layer 358, a material where oxygen does not diffused easily is preferably used. For the protective insulating layer 358, a material which has a low hydrogen content in a layer is preferably used. The hydrogen content of the protective insulating layer 358 is preferably less than $5\times10^{19}$ cm$^{-3}$, more preferably less than $5\times10^{18}$ cm$^{-3}$. When the hydrogen content of the protective insulating layer 358 is set in the above range, off-state current of the transistor can be low. For example, as the protective insulating layer 358, silicon nitride or silicon nitride oxide can be used. The protective insulating layer 358 can be formed by a CVD method, an MBE method, an ALD method, or a PLD method. In particular, silicon nitride formed by a sputtering method is preferably used for the protective insulating layer 358 because the water and hydrogen content of such silicon nitride is low.

In the transistor 350 described in this embodiment, oxygen vacancies in the oxide semiconductor layer 353 are prevented from being increased. In particular, in the transistor 350, oxygen can be supplied to the oxide semiconductor layer 353 from the gate insulating layer 356 and the insulating layer 352 which is in contact with the oxide semiconductor layer 353. Therefore, a semiconductor device showing favorable electrical characteristics and high long-term reliability can be provided.

One example of the manufacturing method of the transistor 350 illustrated in FIGS. 18A to 18C will be described below.

First, as the insulating layer 352, silicon oxynitride is formed over the substrate 351 by a plasma CVD method. Note that oxygen may be added to the insulating layer 352 by an ion implantation method, an ion doping method, a plasma immersion ion implantation method, or the like. Adding oxygen enables the insulating layer 352 to contain further excess oxygen.

Next, the oxide semiconductor layer 353 is formed over the insulating layer 352. In this embodiment, an oxide semiconductor layer having a three-layer structure is formed in the following manner. By a sputtering method, In—Ga—Zn-based oxide which is formed using a target containing In, Ga, and Zn at an atomic ratio of 1:3:2 is formed over the insulating layer 352; then, In—Ga—Zn-based oxide which is formed using a target containing In, Ga, and Zn at an atomic ratio of 1:1:1 is stacked thereover; after that, In—Ga—Zn-based oxide which is formed using a target containing In, Ga, and Zn at an atomic ratio of 1:3:2 is formed thereover. Then, the oxide semiconductor layer is selectively etched by a photolithography process to form the island-shaped oxide semiconductor layer 353.

Next, heat treatment is preferably performed. The first heat treatment may be performed at 250° C. or higher and 650° C. or lower, preferably 300° C. or higher and 500° C. or lower in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor layer 353 can be improved, and in addition, impurities such as hydrogen and water can be removed from the oxide insulating layer 104 and the oxide semiconductor layer 353. Note that the first heat treatment may be performed before the oxide semiconductor is processed into the island-shaped oxide semiconductor layer 353.

Next, tungsten having a thickness of 100 nm is formed over the oxide semiconductor layer 353 by a sputtering method and processed by a photolithography process, whereby the first source electrode 354a and the first drain electrode 354b are formed.

Next, tantalum nitride having a thickness of 20 nm is formed and processed by a photolithography process, whereby the second source electrode 355a and the second drain electrode 355b are formed.

Note that when a transistor having a very short channel length is formed, the second source electrode 355a and the second drain electrode 355b may be formed in such a manner that a resist mask is formed by a method suitable for thin line processing, such as an electron beam exposure, and then etching treatment is performed. Note that in the case of using a positive resist as the resist mask, an exposed region can be minimized and throughput can be improved. With such a method, a transistor having a channel length of 30 nm or shorter can be formed.

Next, second heat treatment is preferably performed. The second heat treatment can be performed in a similar condition to the first heat treatment. By the second heat treatment, impurities such as hydrogen and water can be further removed from the oxide semiconductor layer 353.

Next, the gate insulating layer 356 is formed over the insulating layer 352, the oxide semiconductor layer 353, the second source electrode 355a, and the second drain electrode 355b. In this embodiment, as the gate insulating layer 356, silicon oxynitride is formed by a plasma CVD method.

It is preferable that the gate insulating layer 356 is successively subjected to heat treatment after the formation of the gate insulating layer 356. For example, the gate insulating layer 356 is formed in a plasma CVD apparatus and is subsequently subjected to heat treatment in a vacuum. The heat treatment can remove hydrogen, moisture, and the like from the gate insulating layer 356. By performing the heat treatment, the dense gate insulating layer 356 which is dehydrated or dehydrogenerated can be formed.

Then, a conductive layer to be the gate electrode 357 is formed over the gate insulating layer 356 and the gate electrode 357 is formed by a photolithography process. In this embodiment, as a conductive layer functioning as the gate electrode 357, tungsten deposited by a sputtering method is used.

Then, the protective insulating layer 358 is formed over the gate insulating layer 356 and the gate electrode 357. In this embodiment, silicon nitride is formed by a sputtering method as the protective insulating layer 358.

Next, third heat treatment is preferably performed. The third heat treatment can be performed in a similar condition to the first heat treatment. By the third heat treatment, release of oxygen from the insulating layer 352 and the gate insulating layer 356 becomes easy, and oxygen vacancies in the oxide semiconductor layer 353 can be reduced.

Through the above steps, the transistor 350 can be formed. Note that the structure and the manufacturing method of the transistor disclosed in Embodiment 2 can be applied to the transistor disclosed in this embodiment.

Note that when the transistor 350 is used as a power MOSFET, a function of dissipating more heat generated in the transistor 350 to outside needs to be increased. The structure where the transistor 350 is used as a power MOSFET can be obtained by replacing the transistor 300 in FIG. 17 with the transistor 350.

This embodiment can be implemented combining with another embodiment as appropriate.

Embodiment 4

In this embodiment, an example of a structure of a semiconductor device which can be applied to an MCU using a nonvolatile memory unit will be described with reference to a cross-sectional view of FIG. 19.

Figure 19:
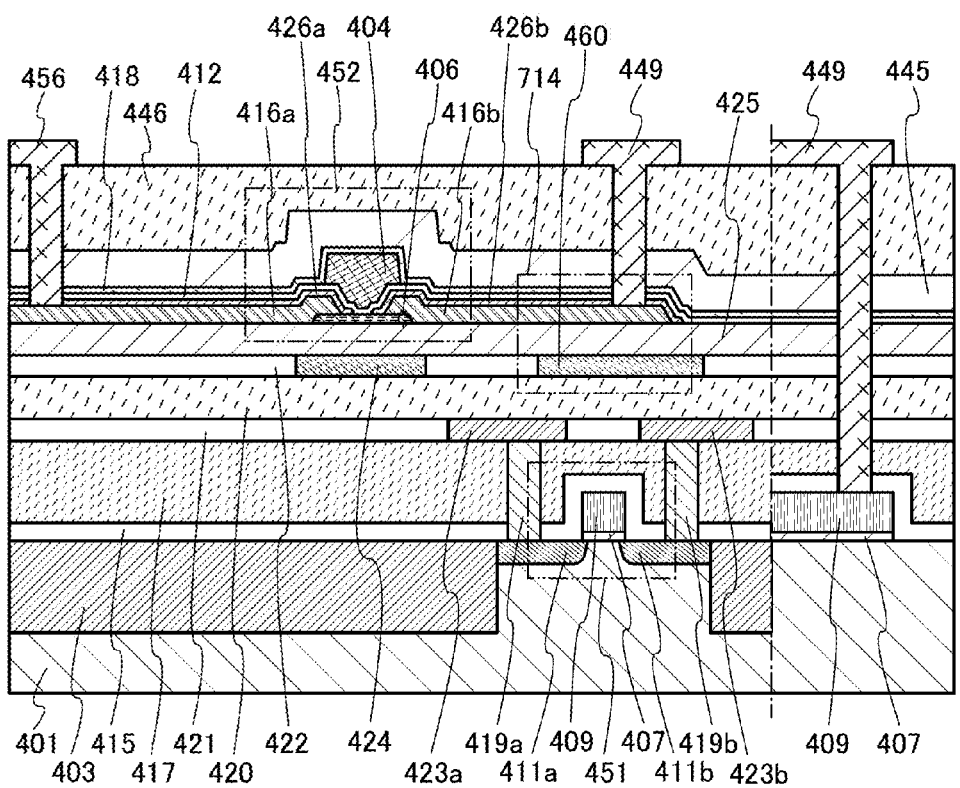
FIG. 19 illustrates an example of a structure of a semiconductor device.

A semiconductor device illustrated in FIG. 19 includes an element separation layer 403 and an n-channel transistor 451. The element separation layer 403 is formed in a p-type semiconductor substrate 401. The n-channel transistor 451 includes a gate insulating layer 407, a gate electrode 409, an n-type impurity region 411a, and an n-type impurity region 411b. An insulating layer 415 and an insulating layer 417 are provided over the transistor 451.

In the semiconductor substrate 401, the transistor 451 is separated from other semiconductor elements (not illustrated) by the element separation layer 403. The element separation layer 403 can be formed by a local oxidation of silicon (LOCOS) method, a shallow trench isolation (STI) method, or the like.

Note that in the transistor 451, sidewall insulating layers may be formed on side surfaces of the gate electrode 409, and a region whose impurity concentration is different from those of the n-type impurity region 411a and the n-type impurity region 411b may be provided in the n-type impurity region 411a and the n-type impurity region 411b.

In openings formed by selectively etching parts of the insulating layer 415 and the insulating layer 417, a contact plug 419a and a contact plug 419b are formed. An insulating layer 421 is provided over the insulating layer 417, the contact plug 419a, and the contact plug 419b. The insulating layer 421 includes a groove portion at least partly overlapping the contact plug 419a and a groove portion at least partly overlapping the contact plug 419b.

A wiring 423a is formed in the groove portion at least partly overlapping the contact plug 419a. A wiring 423b is formed in the groove portion at least partly overlapping the contact plug 419b. The wiring 423a is connected to the contact plug 419a. The wiring 423b is connected to the contact plug 419b.

An insulating layer 420 formed by a sputtering method, a CVD method, or the like is provided over the insulating layer 421, the wiring 423a, and the wiring 423b. Further, an insulating layer 422 is formed over the insulating layer 420. The insulating layer 422 includes a groove portion at least partly overlapping an oxide semiconductor layer 406 and a groove portion at least partly overlapping a first drain electrode 416b or a second drain electrode 426b.

An electrode 424 functioning as a back gate electrode of a transistor 452 is formed in the groove portion at least partly overlapping the oxide semiconductor layer 406, which is included in the insulating layer 422. By providing the electrode 424, threshold voltage of the transistor 452 can be controlled.

An electrode 460 is formed in the groove portion at least partly overlapping the first drain electrode 416b or the second drain electrode 426b, which is included in the insulating layer 422.

An oxide insulating layer 425 formed by a sputtering method, a CVD method, or the like is provided over the insulating layer 422, the electrode 424, and the electrode 460. The transistor 452 is provided over the oxide insulating layer 425.

In this embodiment, the case where a transistor having a structure similar to that of the transistor 350 described in the above embodiment is used as the transistor 452 will be described as an example.

The transistor 452 includes the oxide semiconductor layer 406 formed over the oxide insulating layer 425; a first source electrode 416a and the first drain electrode 416b which are in contact with the oxide semiconductor layer 406; a second source electrode 426a which is in contact with the upper surface of the first source electrode 416a; the second drain electrode 426b which is in contact with the upper surface of the first drain electrode 416b; a gate insulating layer 412; a gate electrode 404; and a protective insulating layer 418. In addition, an insulating layer 445 and an insulating layer 446 which cover the transistor 452 are provided. Over the insulating layer 446, a wiring 449 which is connected to the first drain electrode 416b and a wiring 456 which is connected to the first source electrode 416a are provided. The wiring 449 functions as a node at which the drain electrode of the transistor 452 is electrically connected to the gate electrode 409 of the n-channel transistor 451.

In this embodiment, the structure where the wiring 449 is connected to the first drain electrode 416b is shown; however, the structure is not limited thereto. For example, the wiring 449 may be connected to the second drain electrode 426b. Further, the structure where the wiring 456 is connected to the first source electrode 416a is shown; however, the structure is not limited thereto. For example, the wiring 456 may be connected to the second source electrode 426a.

A part where the first drain electrode 416b and the electrode 460 overlap with the oxide insulating layer 425 laid therebetween or a part where the second drain electrode 426b and the electrode 460 overlap with the oxide insulating layer 425 laid therebetween functions as a capacitor 714. For example, $V_{SS}$ is supplied to the electrode 460.

Note that the capacitor 714 is not necessarily provided. For example, in the case where parasitic capacitance of the n-channel transistor 451 or the like is sufficiently large, a structure without the capacitor 714 may be employed.

The transistor 452 corresponds to the transistor 240 illustrated in FIG. 14, for example. The transistor 451 corresponds to the transistor 242 illustrated in FIG. 14, for example. The capacitor 714 corresponds to the capacitor 241 illustrated in FIG. 14, for example. The wiring 449 corresponds to the node M1 illustrated in FIG. 14, for example.

Here, the transistor 451 is formed using a semiconductor other than an oxide semiconductor, such as single crystal silicon, so that the transistor can operate at a sufficiently high speed. Thus, when the transistor is used as a reading transistor, information can be read at a high speed.

As described in this embodiment, the transistor 452 is preferably a transistor showing an extremely low off-state current. In this embodiment, a transistor including an oxide semiconductor is described as an example of a transistor showing an extremely low off-state current. With such a structure, the potential of the node M1 can be held for a long time.

This embodiment can be implemented combining with another embodiment as appropriate.

Embodiment 5

In this embodiment, an application example of a central control system disclosed in the above embodiments will be described. FIG. 20A is a floor-plan of a house 800 employing a central control system of one embodiment of the present invention. The house 800 illustrated in FIG. 20A includes a bed room 801, a Western-style room 802, a laundry room 803, a bathroom 804, a toilet 805, an entrance 806, a corridor 807, a Japanese-style room 808, a living room 809, and a kitchen 810. The laundry room 803 includes a washstand 839. The kitchen 810 includes a cooking stove 838.

FIG. 20A illustrates an air conditioning device 831, an audio device 832, a washing machine 834, a bathroom control device 835, a refrigerator 836, and a dish washer 837, as examples of the electric device 200. In addition, as the electric device 200, devices which can be electronically controlled, such as a microwave oven, an intercom, a rice cooker, and an electric pot can be given.

As examples of the sensor device 610, FIG. 20A illustrates a fire alarm 841, a human detection sensor 842, a proximity switch 843, a vibration sensor 844, a radiation sensor 845, a surveillance camera 846, an electricity meter 851, a water meter 852, and a gas meter 853. By the radiation sensor 845, the amount of outside radiation can be measured.

The electric devices 200 and the sensor devices 610 each have a unique identifier (IP address or the like) and are connected to the central control device 120 by wired communication or wireless communication. The central control device 120 has a function of always or regularly monitoring the electric devices 200 and the sensor devices 610 to determine operation information. The central control device 120 can control operations of the electric devices 200 and the sensor devices 610 by communicating with the electric devices 200 and the sensor devices 610. In addition, by communicating with the electric devices 200 and the sensor devices 610, the central control device 120 can control power source switches of the electric devices 200 and the sensor devices 610 to determine whether or not the electric devices 200 and the sensor devices 610 operate.

Further, transistors which have an active layer using a semiconductor with wide band gap and which are disclosed in the above embodiments are used for the electric devices 200 and the sensor devices 610, so that the electric devices 200 and the sensor devices 610 having low power consumption can be obtained. Power consumption of the whole of the house 800 can be reduced.

The central control device 120 is connected to a portable information terminal 830 by telephone line and the Internet connection, and the central control device 120 transmits and receives information to and from the portable information terminal 830. For example, lighting or shutoff of lighting device (not illustrated in FIG. 20A) can be controlled from the outside. When the human detection sensor 842 installed outside reacts, a video taken with the surveillance camera 846 can be output to a display device 821 or the portable information terminal 830 to be displayed.

For example, the washing machine 834 transmits information on the completion of washing to the central control device 120 when washing is finished. The central control device 120 performs arithmetic processing on operation information transmitted from the washing machine 834 and can transmit information obtained by the arithmetic processing to the portable information terminal 830 (see FIG. 20B). Alternatively, the central control device 120 can transmit the information obtained by arithmetic processing to the display device 821 which is one of output units and then can output the information from the display device 821 (see FIG. 20C). The central control device 120 receives an instruction from the portable information terminal 830 and can drive the washing machine 834. That is, the central control device 120 can remortly control the electric device 200 by using the portable information terminal 830.

In this manner, the central control device 120 can monitor the electric device 200 and the sensor device 610, perform arithmetic processing on information obtained from the electric device 200 and the sensor device 610, and output information obtained by arithmetic processing from the display device 821 which is one of output units. Further, not limited to the display device 821, the central control device 120 can output the information obtained by arithmetic processing to an output unit such as a sound device 822, a light-emitting device 823, a vibration device 824, or a perfuming device 825.

Note that in this embodiment, an example of the structure where the central control device 120, the display device 821, the sound device 822, the light-emitting device 823, the vibration device 824, and the perfuming device 825 are individually provided is described. However, the central control device 120 may be provided with any one or all of the functions of the display device 821, the sound device 822, the light-emitting device 823, the vibration device 824, and the perfuming device 825.

For example, a television may be also used as the display device 821. The audio device 832 may be also used as the sound device 822. A room light may be also used as the light-emitting device 823. In this embodiment, an example where a television is also used as the display device 821 is described.

When the MCU including a nonvolatile memory unit disclosed in the above embodiment is used for the central control device 120, intermittent operation where operation and suspension are performed at regular intervals can be easily achieved, so that power consumption of the central control device 120 can be reduced.

When the MCU including a nonvolatile memory unit disclosed in the above embodiment is used for the sensor device 610, intermittent operation where operation and suspension are performed at regular intervals can be easily achieved, so that power consumption of the sensor device 610 can be reduced.

Figure 21A:
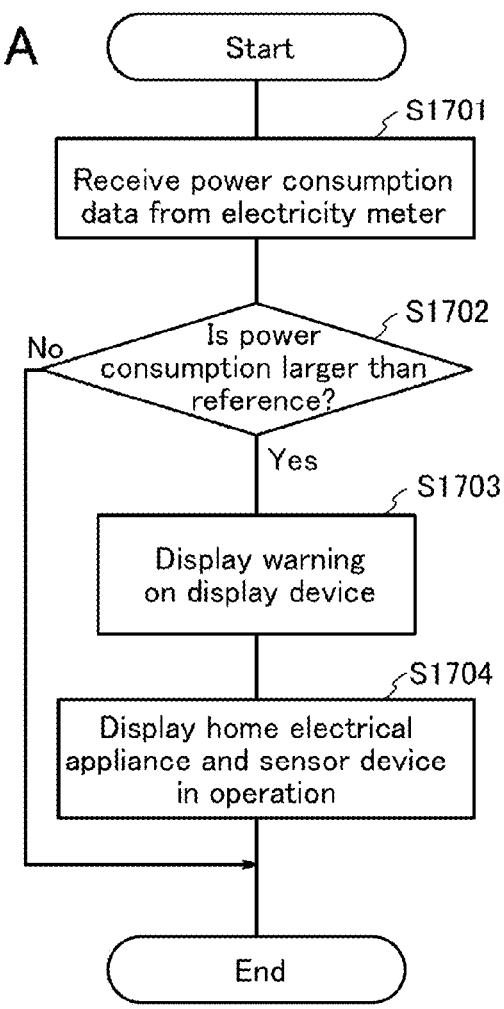
FIGS. 21A and 21B illustrate an example of an operation of a central control system.

Next, as one example of the central control system of one embodiment of the present invention, an usage example of the central control device 120 for reducing power consumption of the house 800 will be described with reference to a flow chart of FIG. 21A. The electricity meter 851 included in the house 800 measures power consumption of the whole of the house 800. The central control device 120 always or regularly communicates with the electricity meter 851 and receives power consumption data of the house 800 which is measured by the electricity meter 851 (step S1701). Next, the central control device 120 performs arithmetic processing so that power consumption data (power consumption value) of the house 800 is compared with a reference power consumption value to determine whether or not power consumption data of the house 800 is larger than the reference power consumption value (step S1702).

Figure 21B:
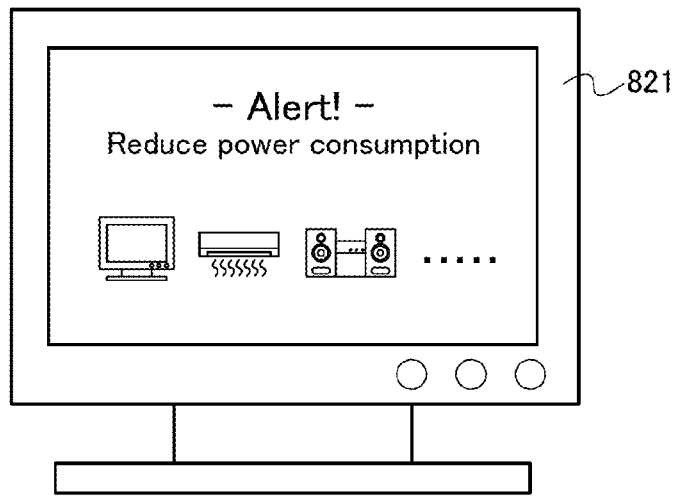

When the results of the arithmetic processing show that power consumption value of the house 800 is larger than the reference power consumption value, the central control device 120 makes the display device 821 display a warning for encouraging power saving (step S1703). FIG. 21B illustrates one example of display of a warning which is displayed on the display device 821. In FIG. 21B, an electric device in operation are displayed as well as display of a warning (step S1704). When the electric device in operation is displayed, an actual power consumption value may be also displayed.

For example, preset temperature of the air conditioning device 831 is controlled, the electric device 200 and the sensor device 610 which do not need to operate are stopped, or the like in accordance with a warning from the central control device 120, so that power consumption of the whole of the house 800 can be reduced.

Further, by replacing the electricity meter 851 described above with the water meter 852 or the gas meter 853, the usage amount of water or gas can be reduced.

Next, another application example of the central control system of one embodiment of the present invention will be described with reference to FIGS. 22A to 22C. The fire alarm 841 in the toilet 805 detects fire, the fire alarm 841 transmits the IP address of the central control device 120 and information on occurrence of fire (see FIG. 22A). When the central control device 120 receives the information, the central control device 120 performs arithmetic processing in which device information stored in the memory unit 124 and the IP address are compared, identifies a place where fire occurs, and makes the display device 821 display information for indicating the occurrence of fire and a place where fire occurs (see FIG. 22C). Further, the central control device 120 transmits the information for indicating the occurrence of fire and a place where fire occurs to the portable information terminal 830 and can make the portable information terminal 830 display the information (see FIG. 22B). The central control device 120 can report the occurrence of fire to a fire station when the central control device 120 receives an instruction of the portable information terminal 830.

Note that in general, fire alarms include a heat detector and a smoke detector. Initial fire generates smoke, and therefore, a smoke detector is suitable to detect fire early and thus preferable. Note that in the place where a fire alarm is possibly exposed to a large amount of smoke or water vapor, for example the kitchen 810, a heat detector is preferably installed.

The central control device 120 can indicate by voice or an audible alert the occurrence of fire with the sound device 822. With a light-emitting device, the occurrence of fire can be indicated by lighting or flashing of light. For example, a bed 833 can be vibrated to indicate the occurrence of fire with the vibration device 824 installed on the bed 833 even when a resident sleeps.

Figure 23:
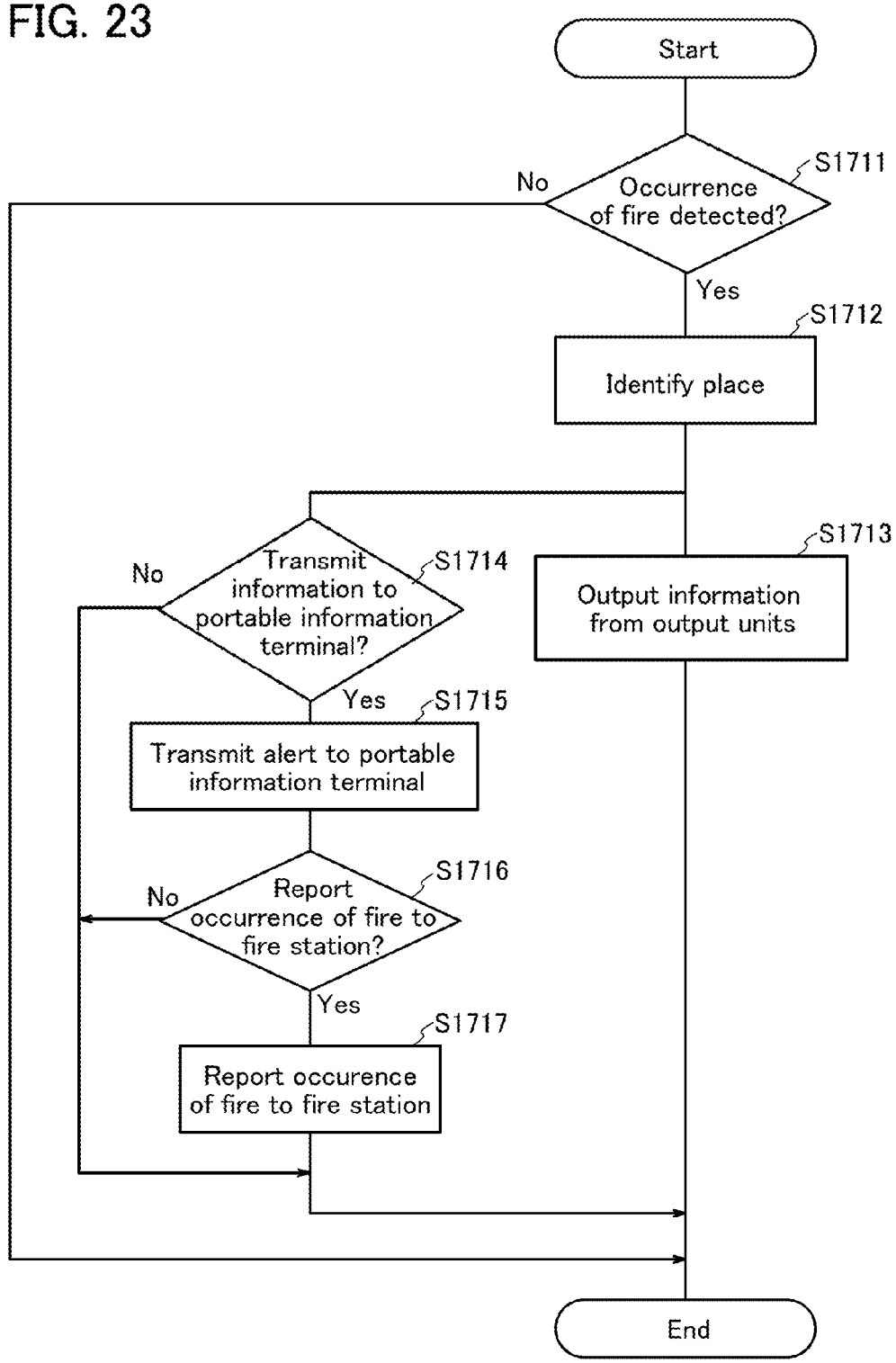
FIG. 23 illustrates an example of an operation of a central control system.

An operation example of the central control device 120 will be described with reference to a flow chart of FIG. 23. The central control device 120 always or regularly confirms whether or not the fire alarm 841 detects the occurrence of fire (step S1711). When a signal showing detection of fire is transmitted from the fire alarm 841 to the central control device 120, the central control device 120 identifies a place where fire occurs on the basis of the IP address of the fire alarm 841 which detects fire (step S1712). Next, at least one of a display device, a sound device, a light-emitting device, a vibration device, and a perfuming device which are output units is made to operate, and the operating output unit output(s) a fire alert and information on a place where fire occurs (step S1713).

When the central control device 120 detects some abnormalities, the central control device 120 can transmit the information to the portable information terminal 830 (step S1714). Here, the central control device 120 transmits a fire alert and the information on a place where fire occurs to the portable information terminal 830 (step S1715).

The central control device 120 can report the occurrence of fire to a fire station when the central control device 120 receives an instruction of reporting the occurrence of fire to a fire station from the portable information terminal 830 (steps S1716 and S1717). Note that the central control device 120 can report the occurrence of fire to a fire station as soon as detecting fire before receiving an instruction from the portable information terminal 830.

A resident easily recognizes a place where fire occurs, which enables quick start of initial firefighting and makes selection of the evacuation route easy. Therefore, one embodiment of the present invention can minimize damage due to disaster.

To detect fire by the fire alarm 841, the fire alarm 841 is not needed to always operate, but may operate every second to minute. For example, when the fire alarm 841 operates one second every ten seconds, power consumption of the fire alarm 841 can be reduced to one tenth. When the MCU including a nonvolatile memory unit disclosed in the above embodiment is used for the fire alarm 841, intermittent operation where operation and suspension are performed at regular intervals can be easily achieved, so that power consumption of the fire alarm 841 can be reduced.

Next, another application example of the central control system of one embodiment of the present invention will be described with reference to FIGS. 24A to 24C. The central control device 120 can detect closing and opening of a window by monitoring the proximity switch 843 installed on the window. The central control device 120 can detect abnormal vibration or destruction of a window by monitoring the vibration sensor 844 installed on the window.

Figure 24:
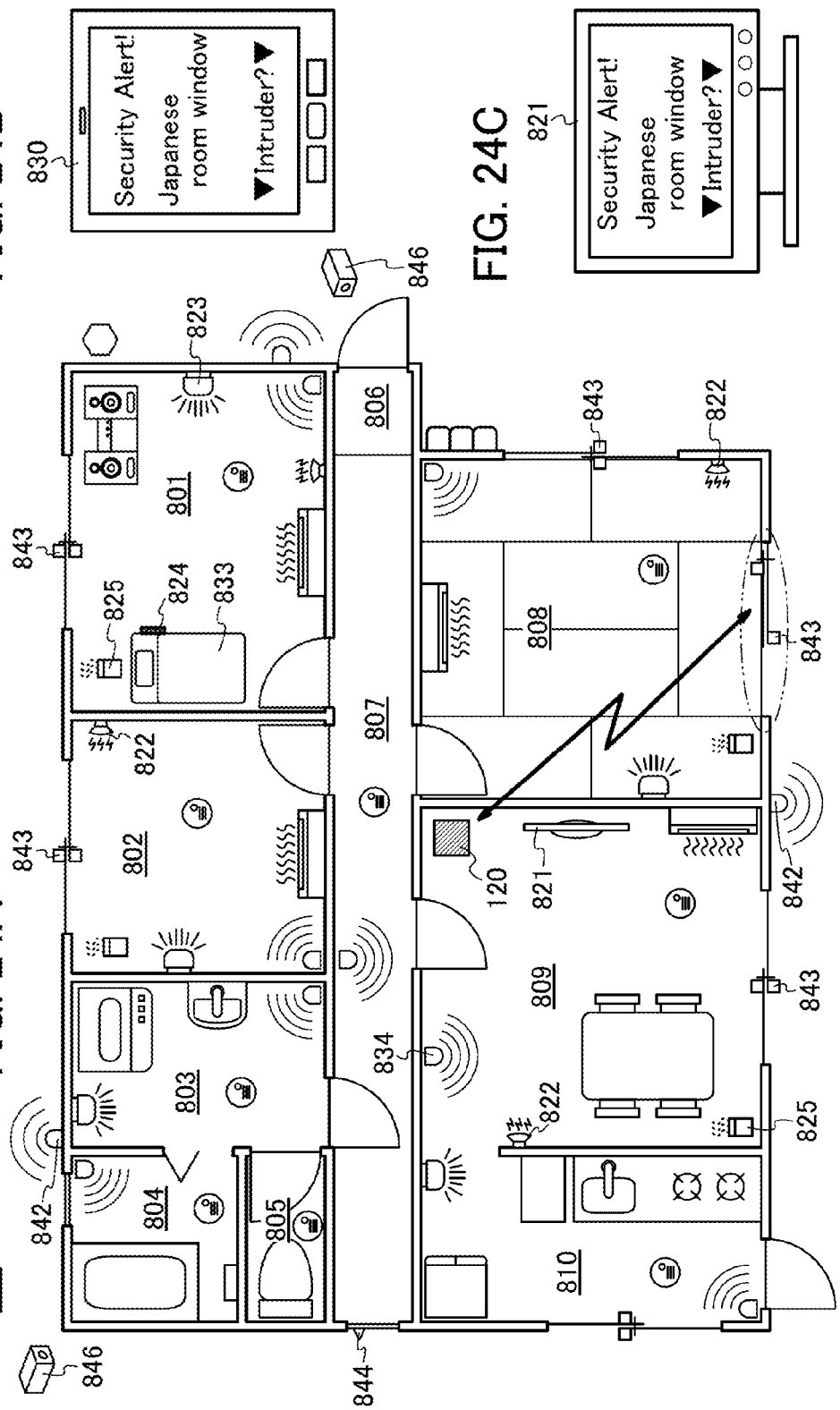
FIGS. 24A to 24C illustrate an example of an application of a central control system.

For example, in the case where the proximity switch 843 detects opening of a window when a resident sleeps, the proximity switch 843 transmits an IP address and information on the opening of the window to the central control device 120 (see FIG. 24A). When the central control device 120 receives the information, the central control device 120 performs arithmetic processing where device information stored in the memory unit 124 is compared to the IP address, identifies a place where the window is opened, and can report the opening of the window to the resident with the display device 821, the sound device 822, the light-emitting device 823, the vibration device 824, and the perfuming device 825 (see FIG. 24C). The central control device 120 transmits the information to the portable information terminal 830 and make the portable information terminal 830 to display the information (see FIG. 24B).

Provision of the human detection sensor 842 for each room enables determination whether or not a trespasser presents. In addition, when the sensor determines the presence of a trespasser, immediate report to the police is also possible.

Figure 25:
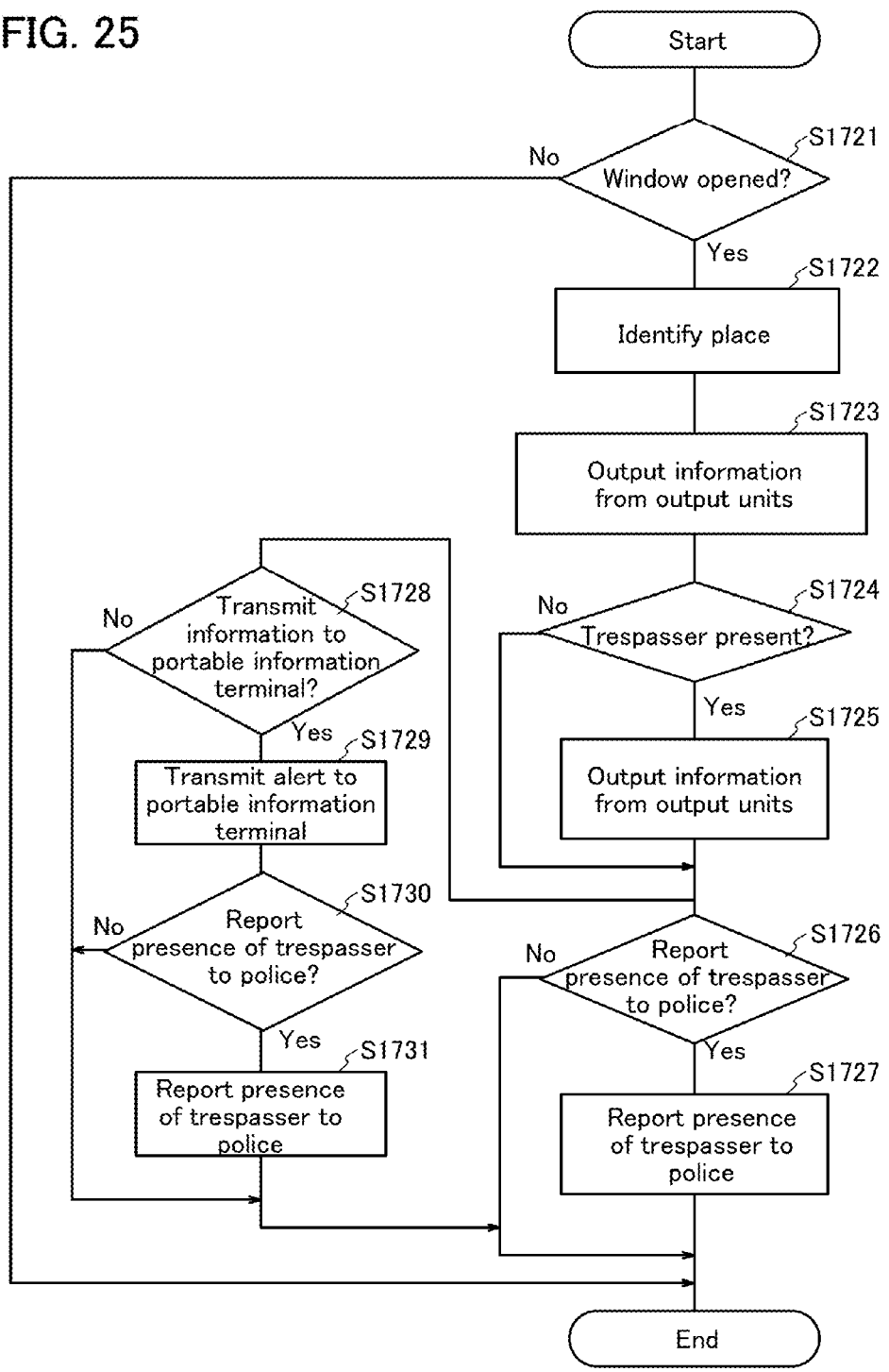
FIG. 25 illustrates an example of an operation of a central control system.

An operation example of the central control device 120 will be described with reference to a flow chart of FIG. 25. The central control device 120 always or regularly confirms the state of the proximity switch 843 (step S1721). When a signal showing detection of the opening of the window is transmitted from the proximity switch 843 to the central control device 120, the central control device 120 identifies a place where the window is opened on the basis of the IP address of the proximity switch 843 (step S1722). Next, at least one of a display device, a sound device, a light-emitting device, a vibration device, and a perfuming device which are output units is made to operate, and the output units output information on the opening of the window and a place where the window is opened (step S1723).

Next, the central control device 120 confirms information of the human detection sensor 842 which is provided in a place where the opening of the window is detected, and determine whether or not a trespasser presents (step S1724). When the presence of a trespasser is determined, at least one of output units such as the display device 821, the sound device 822, the light-emitting device 823, the vibration device 824, and the perfuming device 825 operates and reports the presence of the trespasser to the resident (step S1725).

The central control device 120 can transmit information for indicating the opening of the window and information on the presence of a trespasser to the portable information terminal 830 (step S1728). Here, the information for indicating the place where the window is opened and the presence of trespasser are transmitted to the portable information terminal 830 (step S1729).

The central control device 120 can report to the police by receiving an instruction for reporting the presence of a trespasser to the police from the portable information terminal 830 (steps S1730 and S1731).

Further, the central control device 120 can immediately report the presence of a trespasser to the police before receiving a report instruction from the portable information terminal 830 (steps S1726 and S1727).

The central control device 120 can indicate by voice or an audible alert abnormality with the sound device 822. With a light-emitting device, abnormality can be indicated by lighting or flashing of light. For example, a bed 833 can be vibrated to indicate abnormality with the vibration device 824 installed on the bed 833 even when a resident sleeps.

One embodiment of the present invention can quickly determine the opening of window and a place where a trespasser presents.

The proximity switch 843 or the human detection sensor 842 is not needed to always operate, but may operate every second to minute. For example, when the proximity switch 843 or the human detection sensor 842 operates one second every ten seconds, power consumption of the proximity switch 843 or the human detection sensor 842 can be reduced to one tenth. When the MCU including a nonvolatile memory unit disclosed in the above embodiment is used for the proximity switch 843 or the human detection sensor 842, intermittent operation where operation and suspension are performed at regular intervals can be easily achieved, so that power consumption can be reduced.

With the central control device 120, the start and the stop of supply of power to the electric device 200 or the sensor device 610 can be controlled. The central control device 120 stops supply of power to the electric device or the sensor device which does not need to operate, so that the total power consumption of a house can be reduced.

In a transistor included in the central control device 120, the electric device 200, and the sensor device 610, or the like, a semiconductor layer where a channel is formed preferably uses a semiconductor the band gap of which is wider than that of single crystal silicon. In particular, a transistor having a semiconductor layer where a channel is formed which contains an oxide semiconductor can have smaller power loss due to the on-resistance of the transistor. A transistor using an oxide semiconductor in an active layer has an extremely off-state current. For these reasons, power consumption of the electric device or the sensor device can be reduced.

This embodiment can be implemented combining with another embodiment as appropriate.

REFERENCE NUMERALS

104: oxide insulating layer; 120: central control device; 121: communication unit; 122: MCU; 123: interface; 124: memory unit; 125: power supply selection device; 126: storage device; 130: portable information terminal; 141: voltage regulator circuit; 142: power source switch control circuit; 143: power monitor; 151: power switch; 152: power switch; 153: power switch; 154: power switch; 155: power switch; 156: power switch; 157: power switch; 158: power switch; 161: power switch; 162: power switch; 163: power switch; 164: power switch; 200: electric device; 211: load; 212: interface; 230: CPU; 231: MCU; 232: volatile memory unit; 233: nonvolatile memory unit; 240: transistor; 241: capacitor; 242: transistor; 243: transistor; 244: transistor; 245: selector; 246: inverter; 247: capacitor; 248: flip-flop; 250: power supply circuit; 251: power switch; 252: power switch; 253: voltage regulator circuit; 254: power source switch control circuit; 261: wiring; 262: wiring; 300: transistor; 301: heat dissipation plate; 302: insulating layer; 303: semiconductor substrate; 305: buffer layer; 307: oxide semiconductor layer; 309: terminal; 311: terminal; 313: insulating layer; 315: gate electrode; 320: transistor; 321: n-type region; 330: housing; 340: transistor; 341: substrate; 342: insulating layer; 343: insulating layer; 345: part; 350: transistor; 351: substrate; 352: insulating layer; 353: oxide semiconductor layer; 356: gate insulating layer; 358: protective insulating layer; 360: detection circuit; 361: photodiode; 362: reset transistor; 363: amplifier transistor; 364: bias transistor; 365: resistor; 371: $V_{DD}$ terminal; 372: bias power source terminal; 373: output signal terminal; 374: $V_{SS}$ terminal; 375: reset signal terminal; 401: semiconductor substrate; 403: element separation layer; 404: gate electrode; 406: oxide semiconductor layer; 407: gate insulating layer; 409: gate electrode; 412: gate insulating layer; 415: insulating layer; 417: insulating layer; 418: protective insulating layer; 420: insulating layer; 421: insulating layer; 422: insulating layer; 424: electrode; 425: oxide insulating layer; 445: insulating layer; 446: insulating layer; 449: wiring; 450: insulating layer; 451: transistor; 452: transistor; 456: wiring; 460: electrode; 500: output unit; 510: display device; 520: sound device; 530: light-emitting device; 540: vibration device; 550: perfuming device; 610: sensor device; 611: load; 612: interface; 614: storage device; 616: voltage detection circuit; 621: detection unit; 622: sensor; 623: amplifier circuit; 624: AD converter; 631: MCU; 640: power supply circuit; 641: voltage regulator circuit; 642: power source switch control circuit; 643: solar cell; 644: backflow prevention diode; 651: power switch; 652: power switch; 653: power receiving antenna; 654: capacitor; 660: power radiation circuit; 661: wiring; 662: wiring; 681: period; 682: period; 683: period; 684: period; 685: period; 691: period; 692: period; 696: processing; 697: processing; 698: processing; 700: MCU; 701: unit; 702: unit; 703: unit; 704: unit; 710: CPU; 711: bus bridge; 712: RAM; 713: memory interface; 714: capacitor; 715: clock generation circuit; 720: controller; 721: controller; 722: I/O interface; 730: power gate unit; 731: switch circuit; 732: switch circuit; 740: clock generation circuit; 741: crystal oscillation circuit; 742: oscillation unit; 743: quartz crystal oscillator; 745: timer circuit; 746: I/O interface; 750: I/O port; 751: comparator; 752: I/O interface; 761: bus line; 762: bus line; 763: bus line; 764: data bus line; 770: connection terminal; 771: connection terminal; 772: connection terminal; 773: connection terminal; 774: connection terminal; 775: connection terminal; 776: connection terminal; 780: register; 783: register; 784: register; 785: register; 786: register; 787: register; 790: MCU; 800: house; 801: bed room; 802: Western-style room; 803: laundry room; 804: bathroom; 805: toilet; 806: entrance; 807: corridor; 808: Japanese-style room; 809: living room; 810: kitchen; 821: display device; 822: sound device; 823: light-emitting device; 824: vibration device; 825: perfuming device; 830: portable information terminal; 831: air conditioning device; 832: audio device; 833: bed; 834: washing machine; 835: bathroom control device; 836: refrigerator; 837: dish washer; 838: cooking stove; 839: washstand; 841: fire alarm; 842: human detection sensor; 843: proximity switch; 844: vibration sensor; 845: radiation sensor; 846: surveillance camera; 851: electricity meter; 852: water meter; 853: gas meter; 900: power supply source; 901: commercial power supply; 902: optical power generation device; 903: vibration power generation device; 904: heat power generation device; 1196: register; 151T: transistor; 152T: transistor; 153T: transistor; 154T: transistor; 155T: transistor; 156T: transistor; 157T: transistor; 158T: transistor; 161T: transistor; 162T: transistor; 163T: transistor; 164T: transistor; 251T: transistor; 252T: transistor; 354a: source electrode; 354b: drain electrode; 355a: source electrode; 355b: drain electrode; 411a: impurity region; 411b: impurity region; 416a: source electrode; 416b: drain electrode; 419a: contact plug; 419b: contact plug; 423a: wiring; 423b: wiring; 426a: source electrode; 426b: drain electrode; S1701: step; S1702: step; S1703: step; S1704: step; S1711: step; S1712: step; S1713: step; S1714: step; S1715: step; S1716: step; S1717: step; S1721: step; S1722: step; S1723: step; S1724: step; S1725: step; S1726: step; S1727: step; S1728: step; S1729: step; S1730: step; S1731: step This application is based on Japanese Patent Application serial no. 2012-235352 filed with Japan Patent Office on Oct. 25, 2012, the entire contents of which are hereby incorporated by reference.

The invention claimed is:

1. A central control system comprising:
a central control device;
a sensor device; and
an output unit,
wherein the central control device comprises a first interface,
wherein the sensor device comprises a second interface, a power source switch control circuit, a voltage regulator circuit, and a power switch,
wherein the power source switch control circuit is connected to the second interface,
wherein the power source switch control circuit is configured to control switching of the power switch in accordance with a control signal from the central control device,
wherein the power switch comprises a transistor comprising an oxide semiconductor layer comprising a channel formation region,
wherein the sensor device and the output unit are connected to the first interface of the central control device,
wherein the central control device comprises a memory unit which stores device information for identifying a location of the sensor device and determining whether or not operation of the sensor device is normal,
wherein the central control device is configured to perform arithmetic processing in which information transmitted from the sensor device and the device information are compared, and
wherein the output unit is configured to output the information obtained by the arithmetic processing.

2. The central control system according to claim 1, wherein power is supplied from an optical power generation device to the central control device, the sensor device, or the output unit.

3. The central control system according to claim 1, wherein the sensor device and the output unit are connected to the central control device by wireless communication.

4. The central control system according to claim 1, wherein the sensor device is one selected from the group consisting of a fire alarm, a human detection sensor, a proximity switch, a vibration sensor, a radiation sensor, a surveillance camera, an electricity meter, a water meter, and a gas meter.

5. The central control system according to claim 1, wherein the output unit is a display device, a sound device, a light-emitting device, a vibration device, or a perfuming device.

6. A central control system comprising:
a central control device;
a sensor device;
an electric device; and
an output unit,
wherein the central control device comprises a first interface,
wherein the sensor device comprises a second interface, a power source switch control circuit, a voltage regulator circuit and a power switch,
wherein the power source switch control circuit is connected to the second interface,
wherein the power source switch control circuit is configured to control switching of the power switch in accordance with a control signal from the central control device,
wherein the power switch comprises a transistor comprising an oxide semiconductor layer comprising a channel formation region,
wherein the sensor device, the electric device and the output unit are connected to the first interface of the central control device,
wherein the central control device comprises a memory unit which stores device information for identifying a location of each of the sensor device and the electric device and determining whether or not operation of each of the sensor device and the electric device is normal,
wherein the central control device is configured to perform arithmetic processing in which information transmitted from each of the sensor device and the electric device and the device information are compared, and wherein the output unit is configured to output the information obtained by the arithmetic processing.

7. The central control system according to claim 6,
wherein power is supplied from an optical power generation device to the central control device, the sensor device, the electric device or the output unit.

8. The central control system according to claim 6,
wherein the sensor device, the electric device and the output unit are connected to the central control device by wireless communication.

9. The central control system according to claim 6,
wherein the sensor device is one selected from the group consisting of a fire alarm, a human detection sensor, a proximity switch, a vibration sensor, a radiation sensor, a surveillance camera, an electricity meter, a water meter, and a gas meter.

10. The central control system according to claim 6,
wherein the electric device is one selected from the group consisting of an air conditioning device, an audio device, a washing machine, a bathroom control device, a refrigerator, a dish washer, a microwave oven, an intercom, a rice cooker, and an electric pot.

11. The central control system according to claim 6,
wherein the output unit is a display device, a sound device, a light-emitting device, a vibration device, or a perfuming device.

12. A central control system comprising:
a central control device;
a plurality of sensor devices; and
an output unit,
wherein the central control device comprises a first interface,
wherein each of the plurality of sensor devices comprises a second interface, a power source switch control circuit, a voltage regulator circuit and a power switch,
wherein the power source switch control circuit is connected to the second interface,
wherein the power source switch control circuit is configured to control switching of the power switch in accordance with a control signal from the central control device,
wherein the power switch comprises a transistor comprising an oxide semiconductor layer comprising a channel formation region,
wherein the plurality of sensor devices and the output unit are connected to the first interface of the central control device,
wherein each of the plurality of sensor devices includes an identifier,
wherein the central control device comprises a memory unit which stores device information for identifying location of each of the plurality of sensor devices and determining whether or not operation of each of the plurality of sensor devices is normal,
wherein the central control device is configured to perform arithmetic processing in which information transmitted from each of the plurality of sensor devices with the identifier and the device information are compared, and
wherein the output unit is configured to output the information obtained by the arithmetic processing.

13. The central control system according to claim 12,
wherein the central control device identifies the location of each of the plurality of sensor devices by the identifier.

14. The central control system according to claim 12,
wherein power is supplied from an optical power generation device to the central control device, the plurality of sensor devices, or the output unit.

15. The central control system according to claim 12,
wherein the plurality of sensor devices and the output unit are connected to the central control device by wireless communication.

16. The central control system according to claim 12,
wherein each of the plurality of sensor devices is one selected from the group consisting of a fire alarm, a human detection sensor, a proximity switch, a vibration sensor, a radiation sensor, a surveillance camera, an electricity meter, a water meter, and a gas meter.

17. The central control system according to claim 12,
wherein the output unit is a display device, a sound device, a light-emitting device, a vibration device, or a perfuming device.

* * * * *